United States Patent
Holz et al.

(10) Patent No.: US 12,265,761 B2
(45) Date of Patent: *Apr. 1, 2025

(54) PREDICTIVE INFORMATION FOR FREE SPACE GESTURE CONTROL AND COMMUNICATION

(71) Applicant: ULTRAHAPTICS IP TWO LIMITED, Bristol (GB)

(72) Inventors: David S. Holz, San Francisco, CA (US); Kevin Horowitz, San Francisco, CA (US); Raffi Bedikian, San Francisco, CA (US); Hua Yang, Millbrae, CA (US)

(73) Assignee: ULTRAHAPTICS IP TWO LIMITED, Bristol (GB)

( * ) Notice: Subject to any disclaimer, the term of this patent is extended or adjusted under 35 U.S.C. 154(b) by 0 days.

This patent is subject to a terminal disclaimer.

(21) Appl. No.: 18/406,059

(22) Filed: Jan. 5, 2024

(65) Prior Publication Data
US 2024/0143871 A1    May 2, 2024

Related U.S. Application Data

(63) Continuation of application No. 18/161,811, filed on Jan. 30, 2023, now Pat. No. 11,868,687, which is a
(Continued)

(51) Int. Cl.
*G06F 30/20* (2020.01)
*G06F 3/01* (2006.01)
(Continued)

(52) U.S. Cl.
CPC .............. *G06F 30/20* (2020.01); *G06F 3/017* (2013.01); *G06V 20/64* (2022.01); *G06V 40/28* (2022.01)

(58) Field of Classification Search
CPC .................................................. G06F 17/5018
See application file for complete search history.

(56) References Cited

U.S. PATENT DOCUMENTS

| 2,665,041 A | 1/1954 | Maffucci |
| 3,638,989 A | 2/1972 | Sandquist |

(Continued)

FOREIGN PATENT DOCUMENTS

| CN | 1984236 A | 6/2007 |
| CN | 201332447 Y | 10/2009 |

(Continued)

OTHER PUBLICATIONS

Ballan et al., "Lecture Notes Computer Science: 12th European Conference on Computer Vision: Motion Capture of Hands in Action Using Discriminative Salient Points", Oct. 7-13, 2012 [retrieved Jul. 14, 2016], Springer Berlin Heidelberg, vol. 7577, pp. 640-653. Retrieved from the Internet: <http://link.springer.com/chapter/10.1007/978-3-642-33783-3 46>.

(Continued)

*Primary Examiner* — Andy Ho
(74) *Attorney, Agent, or Firm* — HAYNES BEFFEL & WOLFELD LLP; Andrew L. Dunlap; Paul A. Durdik

(57) ABSTRACT

The technology disclosed relates to simplifying updating of a predictive model using clustering observed points. In particular, it relates to observing a set of points in 3D sensory space, determining surface normal directions from the points, clustering the points by their surface normal directions and adjacency, accessing a predictive model of a hand, refining positions of segments of the predictive model, matching the clusters of the points to the segments, and using the matched clusters to refine the positions of the matched segments. It also relates to distinguishing between alternative motions between two observed locations of a control object in a 3D sensory space by accessing first and (Continued)

second positions of a segment of a predictive model of a control object such that motion between the first position and the second position was at least partially occluded from observation in a 3D sensory space.

20 Claims, 37 Drawing Sheets

Related U.S. Application Data continuation of application No. 17/308,903, filed on May 5, 2021, now Pat. No. 11,568,105, which is a continuation of application No. 16/695,136, filed on Nov. 25, 2019, now Pat. No. 11,010,512, which is a continuation of application No. 16/004,119, filed on Jun. 8, 2018, now Pat. No. 10,489,531, which is a continuation of application No. 14/530,690, filed on Oct. 31, 2014, now Pat. No. 9,996,638.

(60) Provisional application No. 61/898,462, filed on Oct. 31, 2013.

(51) Int. Cl.
*G06V 20/64* (2022.01)
*G06V 40/20* (2022.01)

(56) References Cited

U.S. PATENT DOCUMENTS

| | | |
|---|---|---|
| 3,768,022 A | 10/1973 | Lang |
| 4,175,862 A | 11/1979 | DiMatteo et al. |
| 4,876,455 A | 10/1989 | Sanderson et al. |
| 4,879,659 A | 11/1989 | Bowlin et al. |
| 4,893,223 A | 1/1990 | Arnold |
| 5,038,258 A | 8/1991 | Koch et al. |
| 5,134,661 A | 7/1992 | Reinsch |
| 5,282,067 A | 1/1994 | Liu |
| 5,434,617 A | 7/1995 | Bianchi |
| 5,454,043 A | 9/1995 | Freeman |
| 5,574,511 A | 11/1996 | Yang et al. |
| 5,581,276 A | 12/1996 | Cipolla et al. |
| 5,594,469 A | 1/1997 | Freeman et al. |
| 5,659,475 A | 8/1997 | Brown |
| 5,691,737 A | 11/1997 | Ito et al. |
| 5,742,263 A | 4/1998 | Wang et al. |
| 5,900,863 A | 5/1999 | Numazaki |
| 5,940,538 A | 8/1999 | Spiegel et al. |
| 6,002,808 A | 12/1999 | Freeman |
| 6,031,161 A | 2/2000 | Baltenberger |
| 6,031,661 A | 2/2000 | Tanaami |
| 6,072,494 A | 6/2000 | Nguyen |
| 6,075,895 A | 6/2000 | Qiao et al. |
| 6,147,678 A | 11/2000 | Kumar et al. |
| 6,154,558 A | 11/2000 | Hsieh |
| 6,181,343 B1 | 1/2001 | Lyons |
| 6,184,326 B1 | 2/2001 | Razavi et al. |
| 6,184,926 B1 | 2/2001 | Khosravi et al. |
| 6,195,104 B1 | 2/2001 | Lyons |
| 6,204,852 B1 | 3/2001 | Kumar et al. |
| 6,252,598 B1 | 6/2001 | Segen |
| 6,256,400 B1 | 7/2001 | Takata et al. |
| 6,263,091 B1 | 7/2001 | Jain et al. |
| 6,346,933 B1 | 2/2002 | Lin |
| 6,417,970 B1 | 7/2002 | Travers et al. |
| 6,463,402 B1 | 10/2002 | Bennett et al. |
| 6,492,986 B1 | 12/2002 | Metaxas et al. |
| 6,493,041 B1 | 12/2002 | Hanko et al. |
| 6,498,628 B2 | 12/2002 | Iwamura |
| 6,578,203 B1 | 6/2003 | Anderson, Jr. et al. |
| 6,597,801 B1 | 7/2003 | Cham et al. |
| 6,603,867 B1 | 8/2003 | Sugino et al. |
| 6,661,918 B1 | 12/2003 | Gordon et al. |
| 6,674,877 B1 | 1/2004 | Jojic et al. |
| 6,702,494 B2 | 3/2004 | Dumler et al. |
| 6,734,911 B1 | 5/2004 | Lyons |
| 6,738,424 B1 | 5/2004 | Allmen et al. |
| 6,771,294 B1 | 8/2004 | Pulli et al. |
| 6,798,628 B1 | 9/2004 | Macbeth |
| 6,804,654 B2 | 10/2004 | Kobylevsky et al. |
| 6,804,656 B1 | 10/2004 | Rosenfeld et al. |
| 6,814,656 B2 | 11/2004 | Rodriguez |
| 6,819,796 B2 | 11/2004 | Hong et al. |
| 6,901,170 B1 | 5/2005 | Terada et al. |
| 6,919,880 B2 | 7/2005 | Morrison et al. |
| 6,950,534 B2 | 9/2005 | Cohen et al. |
| 6,993,157 B1 | 1/2006 | Oue et al. |
| 7,152,024 B2 | 12/2006 | Marschner et al. |
| 7,213,707 B2 | 5/2007 | Hubbs et al. |
| 7,215,828 B2 | 5/2007 | Luo |
| 7,244,233 B2 | 7/2007 | Krantz et al. |
| 7,257,237 B1 | 8/2007 | Luck et al. |
| 7,259,873 B2 | 8/2007 | Sikora et al. |
| 7,308,112 B2 | 12/2007 | Fujimura et al. |
| 7,340,077 B2 | 3/2008 | Gokturk et al. |
| 7,472,047 B2 | 12/2008 | Kramer et al. |
| 7,483,049 B2 | 1/2009 | Aman et al. |
| 7,519,223 B2 | 4/2009 | Dehlin et al. |
| 7,532,206 B2 | 5/2009 | Morrison et al. |
| 7,536,032 B2 | 5/2009 | Bell |
| 7,542,586 B2 | 6/2009 | Johnson |
| 7,598,942 B2 | 10/2009 | Underkoffler et al. |
| 7,606,417 B2 | 10/2009 | Steinberg et al. |
| 7,646,372 B2 | 1/2010 | Marks et al. |
| 7,656,372 B2 | 2/2010 | Sato et al. |
| 7,665,041 B2 | 2/2010 | Wilson et al. |
| 7,692,625 B2 | 4/2010 | Morrison et al. |
| 7,769,994 B2 | 8/2010 | Peles |
| 7,831,932 B2 | 11/2010 | Josephsoon et al. |
| 7,840,031 B2 | 11/2010 | Albertson et al. |
| 7,861,188 B2 | 12/2010 | Josephsoon et al. |
| 7,940,885 B2 | 5/2011 | Stanton et al. |
| 7,948,493 B2 | 5/2011 | Klefenz et al. |
| 7,961,934 B2 | 6/2011 | Thrun et al. |
| 7,971,156 B2 | 6/2011 | Albertson et al. |
| 7,980,885 B2 | 7/2011 | Gattwinkel et al. |
| 8,005,263 B2 | 8/2011 | Fujimura et al. |
| 8,023,698 B2 | 9/2011 | Niwa et al. |
| 8,035,624 B2 | 10/2011 | Bell et al. |
| 8,045,825 B2 | 10/2011 | Shimoyama et al. |
| 8,064,704 B2 | 11/2011 | Kim et al. |
| 8,085,339 B2 | 12/2011 | Marks |
| 8,086,971 B2 | 12/2011 | Radivojevic et al. |
| 8,111,239 B2 | 2/2012 | Pryor et al. |
| 8,112,719 B2 | 2/2012 | Hsu et al. |
| 8,144,233 B2 | 3/2012 | Fukuyama |
| 8,185,176 B2 | 5/2012 | Mangat et al. |
| 8,213,707 B2 | 7/2012 | Li et al. |
| 8,218,858 B2 | 7/2012 | Gu |
| 8,229,134 B2 | 7/2012 | Duraiswami et al. |
| 8,235,529 B1 | 8/2012 | Raffle et al. |
| 8,244,233 B2 | 8/2012 | Chang et al. |
| 8,249,345 B2 | 8/2012 | Wu et al. |
| 8,253,564 B2 | 8/2012 | Lee et al. |
| 8,270,669 B2 | 9/2012 | Aichi et al. |
| 8,289,162 B2 | 10/2012 | Mooring et al. |
| 8,290,208 B2 | 10/2012 | Kurtz et al. |
| 8,304,727 B2 | 11/2012 | Lee et al. |
| 8,319,832 B2 | 11/2012 | Nagata et al. |
| 8,363,010 B2 | 1/2013 | Nagata |
| 8,395,600 B2 | 3/2013 | Kawashima et al. |
| 8,432,377 B2 | 4/2013 | Newton |
| 8,514,221 B2 | 8/2013 | King et al. |
| 8,553,037 B2 | 10/2013 | Smith et al. |
| 8,582,809 B2 | 11/2013 | Halimeh et al. |
| 8,593,417 B2 | 11/2013 | Kawashima et al. |
| 8,605,202 B2 | 12/2013 | Muijs et al. |
| 8,620,024 B2 | 12/2013 | Huang et al. |
| 8,631,355 B2 | 1/2014 | Murillo et al. |
| 8,638,989 B2 | 1/2014 | Holz |
| 8,659,594 B2 | 2/2014 | Kim et al. |
| 8,659,658 B2 | 2/2014 | Vassigh et al. |
| 8,693,731 B2 | 4/2014 | Holz et al. |

(56) References Cited

U.S. PATENT DOCUMENTS

| | | |
|---|---|---|
| 8,738,523 B1 | 5/2014 | Sanchez et al. |
| 8,744,122 B2 | 6/2014 | Salgian et al. |
| 8,768,022 B2 | 7/2014 | Miga et al. |
| 8,786,596 B2 | 7/2014 | House |
| 8,817,087 B2 | 8/2014 | Weng et al. |
| 8,842,084 B2 | 9/2014 | Andersson et al. |
| 8,843,857 B2 | 9/2014 | Berkes et al. |
| 8,872,914 B2 | 10/2014 | Gobush |
| 8,878,749 B1 | 11/2014 | Wu et al. |
| 8,891,868 B1 | 11/2014 | Ivanchenko |
| 8,902,224 B2 | 12/2014 | Wyeld |
| 8,907,982 B2 | 12/2014 | Zontrop et al. |
| 8,922,590 B1 | 12/2014 | Luckett, Jr. et al. |
| 8,929,609 B2 | 1/2015 | Padovani et al. |
| 8,930,852 B2 | 1/2015 | Chen et al. |
| 8,942,881 B2 | 1/2015 | Hobbs et al. |
| 8,954,340 B2 | 2/2015 | Sanchez et al. |
| 8,957,857 B2 | 2/2015 | Lee et al. |
| 9,014,414 B2 | 4/2015 | Katano et al. |
| 9,056,396 B1 | 6/2015 | Linnell |
| 9,070,019 B2 | 6/2015 | Holz |
| 9,119,670 B2 | 9/2015 | Yang et al. |
| 9,122,354 B2 | 9/2015 | Sharma |
| 9,124,778 B1 | 9/2015 | Crabtree |
| 9,135,503 B2 | 9/2015 | Sundaresan et al. |
| 9,305,229 B2 | 4/2016 | DeLean et al. |
| 9,459,697 B2 | 10/2016 | Bedikian et al. |
| 9,721,383 B1 | 8/2017 | Horowitz et al. |
| 10,281,987 B1 | 5/2019 | Yang et al. |
| 10,846,942 B1 | 11/2020 | Horowitz et al. |
| 11,461,966 B1 | 10/2022 | Horowitz et al. |
| 11,868,687 B2 | 1/2024 | Holz et al. |
| 2001/0044858 A1 | 11/2001 | Rekimoto |
| 2001/0052985 A1 | 12/2001 | Ono |
| 2002/0008139 A1 | 1/2002 | Albertelli |
| 2002/0008211 A1 | 1/2002 | Kask |
| 2002/0041327 A1 | 4/2002 | Hildreth et al. |
| 2002/0080094 A1 | 6/2002 | Biocca et al. |
| 2002/0105484 A1 | 8/2002 | Navab et al. |
| 2003/0053658 A1 | 3/2003 | Pavlidis |
| 2003/0053659 A1 | 3/2003 | Pavlidis et al. |
| 2003/0081141 A1 | 5/2003 | Mazzapica |
| 2003/0123703 A1 | 7/2003 | Pavlidis et al. |
| 2003/0152289 A1 | 8/2003 | Luo |
| 2003/0202697 A1 | 10/2003 | Simard et al. |
| 2004/0103111 A1 | 5/2004 | Miller et al. |
| 2004/0125228 A1 | 7/2004 | Dougherty |
| 2004/0125984 A1 | 7/2004 | Ito et al. |
| 2004/0145809 A1 | 7/2004 | Brenner |
| 2004/0155877 A1 | 8/2004 | Hong et al. |
| 2004/0212725 A1 | 10/2004 | Raskar |
| 2005/0007673 A1 | 1/2005 | Chaoulov et al. |
| 2005/0068518 A1 | 3/2005 | Baney et al. |
| 2005/0094019 A1 | 5/2005 | Grosvenor et al. |
| 2005/0131607 A1 | 6/2005 | Breed |
| 2005/0156888 A1 | 7/2005 | Xie et al. |
| 2005/0168578 A1 | 8/2005 | Gobush |
| 2005/0236558 A1 | 10/2005 | Nabeshima et al. |
| 2005/0238201 A1 | 10/2005 | Shamaie |
| 2005/0271279 A1 | 12/2005 | Fujimura et al. |
| 2006/0017807 A1 | 1/2006 | Lee et al. |
| 2006/0028656 A1 | 2/2006 | Venkatesh et al. |
| 2006/0029296 A1 | 2/2006 | King et al. |
| 2006/0034545 A1 | 2/2006 | Mattes et al. |
| 2006/0050979 A1 | 3/2006 | Kawahara |
| 2006/0072105 A1 | 4/2006 | Wagner |
| 2006/0098899 A1 | 5/2006 | King et al. |
| 2006/0111878 A1 | 5/2006 | Pendyala et al. |
| 2006/0204040 A1 | 9/2006 | Freeman et al. |
| 2006/0210112 A1 | 9/2006 | Cohen et al. |
| 2006/0262421 A1 | 11/2006 | Matsumoto et al. |
| 2006/0290950 A1 | 12/2006 | Platt et al. |
| 2007/0014466 A1 | 1/2007 | Baldwin |
| 2007/0042346 A1 | 2/2007 | Weller |
| 2007/0086621 A1 | 4/2007 | Aggarwal et al. |
| 2007/0130547 A1 | 6/2007 | Boillot |
| 2007/0206719 A1 | 9/2007 | Suryanarayanan et al. |
| 2007/0230929 A1 | 10/2007 | Niwa et al. |
| 2007/0238956 A1 | 10/2007 | Haras et al. |
| 2008/0013826 A1 | 1/2008 | Hillis et al. |
| 2008/0019576 A1 | 1/2008 | Senftner et al. |
| 2008/0030429 A1 | 2/2008 | Hailpern et al. |
| 2008/0031492 A1 | 2/2008 | Lanz |
| 2008/0056752 A1 | 3/2008 | Denton et al. |
| 2008/0064954 A1 | 3/2008 | Adams et al. |
| 2008/0106637 A1 | 5/2008 | Nakao et al. |
| 2008/0106746 A1 | 5/2008 | Shpunt et al. |
| 2008/0110994 A1 | 5/2008 | Knowles et al. |
| 2008/0118091 A1 | 5/2008 | Serfaty et al. |
| 2008/0126937 A1 | 5/2008 | Pachet |
| 2008/0187175 A1 | 8/2008 | Kim et al. |
| 2008/0244468 A1 | 10/2008 | Nishihara et al. |
| 2008/0246759 A1 | 10/2008 | Summers |
| 2008/0273764 A1 | 11/2008 | Scholl |
| 2008/0278589 A1 | 11/2008 | Thorn |
| 2008/0291160 A1 | 11/2008 | Rabin |
| 2008/0304740 A1 | 12/2008 | Sun et al. |
| 2008/0319356 A1 | 12/2008 | Cain et al. |
| 2009/0002489 A1 | 1/2009 | Yang et al. |
| 2009/0093307 A1 | 4/2009 | Miyaki |
| 2009/0102840 A1 | 4/2009 | Li |
| 2009/0116742 A1 | 5/2009 | Nishihara |
| 2009/0122146 A1 | 5/2009 | Zalewski et al. |
| 2009/0153655 A1 | 6/2009 | Ike et al. |
| 2009/0203993 A1 | 8/2009 | Mangat et al. |
| 2009/0203994 A1 | 8/2009 | Mangat et al. |
| 2009/0217211 A1 | 8/2009 | Hildreth et al. |
| 2009/0257623 A1 | 10/2009 | Tang et al. |
| 2009/0274339 A9 | 11/2009 | Cohen et al. |
| 2009/0309710 A1 | 12/2009 | Kakinami |
| 2010/0013832 A1 | 1/2010 | Xiao et al. |
| 2010/0020078 A1 | 1/2010 | Shpunt |
| 2010/0023015 A1 | 1/2010 | Park |
| 2010/0026963 A1 | 2/2010 | Faulstich |
| 2010/0027845 A1 | 2/2010 | Kim et al. |
| 2010/0046842 A1 | 2/2010 | Conwell |
| 2010/0053164 A1 | 3/2010 | Imai et al. |
| 2010/0053209 A1 | 3/2010 | Rauch et al. |
| 2010/0053612 A1 | 3/2010 | Ou-Yang et al. |
| 2010/0058252 A1 | 3/2010 | Ko |
| 2010/0066737 A1 | 3/2010 | Liu |
| 2010/0066975 A1 | 3/2010 | Rehnstrom |
| 2010/0091110 A1 | 4/2010 | Hildreth |
| 2010/0118123 A1 | 5/2010 | Freedman et al. |
| 2010/0121189 A1 | 5/2010 | Ma et al. |
| 2010/0125815 A1 | 5/2010 | Wang et al. |
| 2010/0127995 A1 | 5/2010 | Rigazio et al. |
| 2010/0141762 A1 | 6/2010 | Siann et al. |
| 2010/0158372 A1 | 6/2010 | Kim et al. |
| 2010/0177929 A1 | 7/2010 | Kurtz et al. |
| 2010/0194863 A1 | 8/2010 | Lopes et al. |
| 2010/0199232 A1 | 8/2010 | Mistry et al. |
| 2010/0201880 A1 | 8/2010 | Iwamura |
| 2010/0208942 A1 | 8/2010 | Porter et al. |
| 2010/0219934 A1 | 9/2010 | Matsumoto |
| 2010/0222102 A1 | 9/2010 | Rodriguez |
| 2010/0264833 A1 | 10/2010 | Van Endert et al. |
| 2010/0277411 A1 | 11/2010 | Yee et al. |
| 2010/0296698 A1 | 11/2010 | Lien et al. |
| 2010/0302357 A1 | 12/2010 | Hsu et al. |
| 2010/0303298 A1 | 12/2010 | Marks et al. |
| 2010/0306712 A1 | 12/2010 | Snook et al. |
| 2010/0309097 A1 | 12/2010 | Raviv et al. |
| 2010/0329509 A1 | 12/2010 | Fahn et al. |
| 2011/0007072 A1 | 1/2011 | Khan et al. |
| 2011/0025818 A1 | 2/2011 | Gallmeier et al. |
| 2011/0026765 A1 | 2/2011 | Ivanich et al. |
| 2011/0043806 A1 | 2/2011 | Guetta et al. |
| 2011/0057875 A1 | 3/2011 | Shigeta et al. |
| 2011/0066984 A1 | 3/2011 | Li |
| 2011/0080470 A1 | 4/2011 | Kuno et al. |
| 2011/0080490 A1 | 4/2011 | Clarkson et al. |
| 2011/0093820 A1 | 4/2011 | Zhang et al. |
| 2011/0107216 A1 | 5/2011 | Bi |

(56) References Cited

U.S. PATENT DOCUMENTS

| | | |
|---|---|---|
| 2011/0115486 A1 | 5/2011 | Frohlich et al. |
| 2011/0116684 A1 | 5/2011 | Coffman et al. |
| 2011/0119640 A1 | 5/2011 | Berkes et al. |
| 2011/0134112 A1 | 6/2011 | Koh et al. |
| 2011/0148875 A1 | 6/2011 | Kim et al. |
| 2011/0169726 A1 | 7/2011 | Holmdahl et al. |
| 2011/0173574 A1 | 7/2011 | Clavin et al. |
| 2011/0176146 A1 | 7/2011 | Alvarez Diez et al. |
| 2011/0181509 A1 | 7/2011 | Rautiainen et al. |
| 2011/0193778 A1 | 8/2011 | Lee et al. |
| 2011/0205151 A1 | 8/2011 | Newton et al. |
| 2011/0213664 A1 | 9/2011 | Osterhout et al. |
| 2011/0228978 A1 | 9/2011 | Chen et al. |
| 2011/0234840 A1 | 9/2011 | Klefenz et al. |
| 2011/0243451 A1 | 10/2011 | Oyaizu |
| 2011/0251896 A1 | 10/2011 | Impollonia et al. |
| 2011/0261178 A1 | 10/2011 | Lo et al. |
| 2011/0267259 A1 | 11/2011 | Tidemand et al. |
| 2011/0279397 A1 | 11/2011 | Rimon et al. |
| 2011/0286676 A1 | 11/2011 | El Dokor |
| 2011/0289455 A1 | 11/2011 | Reville et al. |
| 2011/0289456 A1 | 11/2011 | Reville et al. |
| 2011/0291925 A1 | 12/2011 | Israel et al. |
| 2011/0291988 A1 | 12/2011 | Bamji et al. |
| 2011/0296353 A1 | 12/2011 | Ahmed et al. |
| 2011/0299737 A1 | 12/2011 | Wang et al. |
| 2011/0304600 A1 | 12/2011 | Yoshida |
| 2011/0304650 A1 | 12/2011 | Campillo et al. |
| 2011/0310007 A1 | 12/2011 | Margolis et al. |
| 2011/0310220 A1 | 12/2011 | McEldowney |
| 2011/0314427 A1 | 12/2011 | Sundararajan |
| 2012/0038637 A1 | 2/2012 | Marks |
| 2012/0050157 A1 | 3/2012 | Latta et al. |
| 2012/0062736 A1 | 3/2012 | Xiong |
| 2012/0065499 A1 | 3/2012 | Chono |
| 2012/0068914 A1 | 3/2012 | Jacobsen et al. |
| 2012/0113316 A1 | 5/2012 | Ueta et al. |
| 2012/0159380 A1 | 6/2012 | Kocienda et al. |
| 2012/0163675 A1 | 6/2012 | Joo et al. |
| 2012/0194517 A1 | 8/2012 | Izadi et al. |
| 2012/0204133 A1 | 8/2012 | Guendelman et al. |
| 2012/0223959 A1 | 9/2012 | Lengeling |
| 2012/0236288 A1 | 9/2012 | Stanley |
| 2012/0250936 A1 | 10/2012 | Holmgren |
| 2012/0270654 A1 | 10/2012 | Padovani et al. |
| 2012/0274781 A1 | 11/2012 | Shet et al. |
| 2012/0281873 A1 | 11/2012 | Brown et al. |
| 2012/0293667 A1 | 11/2012 | Baba et al. |
| 2012/0314030 A1 | 12/2012 | Datta et al. |
| 2013/0019204 A1 | 1/2013 | Kotler et al. |
| 2013/0038694 A1 | 2/2013 | Nichani et al. |
| 2013/0044951 A1 | 2/2013 | Cherng et al. |
| 2013/0050425 A1 | 2/2013 | Im et al. |
| 2013/0086531 A1 | 4/2013 | Sugita et al. |
| 2013/0097566 A1 | 4/2013 | Berglund |
| 2013/0120319 A1 | 5/2013 | Givon |
| 2013/0148852 A1 | 6/2013 | Partis et al. |
| 2013/0182079 A1 | 7/2013 | Holz |
| 2013/0182897 A1 | 7/2013 | Holz |
| 2013/0182902 A1 | 7/2013 | Holz |
| 2013/0187952 A1 | 7/2013 | Berkovich et al. |
| 2013/0191911 A1 | 7/2013 | Dellinger et al. |
| 2013/0208948 A1 | 8/2013 | Berkovich et al. |
| 2013/0222640 A1 | 8/2013 | Baek et al. |
| 2013/0239059 A1 | 9/2013 | Chen et al. |
| 2013/0241832 A1 | 9/2013 | Rimon et al. |
| 2013/0252691 A1 | 9/2013 | Alexopoulos |
| 2013/0257736 A1 | 10/2013 | Hou et al. |
| 2013/0258140 A1 | 10/2013 | Lipson et al. |
| 2013/0271397 A1 | 10/2013 | Macdougall et al. |
| 2013/0300831 A1 | 11/2013 | Mavromatis et al. |
| 2013/0307935 A1 | 11/2013 | Rappel et al. |
| 2013/0321265 A1 | 12/2013 | Bychkov et al. |
| 2014/0010441 A1 | 1/2014 | Shamaie |
| 2014/0064566 A1 | 3/2014 | Shreve et al. |
| 2014/0081521 A1 | 3/2014 | Frojdh et al. |
| 2014/0085203 A1 | 3/2014 | Kobayashi |
| 2014/0125775 A1 | 5/2014 | Holz |
| 2014/0125813 A1 | 5/2014 | Holz |
| 2014/0132738 A1 | 5/2014 | Ogura et al. |
| 2014/0139425 A1 | 5/2014 | Sakai |
| 2014/0139641 A1 | 5/2014 | Holz |
| 2014/0157135 A1 | 6/2014 | Lee et al. |
| 2014/0161311 A1 | 6/2014 | Kim |
| 2014/0168062 A1 | 6/2014 | Katz et al. |
| 2014/0176420 A1 | 6/2014 | Zhou et al. |
| 2014/0177913 A1 | 6/2014 | Holz |
| 2014/0189579 A1 | 7/2014 | Rimon et al. |
| 2014/0192024 A1 | 7/2014 | Holz |
| 2014/0201666 A1 | 7/2014 | Bedikian et al. |
| 2014/0201689 A1 | 7/2014 | Bedikian et al. |
| 2014/0222385 A1 | 8/2014 | Muenster et al. |
| 2014/0223385 A1 | 8/2014 | Ton et al. |
| 2014/0225826 A1 | 8/2014 | Juni |
| 2014/0240215 A1 | 8/2014 | Tremblay et al. |
| 2014/0240225 A1 | 8/2014 | Eilat |
| 2014/0248950 A1 | 9/2014 | Tosas Bautista |
| 2014/0253512 A1 | 9/2014 | Narikawa et al. |
| 2014/0253785 A1 | 9/2014 | Chan et al. |
| 2014/0267098 A1 | 9/2014 | Na et al. |
| 2014/0307920 A1 | 10/2014 | Holz |
| 2014/0344762 A1 | 11/2014 | Grasset et al. |
| 2014/0364209 A1 | 12/2014 | Perry |
| 2014/0364212 A1 | 12/2014 | Osman et al. |
| 2014/0369558 A1 | 12/2014 | Holz |
| 2014/0375547 A1 | 12/2014 | Katz et al. |
| 2015/0003673 A1 | 1/2015 | Fletcher |
| 2015/0009149 A1 | 1/2015 | Gharib et al. |
| 2015/0016777 A1 | 1/2015 | Abovitz et al. |
| 2015/0022447 A1 | 1/2015 | Hare et al. |
| 2015/0029091 A1 | 1/2015 | Nakashima et al. |
| 2015/0084864 A1 | 3/2015 | Geiss et al. |
| 2015/0097772 A1 | 4/2015 | Starner |
| 2015/0103004 A1 | 4/2015 | Cohen et al. |
| 2015/0115802 A1 | 4/2015 | Kuti et al. |
| 2015/0116214 A1 | 4/2015 | Grunnet-Jepsen et al. |
| 2015/0131859 A1 | 5/2015 | Kim et al. |
| 2015/0172539 A1 | 6/2015 | Neglur |
| 2015/0193669 A1 | 7/2015 | Gu et al. |
| 2015/0205358 A1 | 7/2015 | Lyren |
| 2015/0205400 A1 | 7/2015 | Hwang et al. |
| 2015/0206321 A1 | 7/2015 | Scavezze et al. |
| 2015/0227795 A1 | 8/2015 | Starner et al. |
| 2015/0234469 A1* | 8/2015 | Akiyoshi ............ G06F 3/04842 345/156 |
| 2015/0234569 A1 | 8/2015 | Hess |
| 2015/0258432 A1 | 9/2015 | Stafford et al. |
| 2015/0261291 A1 | 9/2015 | Mikhailov et al. |
| 2015/0304593 A1 | 10/2015 | Sakai |
| 2015/0323785 A1 | 11/2015 | Fukata et al. |
| 2016/0062573 A1 | 3/2016 | Dascola et al. |
| 2016/0086046 A1 | 3/2016 | Holz et al. |
| 2016/0093105 A1 | 3/2016 | Rimon et al. |

FOREIGN PATENT DOCUMENTS

| | | |
|---|---|---|
| CN | 101729808 A | 6/2010 |
| CN | 101930610 A | 12/2010 |
| CN | 101951474 A | 1/2011 |
| CN | 102053702 A | 5/2011 |
| CN | 201859393 U | 6/2011 |
| CN | 102201121 A | 9/2011 |
| CN | 102236412 A | 11/2011 |
| DE | 4201934 A1 | 7/1993 |
| DE | 10326035 A1 | 1/2005 |
| DE | 102007015495 A1 | 10/2007 |
| DE | 102007015497 B4 | 1/2014 |
| EP | 0999542 A1 | 5/2000 |
| EP | 1477924 A2 | 11/2004 |
| EP | 1837665 A2 | 9/2007 |
| EP | 2369443 A2 | 9/2011 |
| GB | 2419433 A | 4/2006 |
| GB | 2480140 A | 11/2011 |
| GB | 2519418 A | 4/2015 |

(56) References Cited

FOREIGN PATENT DOCUMENTS

| | | | |
|---|---|---|---|
| JP | H02236407 A | 9/1990 | |
| JP | H08261721 A | 10/1996 | |
| JP | H09259278 A | 10/1997 | |
| JP | 2000023038 A | 1/2000 | |
| JP | 2002133400 A | 5/2002 | |
| JP | 2003256814 A | 9/2003 | |
| JP | 2004246252 A | 9/2004 | |
| JP | 2006019526 A | 1/2006 | |
| JP | 2006259829 A | 9/2006 | |
| JP | 2007272596 A | 10/2007 | |
| JP | 2008227569 A | 9/2008 | |
| JP | 2009031939 A | 2/2009 | |
| JP | 2009037594 A | 2/2009 | |
| JP | 2010060548 A | 3/2010 | |
| JP | 2011010258 A | 1/2011 | |
| JP | 2011501316 A | 1/2011 | |
| JP | 2011065652 A | 3/2011 | |
| JP | 2011107681 A | 6/2011 | |
| JP | 4906960 B2 | 3/2012 | |
| JP | 2012527145 A | 11/2012 | |
| KR | 101092909 B1 | 12/2011 | |
| RU | 2422878 C1 | 6/2011 | |
| TW | 200844871 A | 11/2008 | |
| WO | 9426057 A1 | 11/1994 | |
| WO | 2004114220 A1 | 12/2004 | |
| WO | 2006020846 A2 | 2/2006 | |
| WO | 2007137093 A2 | 11/2007 | |
| WO | 2010007662 A1 | 1/2010 | |
| WO | 2010032268 A2 | 3/2010 | |
| WO | 2010076622 A1 | 7/2010 | |
| WO | 2010088035 A2 | 8/2010 | |
| WO | 2010138741 A1 | 12/2010 | |
| WO | 2011024193 A2 | 3/2011 | |
| WO | 2011036618 A2 | 3/2011 | |
| WO | 2011044680 A1 | 4/2011 | |
| WO | 2011045759 A1 | 4/2011 | |
| WO | 2011119154 A1 | 9/2011 | |
| WO | 2012027422 A2 | 3/2012 | |
| WO | 2013109608 A2 | 7/2013 | |
| WO | 2013109609 A2 | 7/2013 | |
| WO | 2014200589 A2 | 12/2014 | |
| WO | 2014208087 A1 | 12/2014 | |
| WO | 2015026707 A1 | 2/2015 | |

OTHER PUBLICATIONS

Calinon et al., A probabilistic approach based on dynamical systems to team and reproduce gestures by imitation, Dec. 19, 2011 [retrieved Mar. 16, 2018], pp. 1-12. Retrieved from the Internet: <https://web.archive.org/web/20111219151051/http://infoscience.epfl.ch/record/147286/files/CalinonEtAIRAM2010.pdf?version=6>.

Cui et al., "Applications of Evolutionary Computing: Vision-Based Hand Motion Capture Using Genetic Algorithm", 2004 [retrieved Jul. 15, 2016], Springer Berlin Heidelberg, vol. 3005 of LNCS, pp. 289-300. Retrieved from the Internet: <http://link.springer.com/chapter/10.1007/978-3-540-24653-4_30>.

De La Gorce et al., "Model-Based 3D Hand Pose Estimation from Monocular Video", Feb. 24, 2011 [retrieved Jul. 15, 2016], IEEE Transac Pattern Analysis and Machine Intell, vol. 33, Issue: 9, pp. 1793-1805, Retri Internet: <http://ieeexplore.ieee.org/xpl/login.jsp?tp=&arnumber=5719617&url=http%3A%2F%2Fieeexplore.ieee.org%2Fxpls%2Fabs_all.jsp%3Farnumber%3D5719617>.

Delamarre et al., "Finding Pose of Hand in Video Images: A Stereo-based Approach", Apr. 14-16, 1998 [retrieved Jul. 15, 2016], Third IEEE Intern Conf on Auto Face and Gesture Recog, pp. 585-590. Retrieved from the Internet: <http://ieeexplore.ieee.org/xpl/login.jsp?tp=&arnumber=671011&url=http%3A%2F%2Fieeexplore.ieee.org%2Fxpls%2Fabs_all.jsp%3Farnumber%3D671011>.

Delmarre et al., 3D Articulated Models and Multiview Tracking with Physical Forces, Mar. 2001 [retrieved Jun. 12, 2022], Computer Vision and Image Understanding, vol. 81, Issue 3, pp. 328-357. Retrieved: https://www.sciencedirect.com/science/article/pii/S1077314200908920 (Year: 2001).

Guo et al., Featured Wand for 3D Interaction, Jul. 2-5, 2007 [retrieved Jul. 15, 2016], 2007 IEEE International Conference on Multimedia and Expo, pp. 2230-2233. Retrieved from the Internet: <http://ieeexplore.ieee.org/xpl/login.jsp?tp=&arnumber=4285129&tag=1&url=http%3A%2F%2Fieeexplore.ieee.org%2Fxpls%2Fabs_all.jsp%3Farnumber%3D4285129%26tag%3D1>.

Hamer et al., "Data-Driven Animation of Hand-Object Interactions", Mar. 21-25, 2011, Face and Gesture 2011, pp. 360-367. [retrieved on Jun. 19, 2019], Retrieved from the internet <https://ieeexplore.ieee.org/abstract/document/5771426>.

Hong et al., "Variable structure multiple model for articulated human motion tracking from monocular video sequences", May 2012 [retrieved Mar. 3, 2018], Science China Information Science, vol. 55, Issue 5, pp. 1138-1150. Retrieved from the Interent: <https://link.springer.com/article/10.1007/s11432-011-4529-8>.

Kim et al., RetroDepth: 3D Silhouette Sensing for High-Precision Input on and Above Physical Surfaces, Apr. 26, 2014 [retrieved Jun. 12, 2022], CHI '14: Proceedings of the SIGCHI Conference on Human Factors in Computing Systems, pp. 1377-1386. Retrieved: (Year: 2014) https://dl.acm.org/doi/abs/10.1145/2556288.2557336 (Year: 2014).

Melax et al., "Dynamics Based 3D Skeletal Hand Tracking", May 29, 2013 [retrieved Jul. 14, 2016], Proceedings of Graphics Interface, 2013, pp. 63-70. Retrived from the Internet: <http://dl.acm.org/citation.cfm?id=2532141>.

Oka et al., "Real-Time Fingertip Tracking and Gesture Recognition", Nov./Dec. 2002 [retrieved Jul. 15, 2016], IEEE Computer Graphics and Applications, vol. 22, Issue: 6, pp. 64-71. Retrieved from the Internet: <http://ieeexplore.ieee.org/xpl/login.jsp?tp=&arnumber=1046630&url=http%3A%2F%2Fieeexplore.ieee.org%2Fxpls%2Fabsall.jsp%3Farnumber%3D1046630>.

Schlattmann et al., "Markerless 4 gestures 6 DOF real-time visual tracking of the human hand with automatic initialization", 2007 [retrieved Jul. 15, 2016], Eurographics 2007, vol. 26, No. 3, 10 pages, Retrieved from the Internet: <http://cg.cs.uni-bonn.de/aigaion2root/attachments/schlattmann-2007-markerless.pdf>.

Shimada et al., "Hand Gesture Estimation and Model Refinement using Monocular Camera-Ambiguity Limitation by Inequality v Constraints", Apr. 14-16, 1998, Procedings 3rd IEEE Inter Confer Auto Face and Gesture Recog, pp. 1-6. [retrieved on Jun. 19, 2019], Retrivied from the internet <https://ieeexplore.ieee.org/abstract/document/670960>.

Stenger, et al., "Model-Based 30 Tracking of an Articulated Hand", Computer Vision and Pattern Recognition, 2001. CVPR 2001 Proceedings of the 2001 IEEE Computer Society Conference on. vol. 2. IEEE, 2001, pp. 1-6.

Wang et al., "Tracking of Deformable Hand in Real Time as Continuous Input for Gesture-based Interaction", Jan. 28, 2007 [retrieved Jul. 15, 2016], Proceedings of the 12th International Conference on Intelligent User Interfaces, pp. 235-242. Retrieved fromthe Internet: <http://dl.acm.org/citation.cfm?id=1216338>.

Yamamoto et al., "A Study for Vision Based Data Glove Considering Hidden Fingertip with Self-Occlusion", Aug. 8-10, 2012 [retrieved Mar. 16, 2018], 2012 13th ACIS Int. Conf on Soft Eng, AI, Network and Parallel & Dist Computing, pp. 315-320. Retrieved from the Internet: «http://ieeexplore.ieee.org/abstract/document/6299298/».

Zhao et al., "Combining Marker-Based Mocap and RGB-D Camera for Acquiring High-Fidelity Hand Motion Data", Jul. 29, 2012 [retrieved Jul. 15, 2016], Proceedings of the ACM SIGGRAPH/Eurographics Symposium on Computer Animation, pp. 33-42, Retrieved from the Internet: <http://dl.acm.org/citation.cfm?id=2422363>.

PCT/US2013/021709—International Search Report and Written Opinion dated Sep. 12, 2013, 22 pages.

PCT/US2013/021713—International Search Report and Written Opinion dated Sep. 11, 2013, 7 pages.

PCT/US2013/021709—International Preliminary Report on Patentability dated Jul. 22, 2014, 22 pages (WO 2013/109608).

(56) References Cited

OTHER PUBLICATIONS

PCT/US2013/069231—International Search Report and Written Opinion mailed Mar. 13, 2014, 7 pages.
PCT/US2013/069231—International Preliminary Report with Written Opinion dated May 12, 2015, 8 pages.
CN 2013800122765—Office Action dated Nov. 2, 2015, 17 pages.
JP 2014-552391—First Office Action dated Dec. 9, 2014, 6 pages.
DE 11 2013 000 590.5—First Office Action dated Nov. 5, 2014, 7 pages.
DE 11 2013 000 590.5—Response to First Office Action dated Nov. 5, 2014 filed Apr. 24, 2015, 1 page.
DE 11 2013 000 590.5—Second Office Action dated Apr. 29, 2015, 7 pages.
DE 11 2013 000 590.5—Response to Second Office Action dated Apr. 29, 2015 filed Sep. 16, 2015, 11 pages.
DE 11 2013 000 590.5—Third Office Action dated Sep. 28, 2015, 4 pages.
DE 11 2013 000 590.5—Response to Third Office Action dated Sep. 28, 2015 filed Dec. 14, 2015, 64 pages.
DE 11 2013 000 590.5—Notice of Allowance dated Jan. 18, 2016, 8 pages.
CN 2013800122765—Response to First Office Action dated Nov. 2, 2015 filed May 14, 2016, 14 pages.
JP 2014-552391—Response to First Office Action dated Dec. 9, 2014 filed Jun. 8, 2016, 9 pages.
JP 2014-552391—Second Office Action dated Jul. 7, 2015, 7 pages.
JP 2014-552391—Response to Second Office Action dated Jul. 7, 2015 filed Dec. 25, 2015, 4 pages.
JP 2014-552391—Third Office Action dated Jan. 26, 2016, 5 pages.
CN 2013800122765—Second Office Action dated Jul. 27, 2016, 6 pages.
CN 2013800122765—Response to Second Office Action dated Jul. 27, 2016 filed Oct. 11, 2016, 3 pages.
PCT/US2014/028265, International Search Report and Written Opinion, Jan. 7, 2015, 15 pages.
PCT/US2013/021713—International Preliminary Report on Patentability dated Jul. 22, 2014, 13 pages, (WO 2013/109609).
PCT/JP2008/062732, WO English Abstract with Japanese Publication of WO 2010/007662 A1, "Heat-Resistant Cushion material for Forming Press," Jan. 21, 2010, Ichikawa Co Ltd, 35 pages.
PCT/US2014/013012—International Search Report and Written Opinion dated May 14, 2014, published as WO 2014116991, 12 pages.

* cited by examiner

Initial Sampling

Subset Scoring

Region Sum Exceeds Threshold

Region Resampling

1100

1102 — accessing first and second positions of a segment of a predictive model of a control object, wherein motion between the first position and the second position was at least partially occluded from observation in a three-dimensional (3D) sensory space 1112 — receiving two or more alternative interpretations of movement from the first position to the second position 1122 — estimating entropy or extent of motion involved in the alternative interpretations 1132 — selecting an alternative interpretation with lower entropy or extent of motion than other interpretations 1142 — applying the selected interpretation to predicting further positioning of the segment and of other segments of the predictive model from additional observations in the 3D sensory space

FIG. 11

PREDICTIVE INFORMATION FOR FREE SPACE GESTURE CONTROL AND COMMUNICATION

PRIORITY DATA

This application is a continuation of U.S. patent application Ser. No. 18/161,811 entitled "PREDICTIVE INFORMATION FOR FREE SPACE GESTURE CONTROL AND COMMUNICATION", filed on Jan. 30, 2023, which is a continuation of U.S. patent application Ser. No. 17/308,903 entitled "PREDICTIVE INFORMATION FOR FREE SPACE GESTURE CONTROL AND COMMUNICATION", filed on May 5, 2021, which is a continuation of U.S. patent application Ser. No. 16/695,136 entitled "IMPROVING PREDICTIVE INFORMATION FOR FREE SPACE GESTURE CONTROL AND COMMUNICATION", filed on Nov. 25, 2019, which is a continuation of U.S. patent application Ser. No. 16/004,119 entitled "PREDICTIVE INFORMATION FOR FREE SPACE GESTURE CONTROL AND COMMUNICATION", filed on Jun. 8, 2018, which is a continuation of U.S. patent application Ser. No. 14/530,690, entitled "PREDICTIVE INFORMATION FOR FREE SPACE GESTURE CONTROL AND COMMUNICATION", filed on Oct. 31, 2014, which claims the benefit of U.S. Provisional Patent Application No. 61/898,462, entitled, "PREDICTIVE INFORMATION FOR FREE SPACE GESTURE CONTROL AND COMMUNICATION," filed on Oct. 31, 2013. The non-provisional and provisional applications are hereby incorporated by reference for all purposes.

INCORPORATIONS

Materials incorporated by reference in this filing include the following:
"PREDICTIVE INFORMATION FOR FREE SPACE GESTURE CONTROL AND COMMUNICATION," U.S. Prov. App. No. 61/871,790, filed 29 Aug. 2013,
"PREDICTIVE INFORMATION FOR FREE-SPACE GESTURE CONTROL AND COMMUNICATION," U.S. Prov. App. No. 61/873,758, filed 4 Sep. 2013,
"VELOCITY FIELD INTERACTION FOR FREE SPACE GESTURE INTERFACE AND CONTROL," U.S. Prov. App. No. 61/891,880, filed 16 Oct. 2013,
"VELOCITY FIELD INTERACTION FOR FREE SPACE GESTURE INTERFACE AND CONTROL," U.S. Non. Prov. application Ser. No. 14/516,493, filed 16 Oct. 2014,
"CONTACTLESS CURSOR CONTROL USING FREE-SPACE MOTION DETECTION," U.S. Prov. App. No. 61/825,480, filed 20 May 2013,
"FREE-SPACE USER INTERFACE AND CONTROL USING VIRTUAL CONSTRUCTS," U.S. Prov. App. No. 61/873,351, filed 3 Sep. 2013,
"FREE-SPACE USER INTERFACE AND CONTROL USING VIRTUAL CONSTRUCTS," U.S. Prov. App. No. 61/877,641, filed 13 Sep. 2013,
"CONTACTLESS CURSOR CONTROL USING FREE-SPACE MOTION DETECTION," U.S. Prov. App. No. 61/825,515, filed 20 May 2013,
"FREE-SPACE USER INTERFACE AND CONTROL USING VIRTUAL CONSTRUCTS," U.S. Non. Prov. application Ser. No. 14/154,730, filed 14 Jan. 2014,
"SYSTEMS AND METHODS FOR MACHINE CONTROL," U.S. Non. Prov. application Ser. No. 14/280, 018, filed 16 May 2014,
"DYNAMIC, FREE-SPACE USER INTERACTIONS FOR MACHINE CONTROL," U.S. Non. Prov. application Ser. No. 14/155,722, filed 1 Jan. 2014, and
"PREDICTIVE INFORMATION FOR FREE SPACE GESTURE CONTROL AND COMMUNICATION," U.S. Non. Prov. application Ser. No. 14/474,077, filed 29 Aug. 2014.

TECHNICAL FIELD

Embodiments relate generally to image analysis, and in particular embodiments to identifying shapes and capturing motions of objects in three-dimensional space.

DISCUSSION

Conventional motion capture approaches rely on markers or sensors worn by the subject while executing activities and/or on the strategic placement of numerous bulky and/or complex equipment in specialized environments to capture subject movements. Unfortunately, such systems tend to be expensive to construct. In addition, markers or sensors worn by the subject can be cumbersome and interfere with the subject's natural movement. Further, systems involving large numbers of cameras tend not to operate in real time, due to the volume of data that needs to be analyzed and correlated. Such considerations of cost, complexity and convenience have limited the deployment and use of motion capture technology.

Consequently, there is a need for improved techniques for capturing the motion of objects in real time without attaching sensors or markers thereto.

SUMMARY

Among other aspects, embodiments can provide for improved image based machine interface and/or communication by interpreting a control object's position and/or motion (including objects having one or more articulating members, i.e., humans and/or animals and/or machines). Among other aspects, embodiments can enable automatically (e.g., programmatically) refine predictive information to determine improved predictive information based upon a discrepancy determined from characteristics of observed information. Predictive information can comprise radial solids and/or other shapes includable in a model. Embodiments can enable conformance of the model to real world changes in a control object (i.e., object being modeled) facilitating real time or near real time control, communication and/or interaction with machines. Inputs can be interpreted from one or a sequence of images, scans, etc. in conjunction with receiving input, commands, communications and/or other user-machine interfacing, gathering information about objects, events and/or actions existing or occurring within an area being explored, monitored, or controlled, and/or combinations thereof.

The technology disclosed relates to simplifying updating of a predictive model using clustering observed points. In particular, it relates to observing a set of points in a three-dimensional (3D) sensory space, determining surface normal directions from the points, clustering the points by their surface normal directions and adjacency, accessing a predictive model of a hand, refining positions of segments of the predictive model, matching the clusters of the points to the segments, and using the matched clusters to refine the positions of the matched segments.

The technology disclosed also relates to selecting a reference vector and determining a difference in angle between the surface normal directions from the points and the reference vector and using a magnitude of the difference to cluster the points.

In one embodiment, the reference vector is orthogonal to a field of view of camera used to capture the points on an image. In another embodiment, the reference vector is along a longitudinal axis of the hand. In yet another embodiment, the reference vector is along a longitudinal axis of a portion of the hand.

In some embodiments, refining positions of segments of the predictive model further includes calculating an error indication by determining whether the points and points on the segments of the predictive model are within a threshold closest distance.

In other embodiments, refining positions of segments of the predictive model further includes calculating an error indication by pairing the points in the set with points on axes of the segments of the predictive model, wherein the points in the set lie on vectors that are normal to the axes and determining a reduced root mean squared deviation (RMSD) of distances between paired point sets.

In yet other embodiments, refining positions of segments of the predictive model further includes calculating an error indication by pairing the points in the set with points on the segments of the predictive model, wherein normal vectors to the points in the set are parallel to each other and determining a reduced root mean squared deviation (RMSD) of distances between bases of the normal vectors.

In some other embodiment, refining positions of segments of the predictive model further includes determining physical proximity between points in the set based on the matched clusters, based on the determined physical proximity, identifying co-located segments of the predictive model that change positions together, and refining positions of segments of the predictive model responsive to the co-located segments.

In one embodiment, the co-located segments represent adjoining figures of the hand.

In another embodiment, the co-located segments represent subcomponents of a same finger.

The technology disclosed also relates to distinguishing between alternative motions between two observed locations of a control object in a three-dimensional (3D) sensory space. In particular, it relates to accessing first and second positions of a segment of a predictive model of a control object such that motion between the first position and the second position was at least partially occluded from observation in a three-dimensional (3D) sensory space. It further relates to receiving two or more alternative interpretations of movement from the first position to the second position, estimating entropy or extent of motion involved in the alternative interpretations, selecting an alternative interpretation with lower entropy or extent of motion than other interpretations, and applying the selected interpretation to predicting further positioning of the segment and of other segments of the predictive model from additional observations in the 3D sensory space.

In one embodiment, the control object is a hand. In another embodiment, the control object is a tool.

The technology disclosed also relates to a system enabling simplifying updating of a predictive model using clustering observed points. The system comprises of at least one camera oriented towards a field of view, a gesture database comprising a series of electronically stored records, each of the records relating a predictive model of a hand, and an image analyzer coupled to the camera and the database and configured to observe a set of points in a three-dimensional (3D) sensory space using at least one image captured by the camera, determine surface normal directions from the points, cluster the points by their surface normal directions and adjacency, access a particular predictive model of the hand, refine positions of segments of the particular predictive model, match the clusters of the points to the segments, and use the matched clusters to refine the positions of the matched segments.

The technology disclosed also relates to a system that distinguishes between alternative motions between two observed locations of a control object in a three-dimensional (3D) sensory space. The system comprises of at least one camera oriented towards a field of view, a gesture database comprising a series of electronically stored records, each of the records relating a predictive model of a hand, an image analyzer coupled to the camera and the database and configured to access first and second positions of a segment of a predictive model of a control object such that motion between the first position and the second position was at least partially occluded from observation in a three-dimensional (3D) sensory space, receive two or more alternative interpretations of movement from the first position to the second position, estimate entropy or extent of motion involved in the alternative interpretations, select an alternative interpretation with lower entropy or extent of motion than other interpretations, and apply the selected interpretation to predicting further positioning of the segment and of other segments of the predictive model from additional observations in the 3D sensory space.

According to one aspect, a method embodiment for improving predictive information includes receiving predictive information and observed information of an object movable in space. A weighting function is can be applied to the predictive information and the observed information to determine a discrepancy. The predictive information can be refined to determine an improved predictive information based at least in part on the discrepancy.

In an embodiment, applying a weighting function can include selecting one or more points from a surface portion as represented in the observed information. A score can be determined for each point selected. For each point selected, a distance between a model surface of the predictive information and a corresponding surface portion represented in the observed information can be determined based upon the scores and points. A discrepancy for one or more surface portions can be determined based upon the distances computed from the scores and points.

In an embodiment, determining a score for a point can include assigning to the point a point parameter based on the observed information. A weighting function can be applied to the point parameter and a reference parameter to determine a score for the point. When the score is applied to the point, a scored point results. Reference parameters can be determined in a variety of ways in embodiments. For example and without limitation, a characteristic or property of a detection device or mechanism (i.e., scanner, imaging camera, etc.) such as a vector normal to the field of view. Alternatively or in addition, a parameter representing an orientation of a detection device (i.e., determinable using the detection functions of the device itself, auxiliary position awareness functions of the device, other sources of analogous information and/or combinations thereof) or a parameter derived from a physical surface (i.e., desk, table, monitor, etc.) on which a detection device is positioned, and so forth.

In an embodiment, applying a weighting function to a point parameter and a reference parameter can include determining an angle between a normal vector for the point and a reference vector and weighting the point by a size of an angle formed between the normal vector for the point and the reference vector.

Advantageously, some embodiments can enable quicker, crisper gesture based or "free space" (i.e., not requiring physical contact) interfacing with a variety of machines (e.g., a computing systems, including desktop, laptop, tablet computing devices, special purpose computing machinery, including graphics processors, embedded microcontrollers, gaming consoles, audio mixers, or the like; wired or wirelessly coupled networks of one or more of the foregoing, and/or combinations thereof), obviating or reducing the need for contact-based input devices such as a mouse, joystick, touch pad, or touch screen. Some embodiments can provide for improved interface with computing and/or other machinery than would be possible with heretofore known techniques. In some embodiments, a richer human—machine interface experience can be provided.

BRIEF DESCRIPTION OF THE DRAWINGS

A more complete understanding of the subject matter can be derived by referring to the detailed description and claims when considered in conjunction with the following figures, wherein like reference numbers refer to similar elements throughout the figures.

FIG. 7-1 depicts one embodiment of coupling emitters with other materials or devices. FIG. 7-2 shows one embodiment of interleaving arrays of image capture device(s). FIGS. 8-1 and 8-2 illustrate prediction information including models of different control objects. FIGS. 8-3 and 8-4 show interaction between a control object and an engagement target.

FIG. 11 is a representative method of distinguishing between alternative motions between two observed locations of a control object in a three-dimensional (3D) sensory space.

BRIEF DESCRIPTION

Among other aspects, embodiments described herein with reference to example implementations can provide for automatically (e.g., programmatically) refining predictive information to determine improved predictive information based upon a discrepancy determined from characteristics of observed information. Predictive information can comprise radial solids and/or other shapes includable in a model. Embodiments can enable conformance of the model to real world changes in a control object (i.e., object being modeled) facilitating real time or near real time control, communication and/or interaction with machines.

Figure 1A:
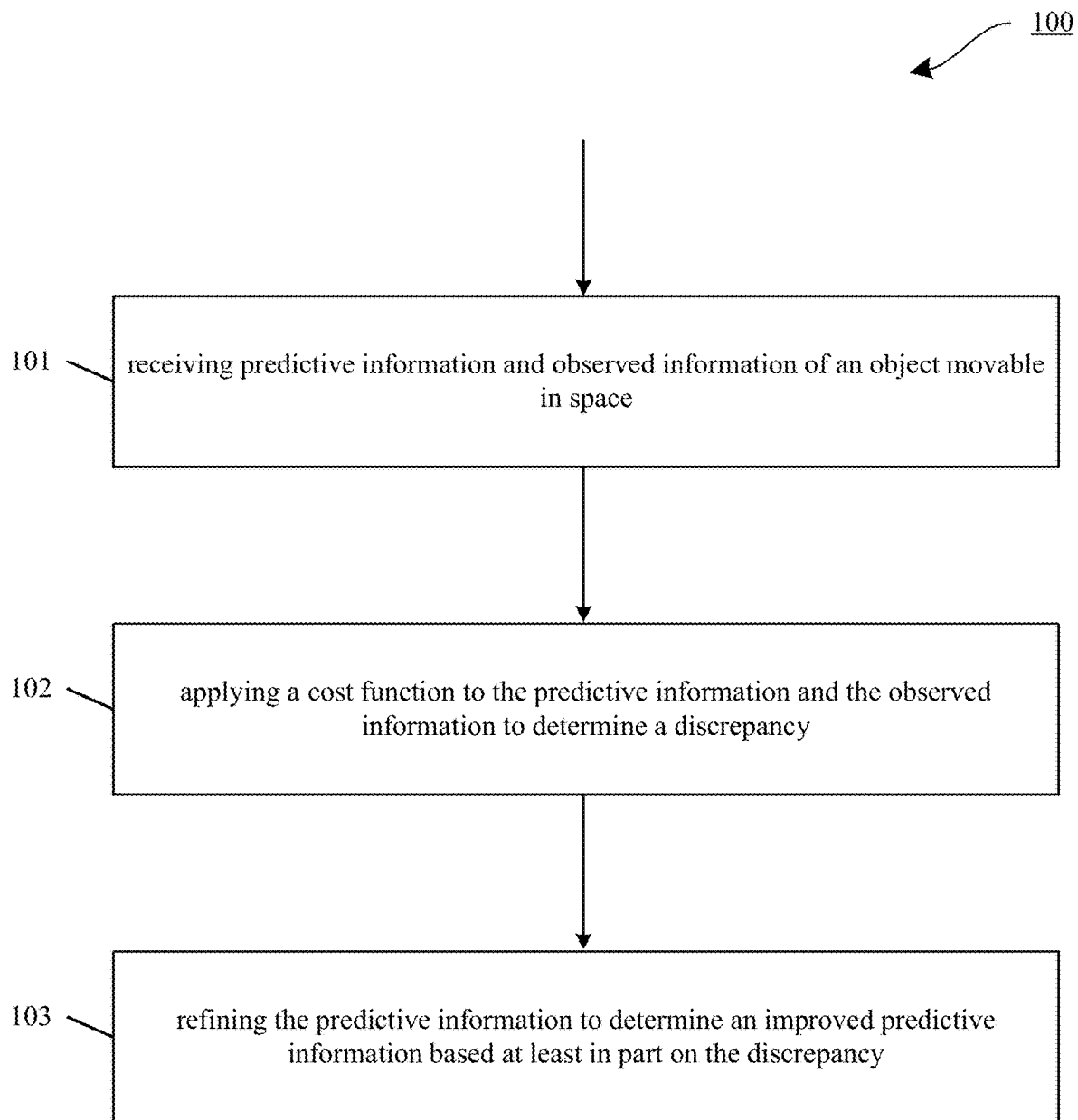
FIGS. 1A, 1B, 1C, 1D, 1E, 1F, 1G, 1H, and 1I illustrate flowcharts of processes for determining improved predictive information based upon a discrepancy determined from characteristics of observed information according to an embodiment.
Figure 1B:
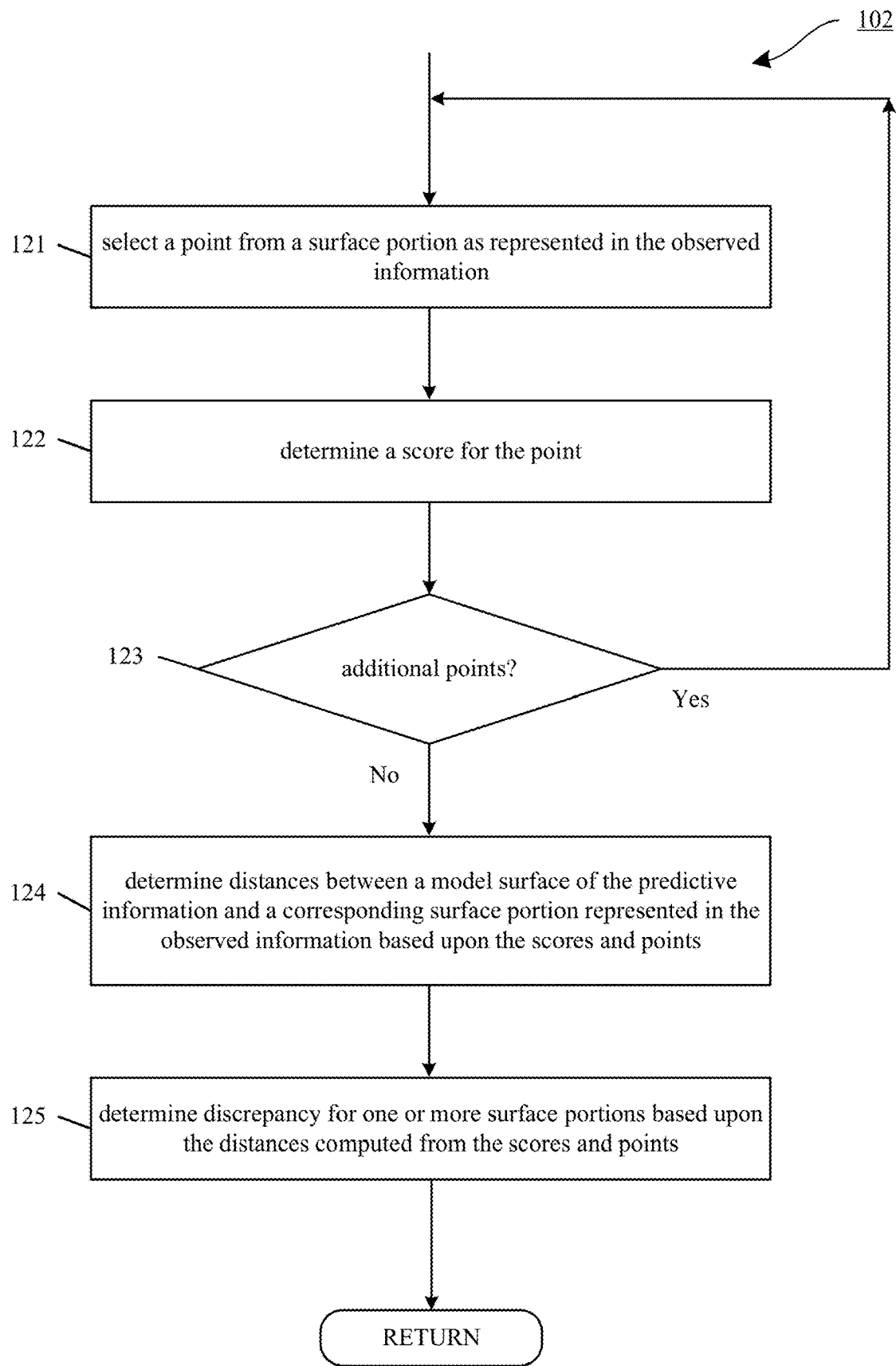

FIGS. 1A-1I illustrate flowcharts of processes for determining improved predictive information based upon a discrepancy determined from characteristics of observed information according to an embodiment. As shown in FIG. 1A, a process 100, operatively disposed in predictive discrepancy determiner 913 and carried out upon one or more computing devices in system 900 of FIG. 9, determines improved predictive information based upon a discrepancy determined from characteristics of observed information. In a block 101, predictive information and observed information of an object movable in space is received. The object can be a portion of a hand or other detectable object in a region of space for example. A detectable object is one that is not completely translucent to electromagnetic radiation (including light) at a working wavelength. Common detectable objects useful in various embodiments include without limitation a brush, pen or pencil, eraser, stylus, paintbrush and/or other virtualized tool and/or combinations thereof. Objects can be detected, and observed information can be determined, in a variety of ways, but in an embodiment and by way of example, one method for detecting objects is described below with reference to flowchart 101-1 of FIG. 1F. Predictive information including a model can be determined that corresponds to the portion of the hand or other detectable object that was detected. In an embodiment and by way of example, one example of determining predictive information including a model corresponding to the portion of the hand or other detectable object is described below with reference to flowchart 101-2 of FIG. 1I and FIGS. 6A, 6B. Other modeling techniques (e.g., skeletal models, visual hulls, surface reconstructions, other types of virtual surface or volume reconstruction techniques, or combinations thereof) can be used in other embodiments as will be readily apparent to one skilled in the art.

In a block 102, a cost function is applied to the predictive information and the observed information to determine a discrepancy. In an embodiment and by way of example, one method for applying a cost function is described below with reference to flowchart 102 of FIG. 1B and FIGS. 2A-2F. FIGS. 2A-2F depict determining discrepancy between predictive information and observed information according to an embodiment. As shown by a flowchart of FIG. 1B, a method 102 includes block 121 in which a point is selected from a surface portion as represented in the observed information. As illustrated by block 20 of FIG. 2A, one or more points on an observed surface portion 201 (i.e., of observed information) are selected as indicated by selected points 202. In a block 122, a score for the point determined. Algorithms for scoring vary widely and can be applied to the observed information in a variety of ways, but in one embodiment illustrated with reference to FIGS. 1C, 1D, a costing function is applied to the point(s) to determine score(s). In a block 123, a check whether there are any further points to process is made. If there are further points to process, then flow continues with block 121 to process the next point. Otherwise, in a block 124, distances between a model surface of the predictive information and a corresponding surface portion represented in the observed information is determined based upon the scores and points. In a block 125, a discrepancy for one or more surface portions is determined based upon the distances computed from the scores and points. In an embodiment, the procedure illustrated in FIG. 1B completes and returns the discrepancy(ies).

Figure 1C:
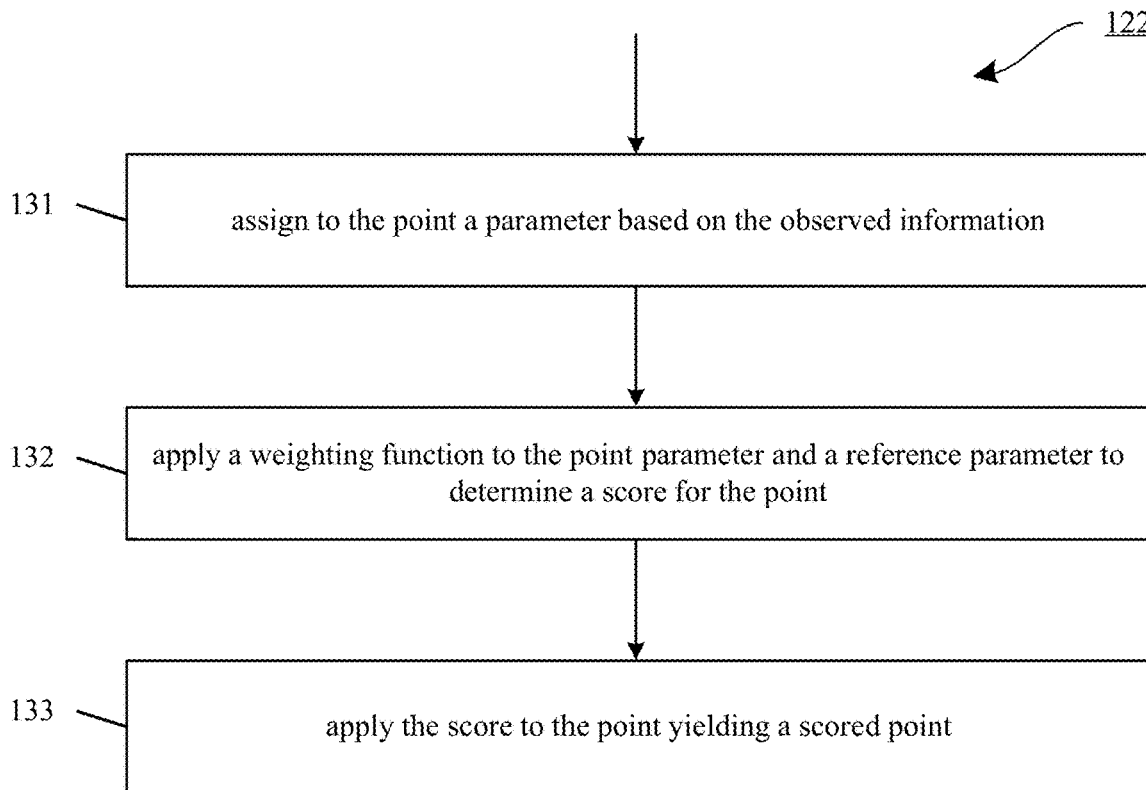
Figure 1D:
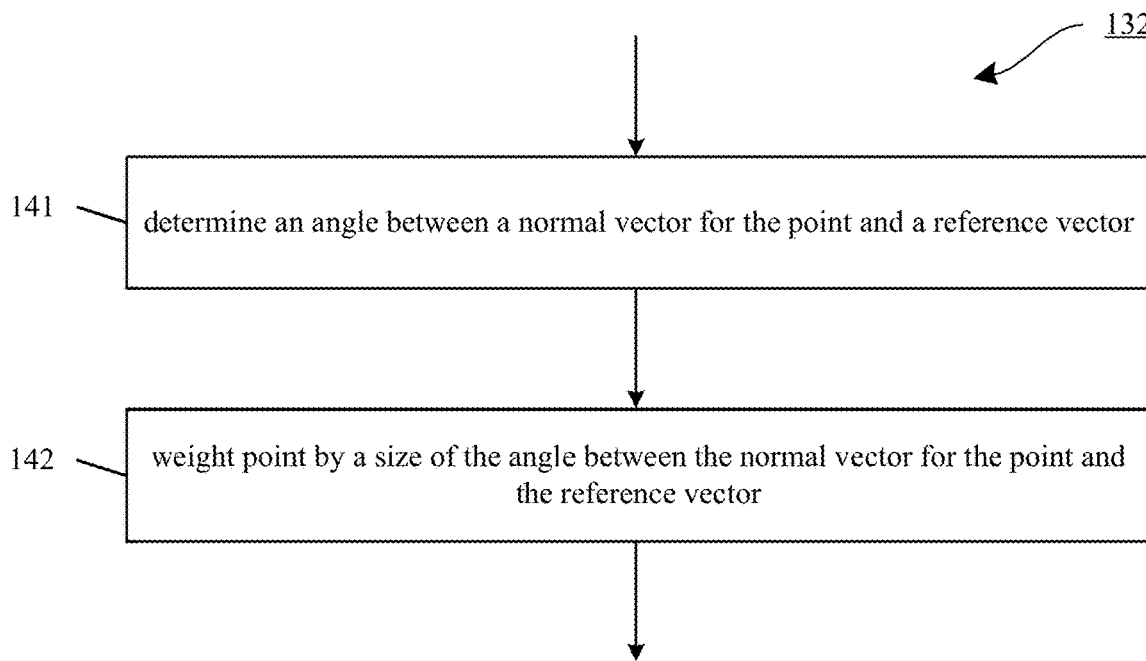
Figure 1E:
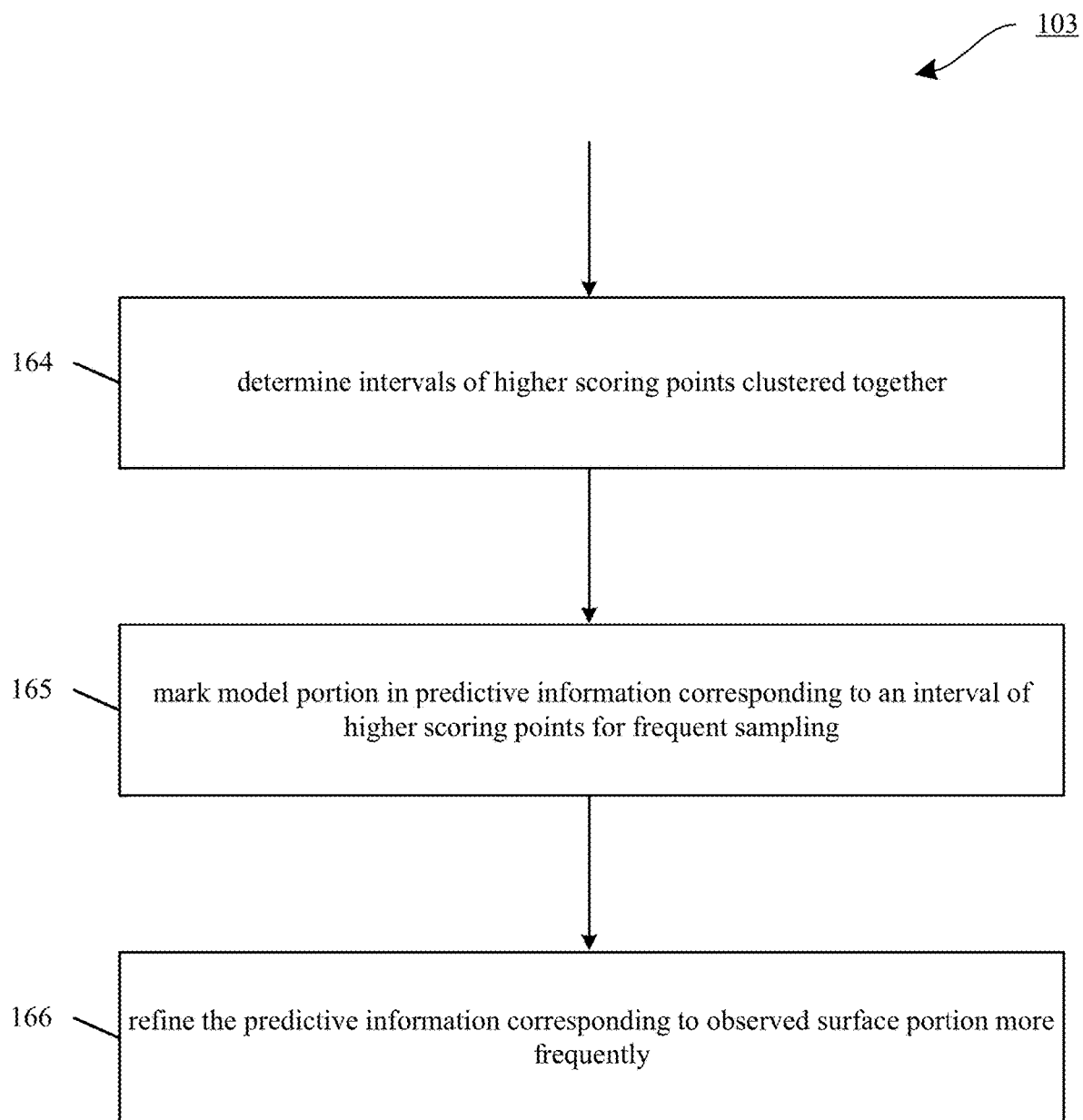

One method for determining a score for a point illustrated by flowcharts 122,132 of FIGS. 1C, 1D is shown with reference to FIGS. 2A-2F in which a point parameter 203 (of block 20 of FIG. 2A) is assigned to the point 202 based on the observed information (block 131 of FIG. 1C). A wide variety of types of parameters can be used in embodiments, but in one example embodiment illustrated by the flowchart 132 of FIG. 1D, a vector 203 (of block 21 of FIG. 2B) normal to a surface portion 201 (of block 20 of FIG. 2A) on which the point 202 is found can be used. In a block 132 of FIG. 1C, a weighting function 205 (of block 23 of FIG. 2D) is applied to the point parameter 203 and a reference parameter 204 (of block 22 of FIG. 2C) to determine a score 206 (of block 24 of FIG. 2E) for the point. Again with reference to flowchart 132 of FIG. 1D, one type of weighting function determines an angle between the normal vector 203 (of block 21 of FIG. 2B) for the point and a reference vector 204 (of block 22 of FIG. 2C) (block 141 of FIG. 1D) and weights point by a size of the angle between the normal vector for the point and the reference vector (block 142 of FIG. 1D. In a block 133 of FIG. 1C, the score 206 is applied to the point yielding a scored point from which a discrepancy 207 (of block 25 of FIG. 2F) can be determined.

Figure 2A:
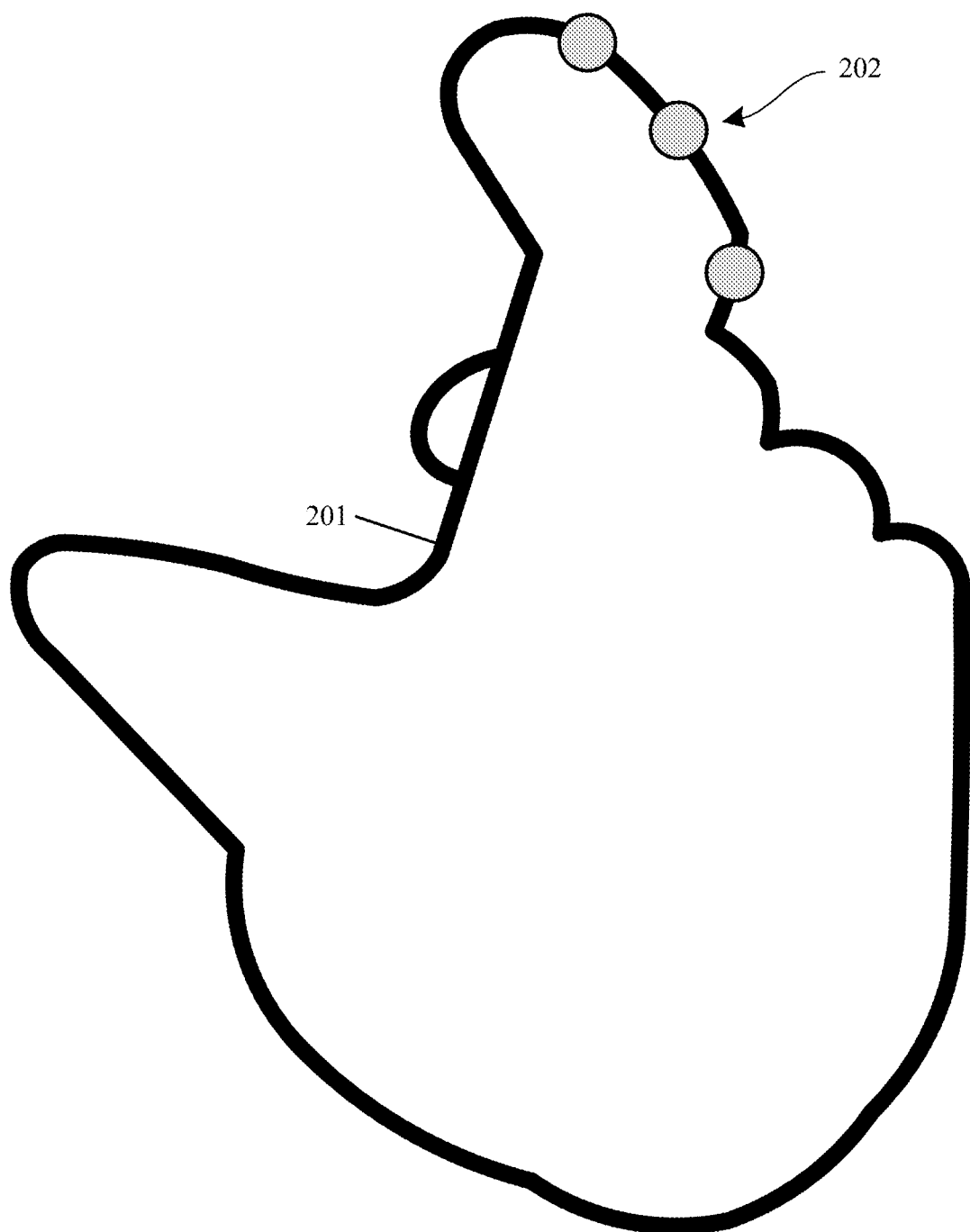
FIGS. 2A, 2B, 2C, 2D, 2E, and 2F depict determining a discrepancy between predictive information and observed information according to an embodiment.
Figure 2B:
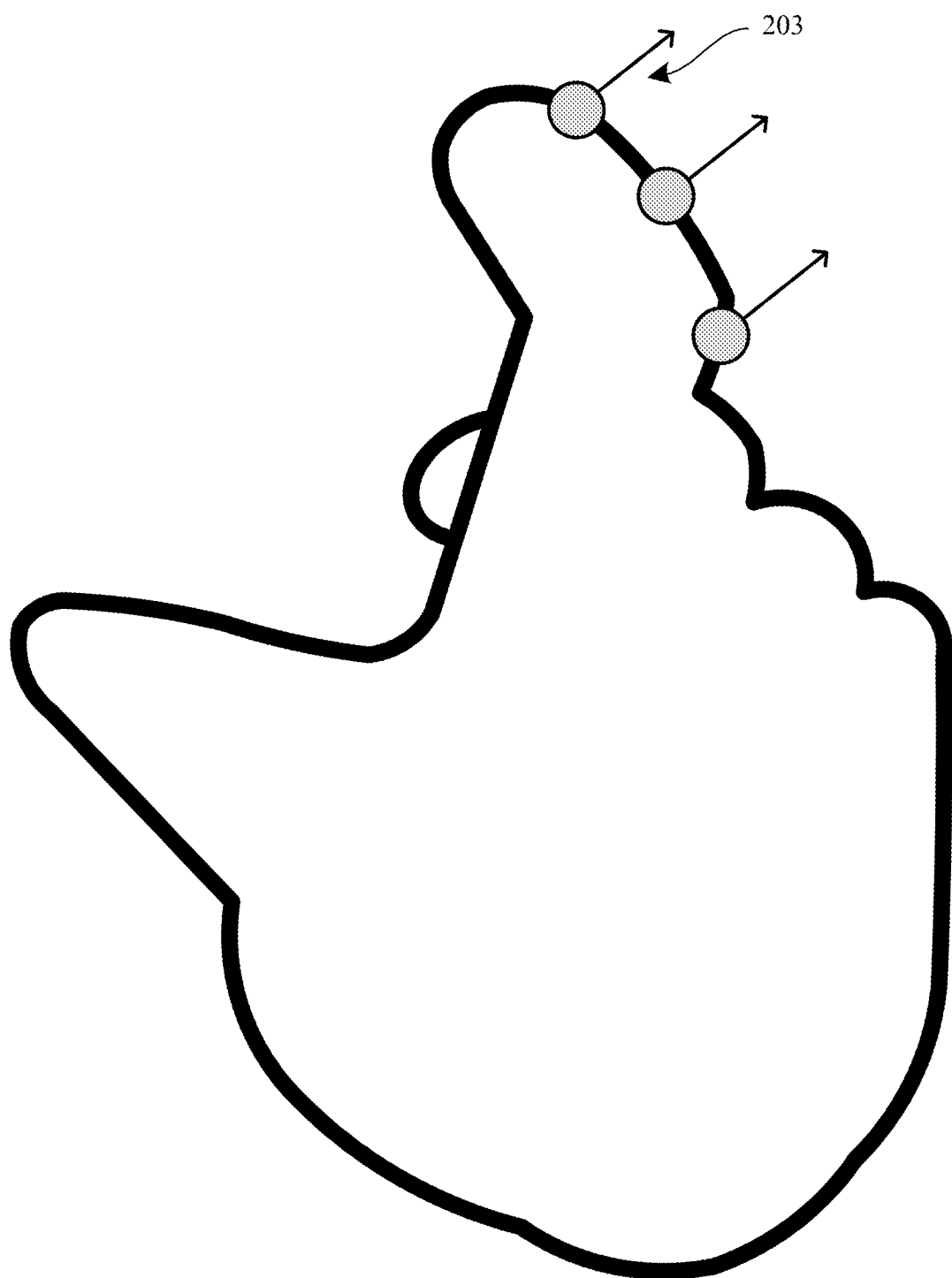
Figure 2C:
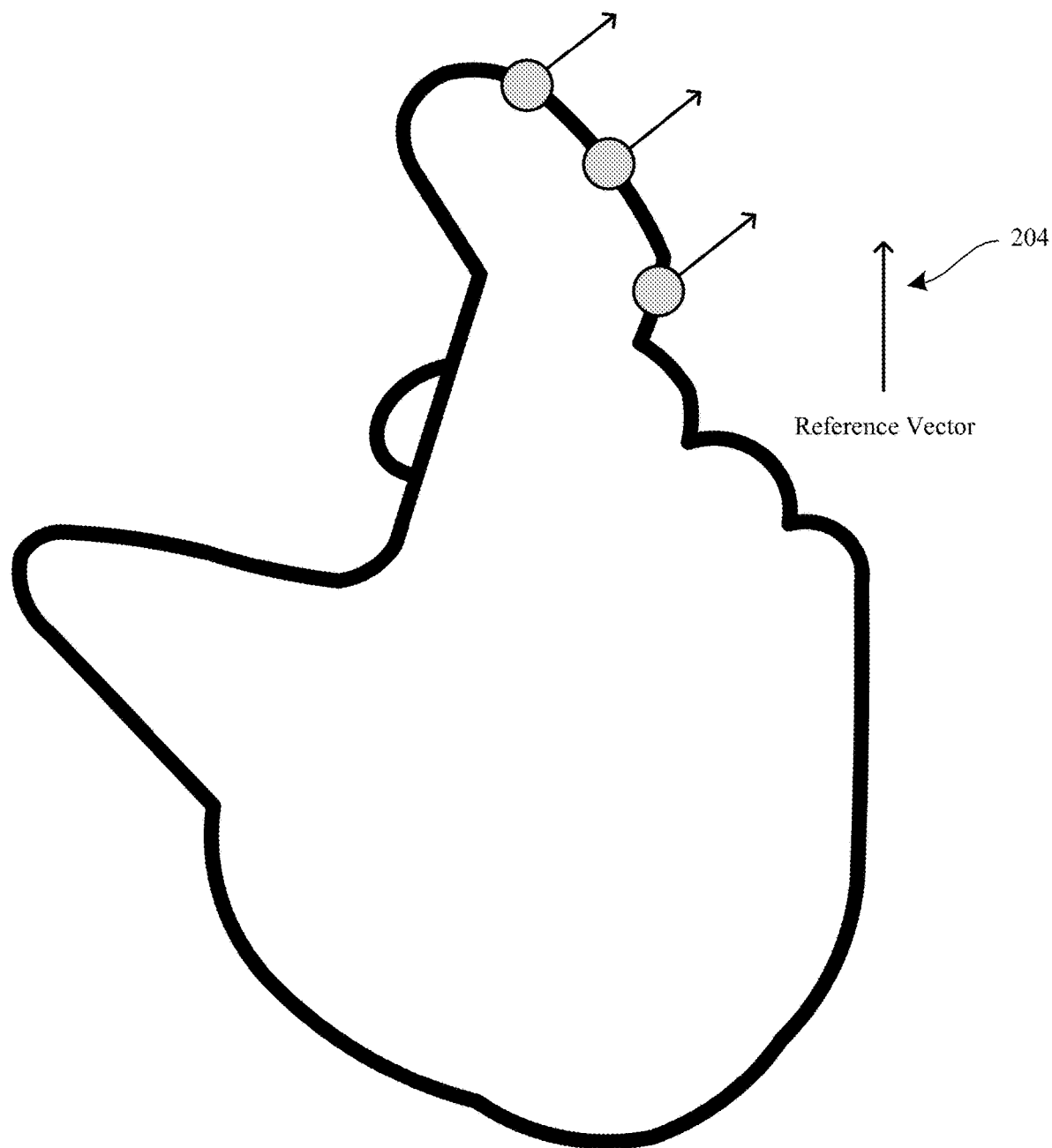
Figure 2D:
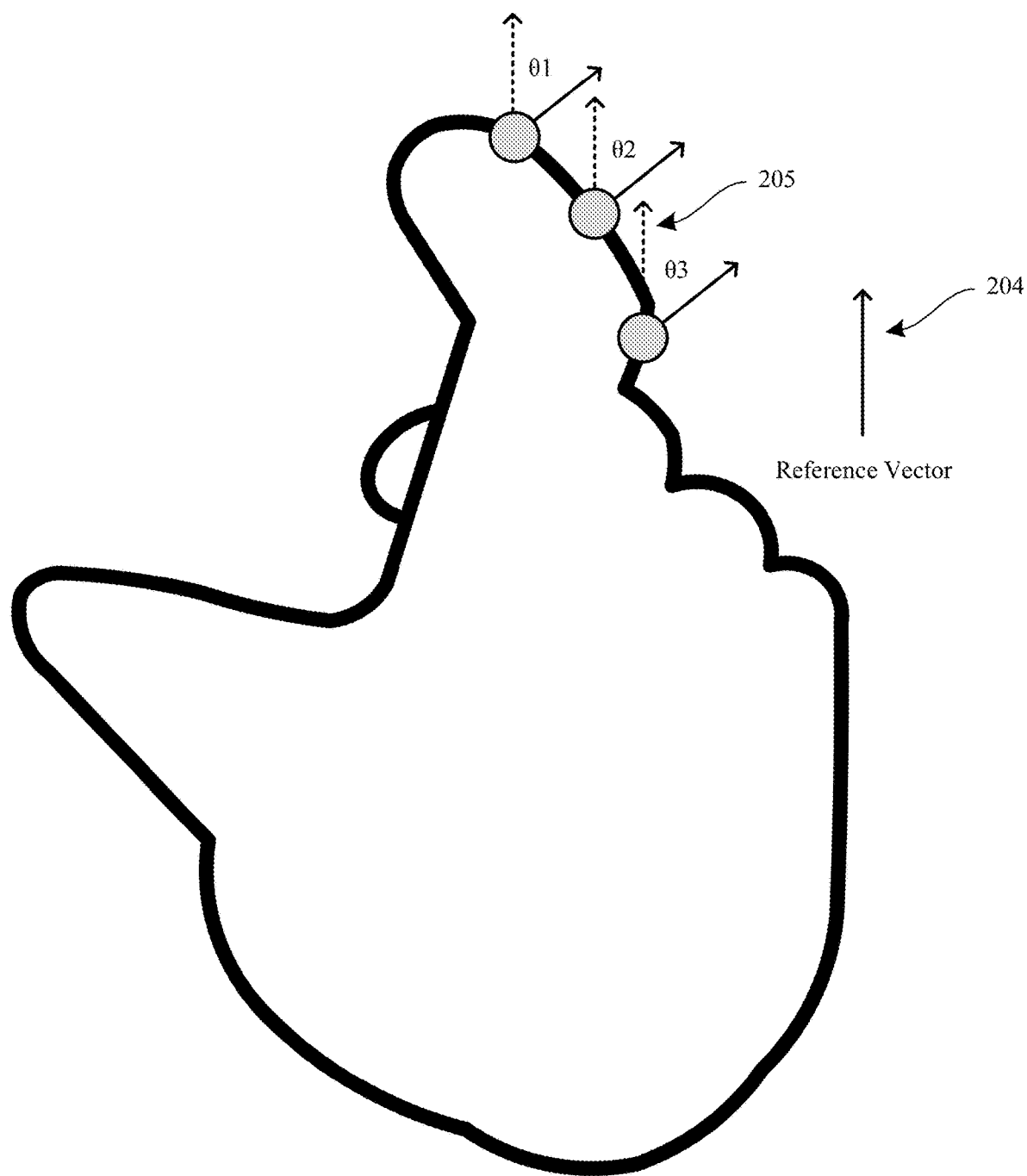
Figure 2E:
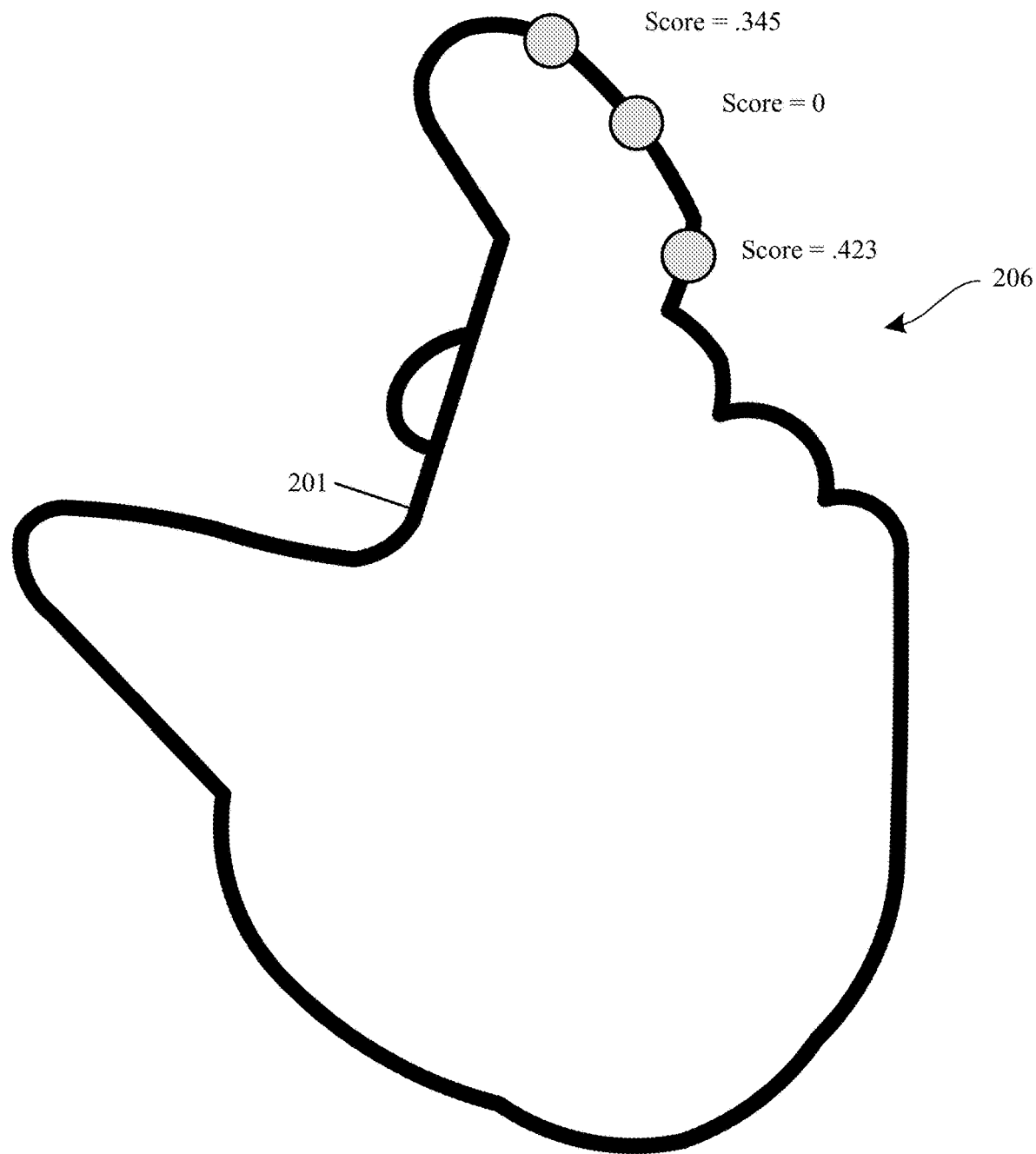
Figure 2F:
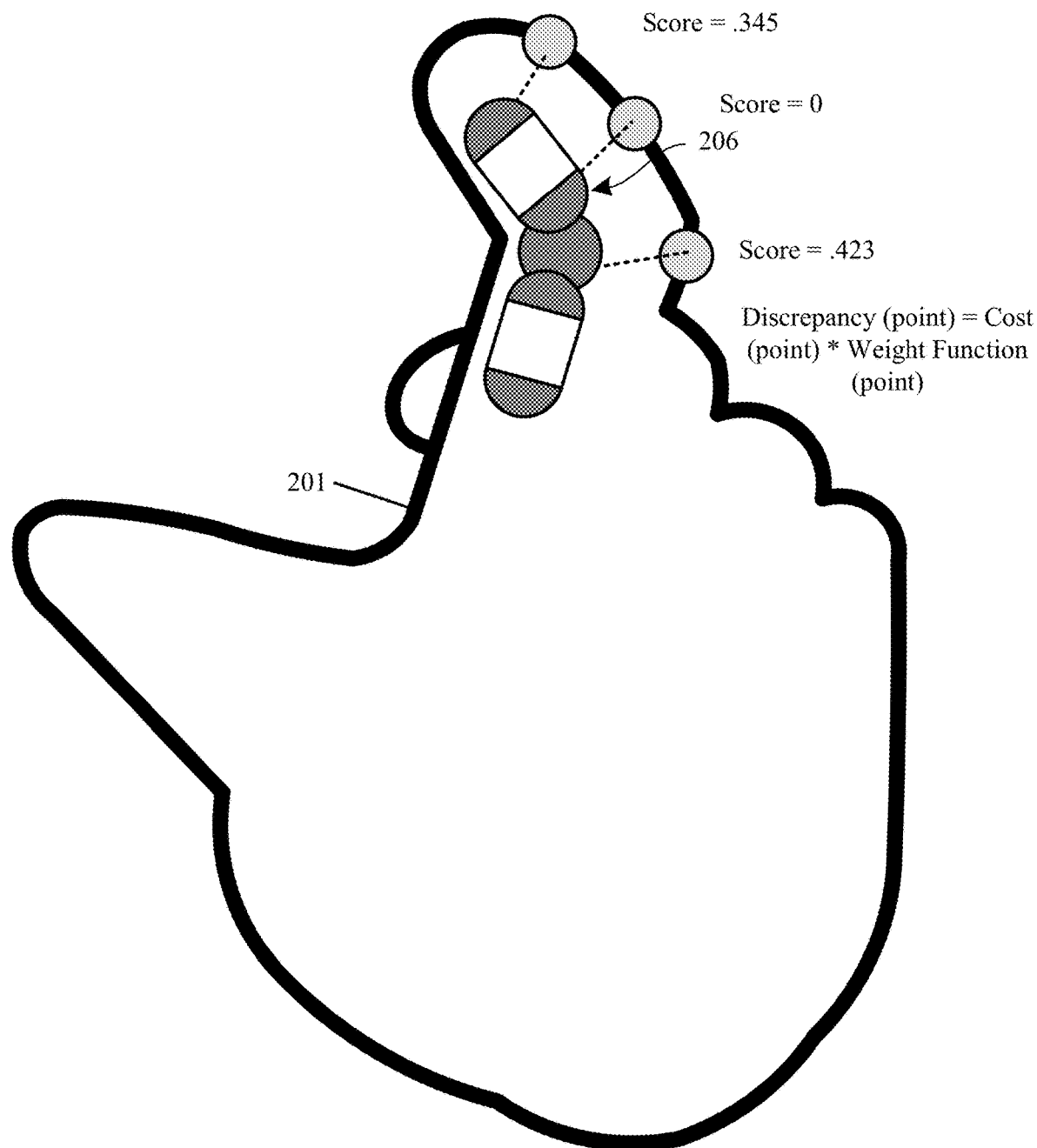
Figure 2G:
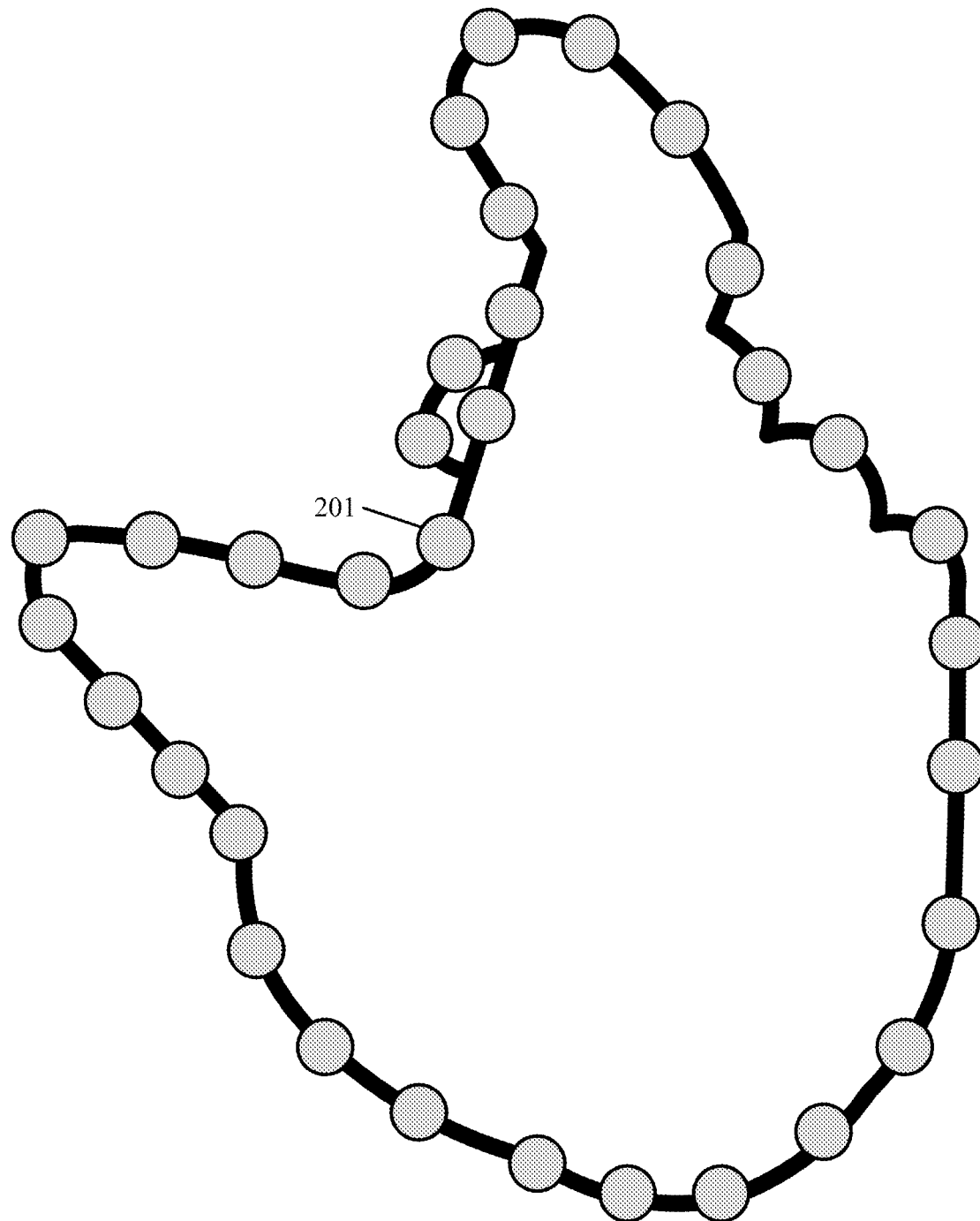
FIGS. 2G, 2H, 2I, and 2J depict refining predictive information using discrepancies and scores according to an embodiment.
Figure 2H:
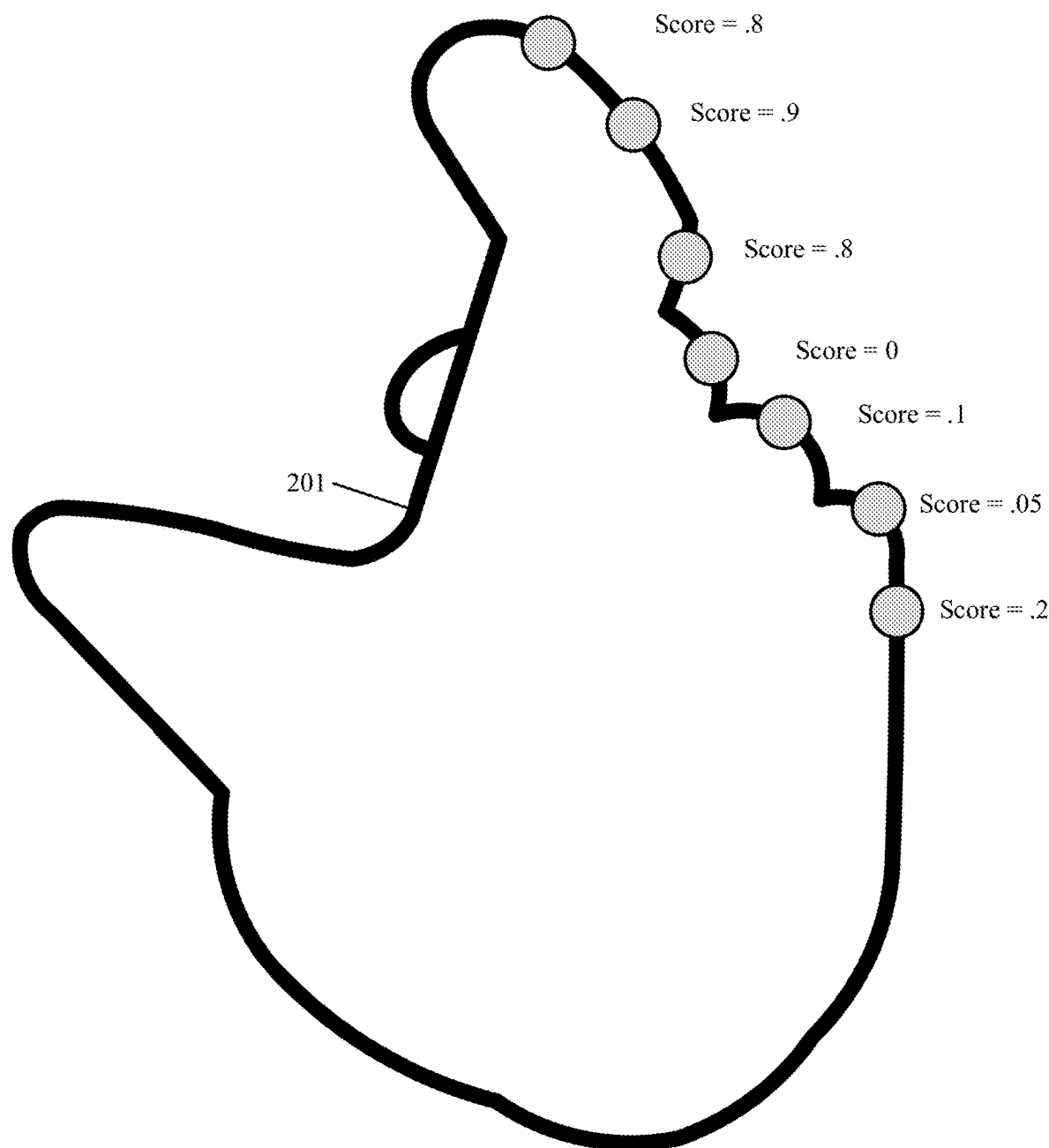
Figure 2I:
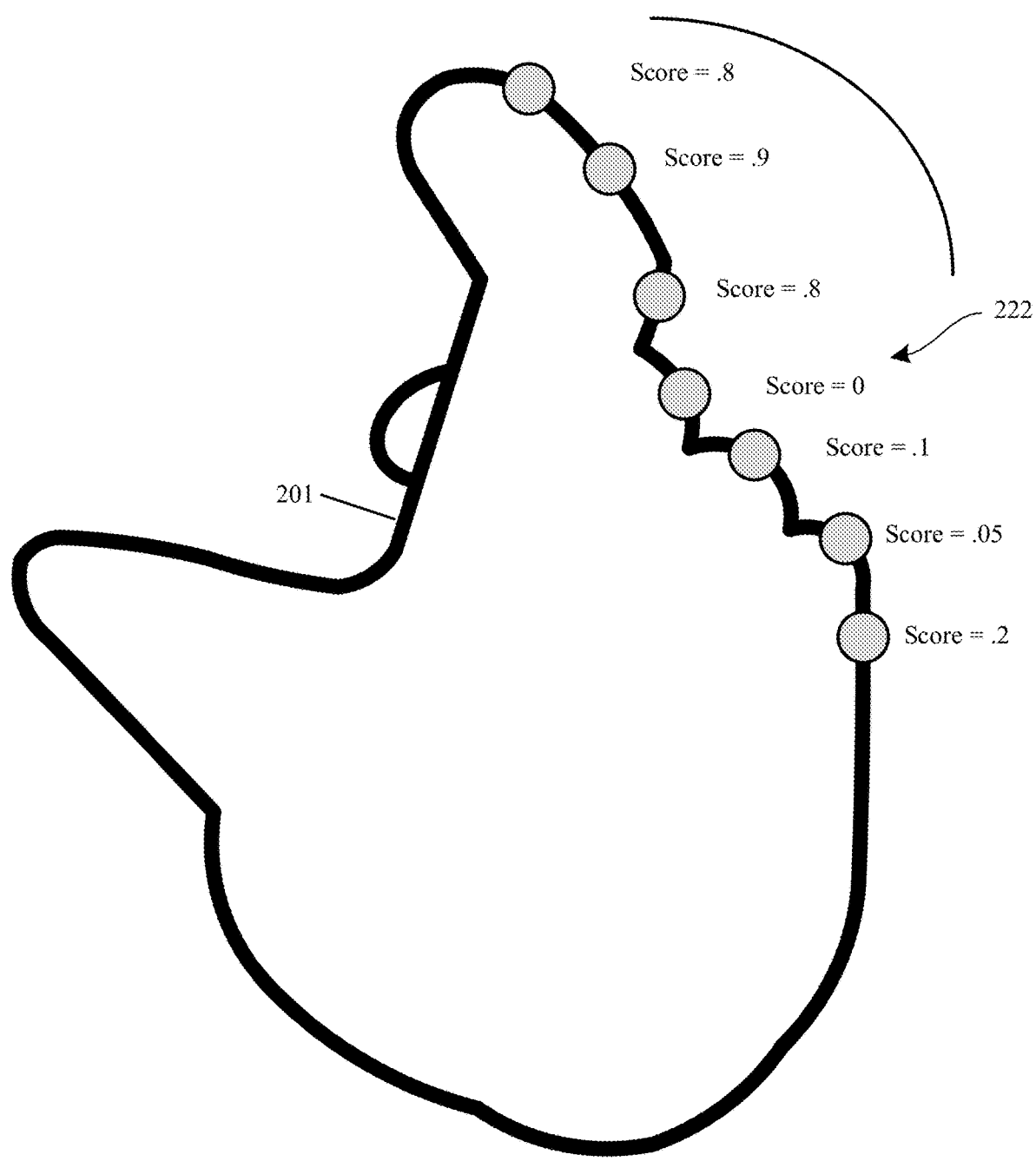
Figure 2J:
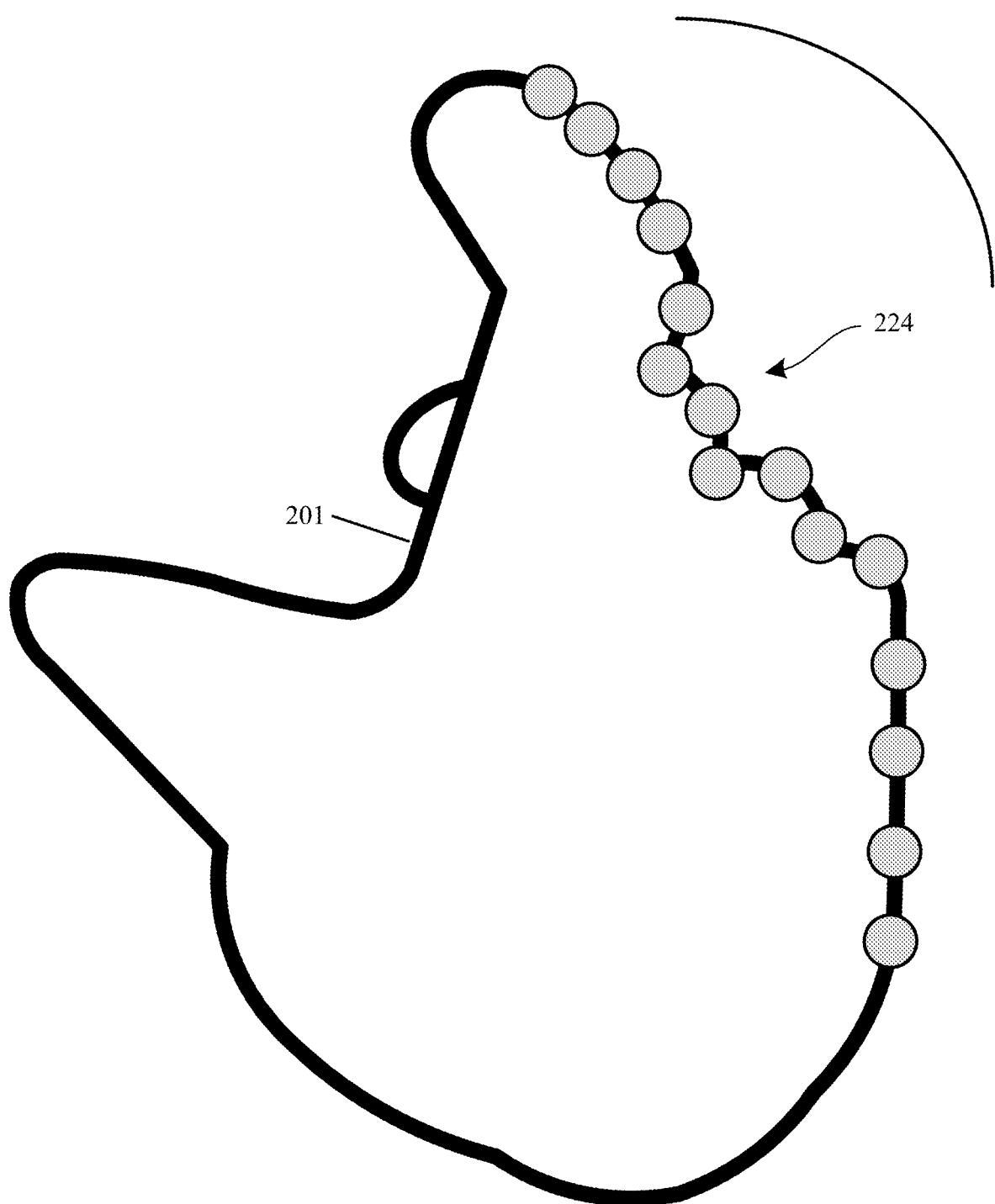

In a block 103, the predictive information is refined to determine an improved predictive information based at least in part on the discrepancy 207 (of block 25 of FIG. 2F). For example and with reference to flowchart 103 of FIG. 1E and FIGS. 2G-2J, which depicts refining predictive information using discrepancies and scores according to an embodiment, in a block 164, intervals 222 (i.e., portions of a surface being modeled) of higher scoring points can be determined from the scored points. In a block 165, intervals of higher scoring points are sampled more frequently (i.e., than intervals of lower scoring points). In a block 166, a plurality of higher scoring points clustered together (i.e., FIG. 2J: cluster 224) will be process the predictive information corresponding to that observed surface portion more frequently; thereby enabling refining the predictive information. In embodiments, reference scores can be determined relative to different reference parameters.

Figure 8:
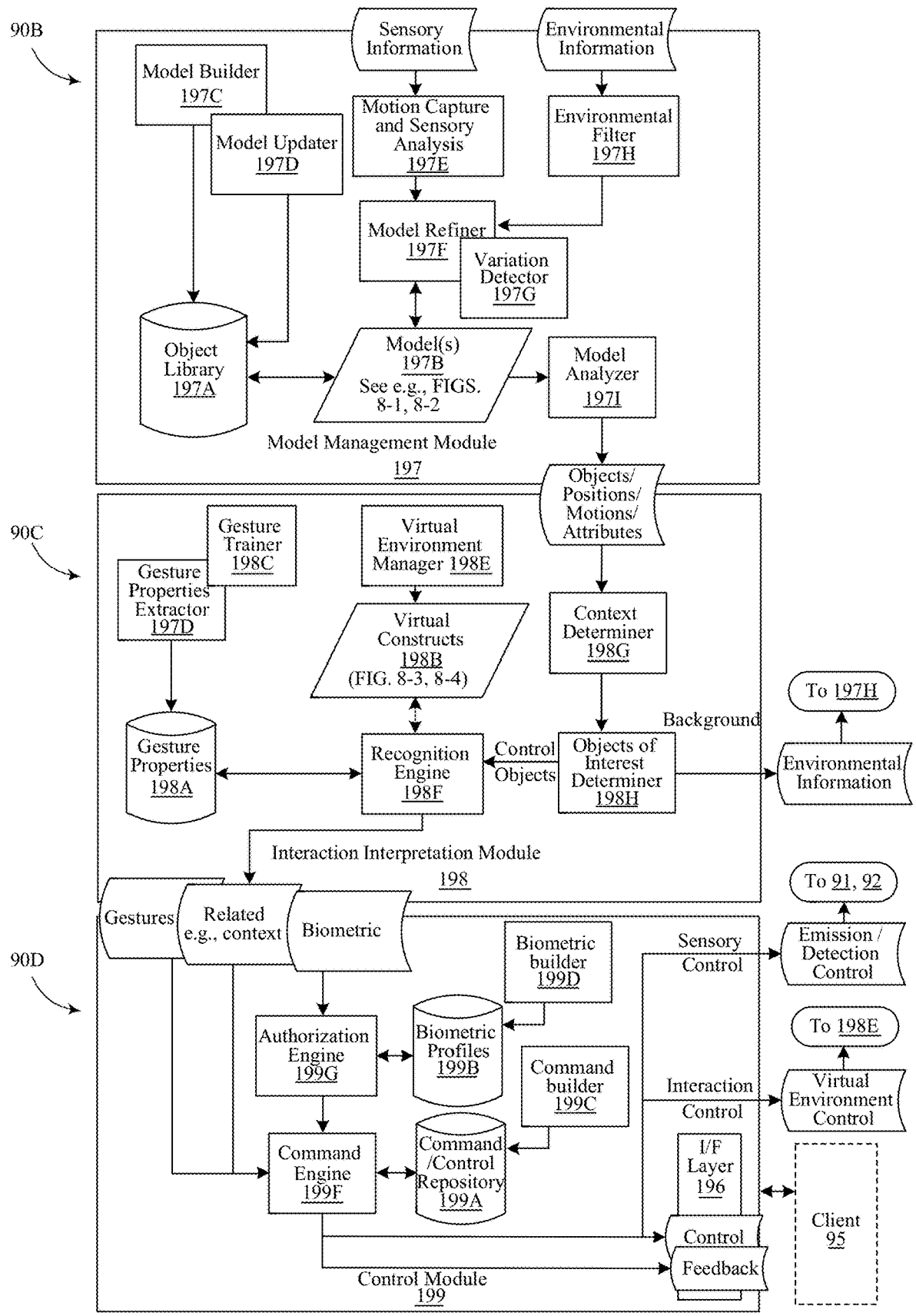
Figures 1, 8:
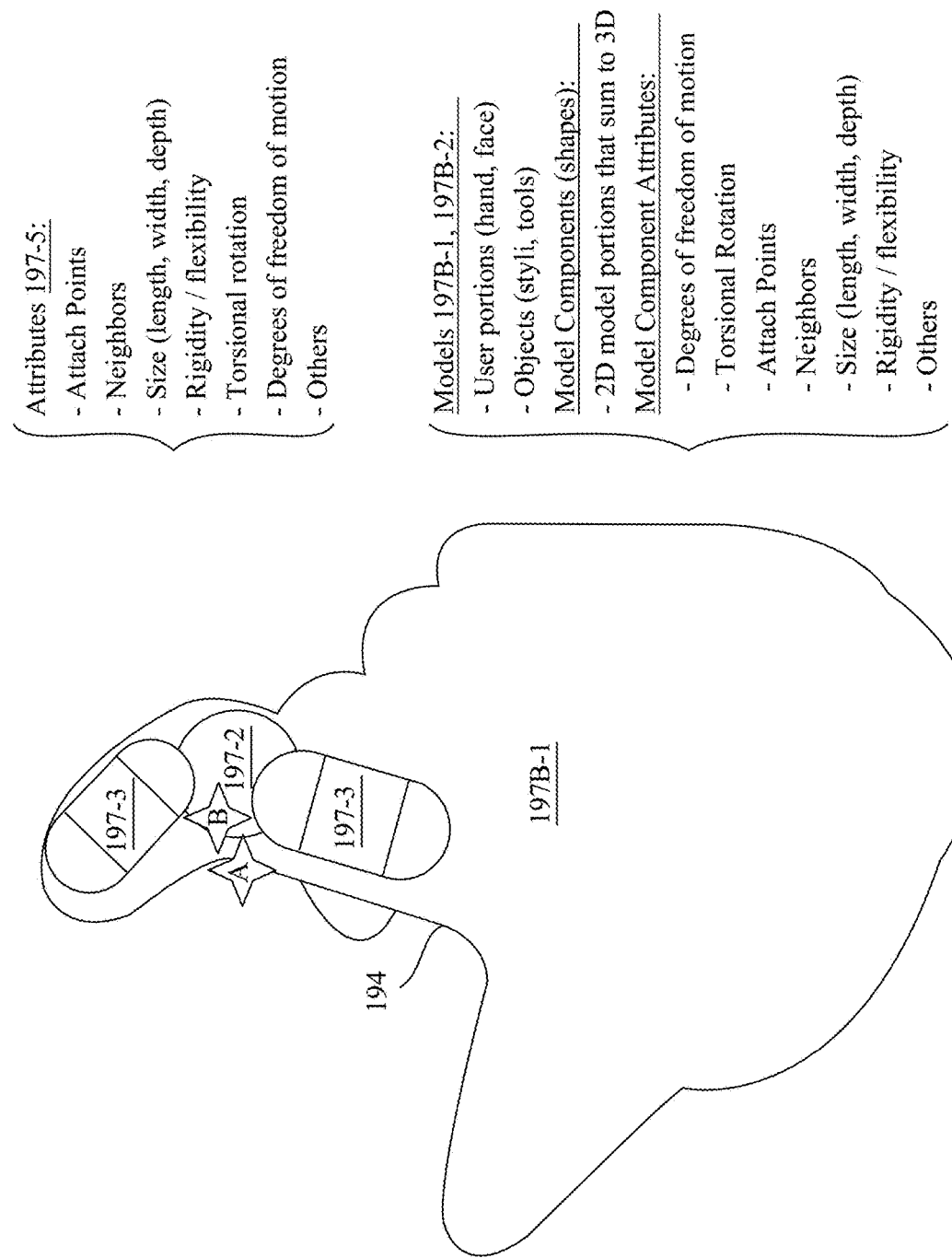
Figures 2, 8:
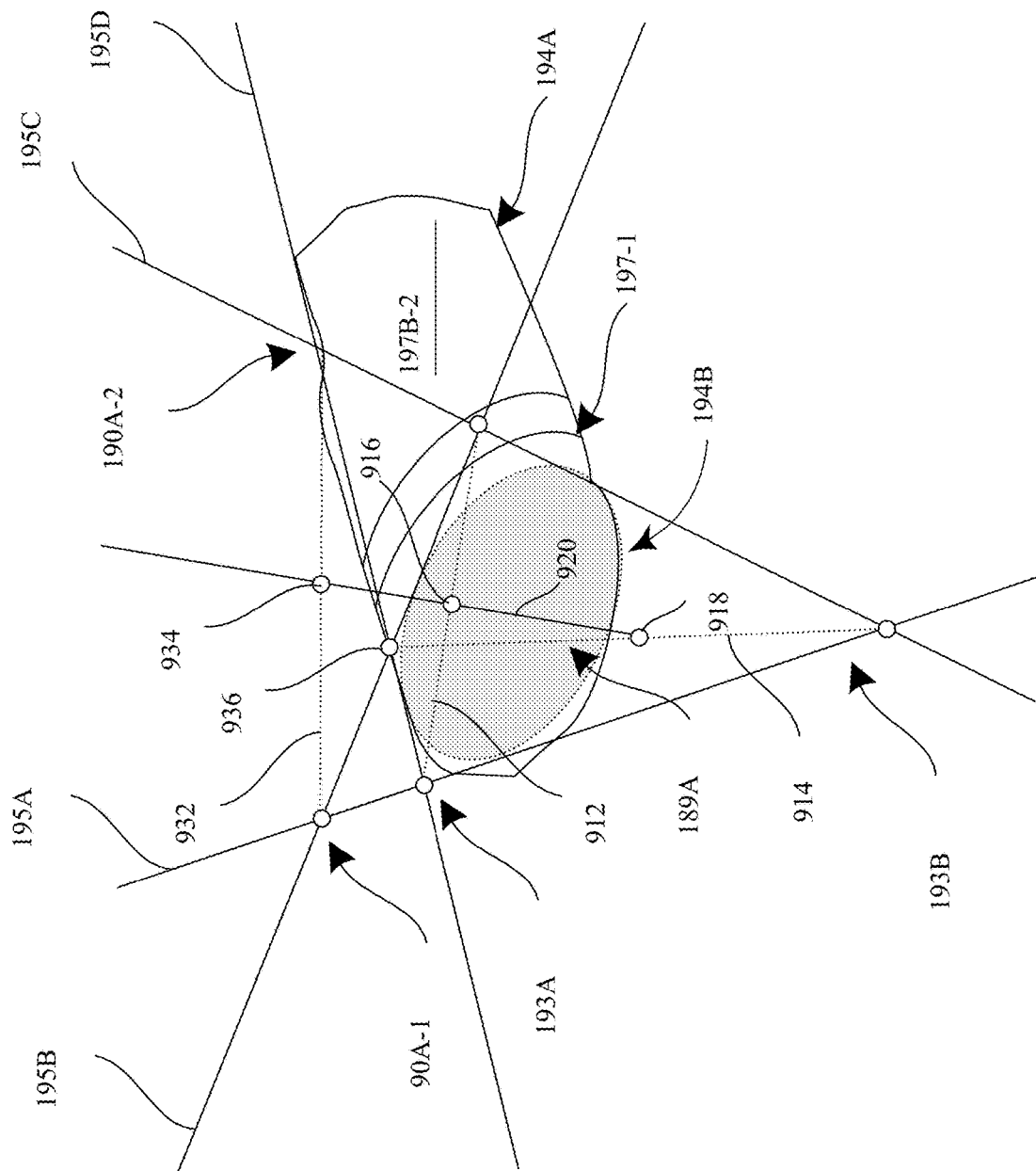
Figures 3, 8:
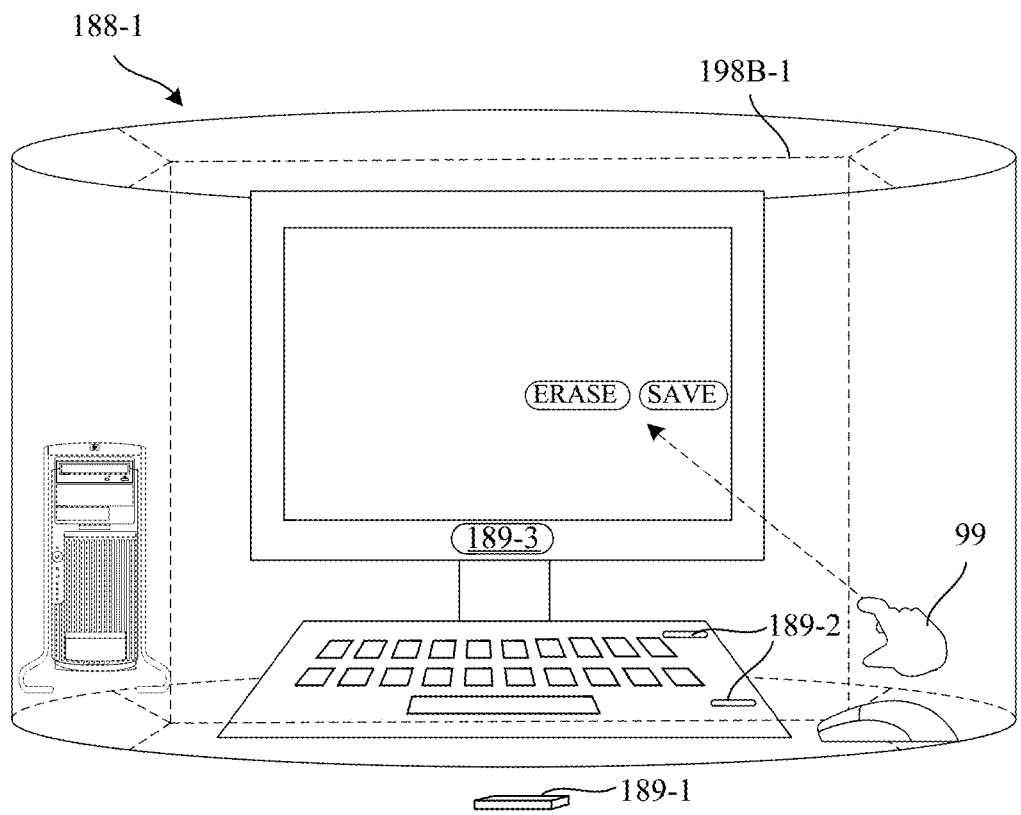
Figures 4, 8:
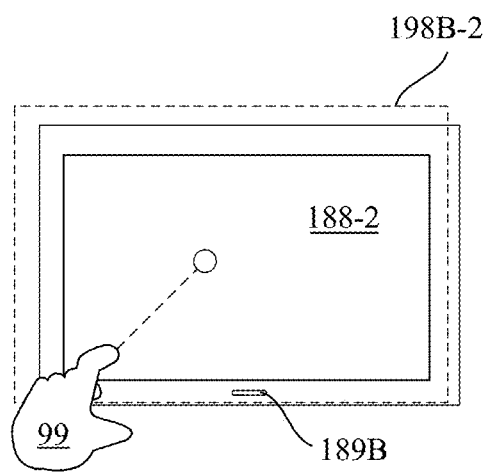

A gesture-recognition system recognizes gestures for purposes of providing input to the electronic device, but can also capture the position and shape of the user's hand 114 in consecutive video images in order to characterize a hand gesture in 3D space and reproduce it on the display screen of FIGS. 8-3, 8-4. A 3D model of the user's hand is determined from a solid hand model covering one or more capsule elements built from the images using techniques described below with reference to FIGS. 3A-3F.

Figure 3A:
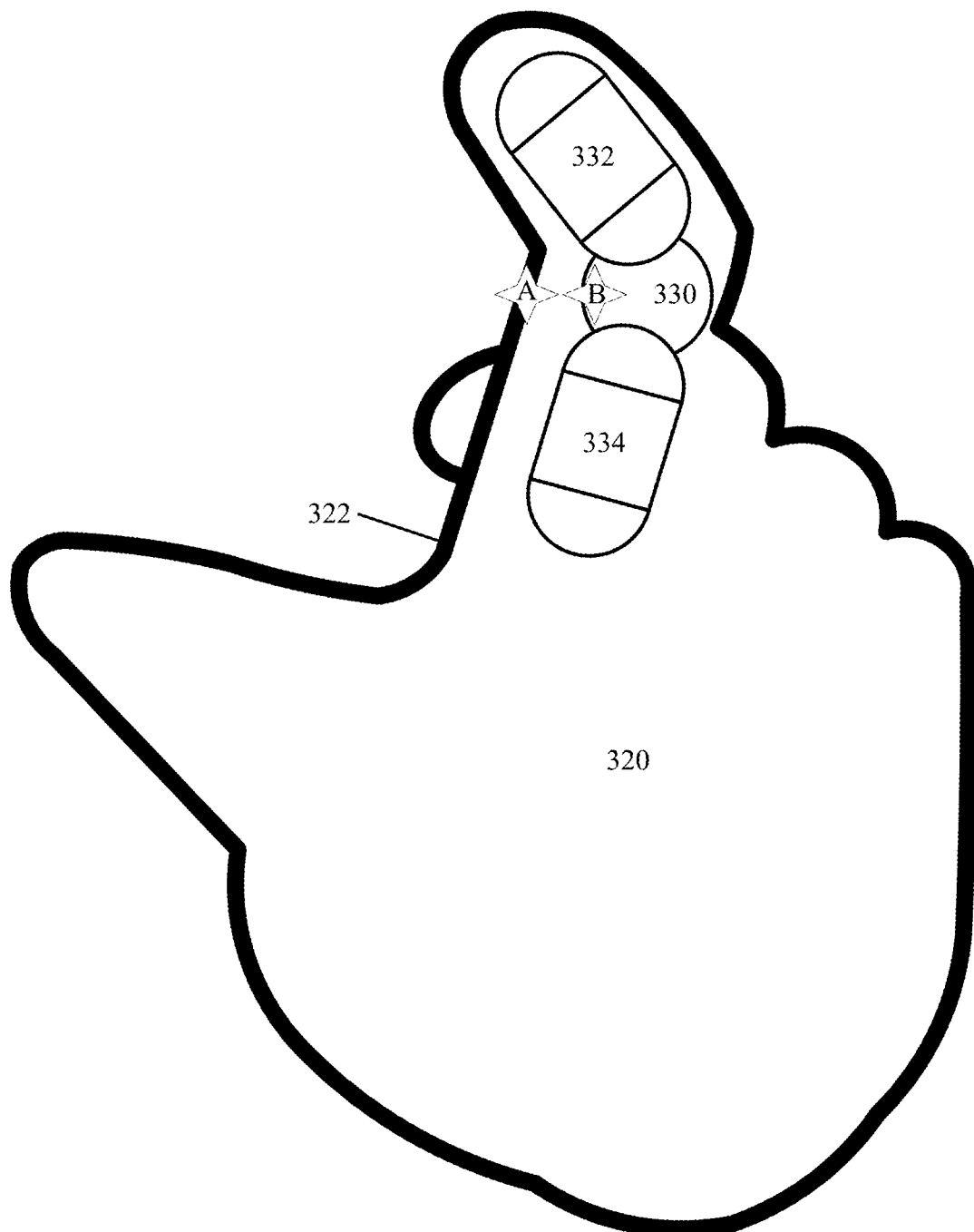
FIG. 3A shows one implementation of a 3D solid model hand with capsule representation of predictive information of a hand.
Figure 3B:
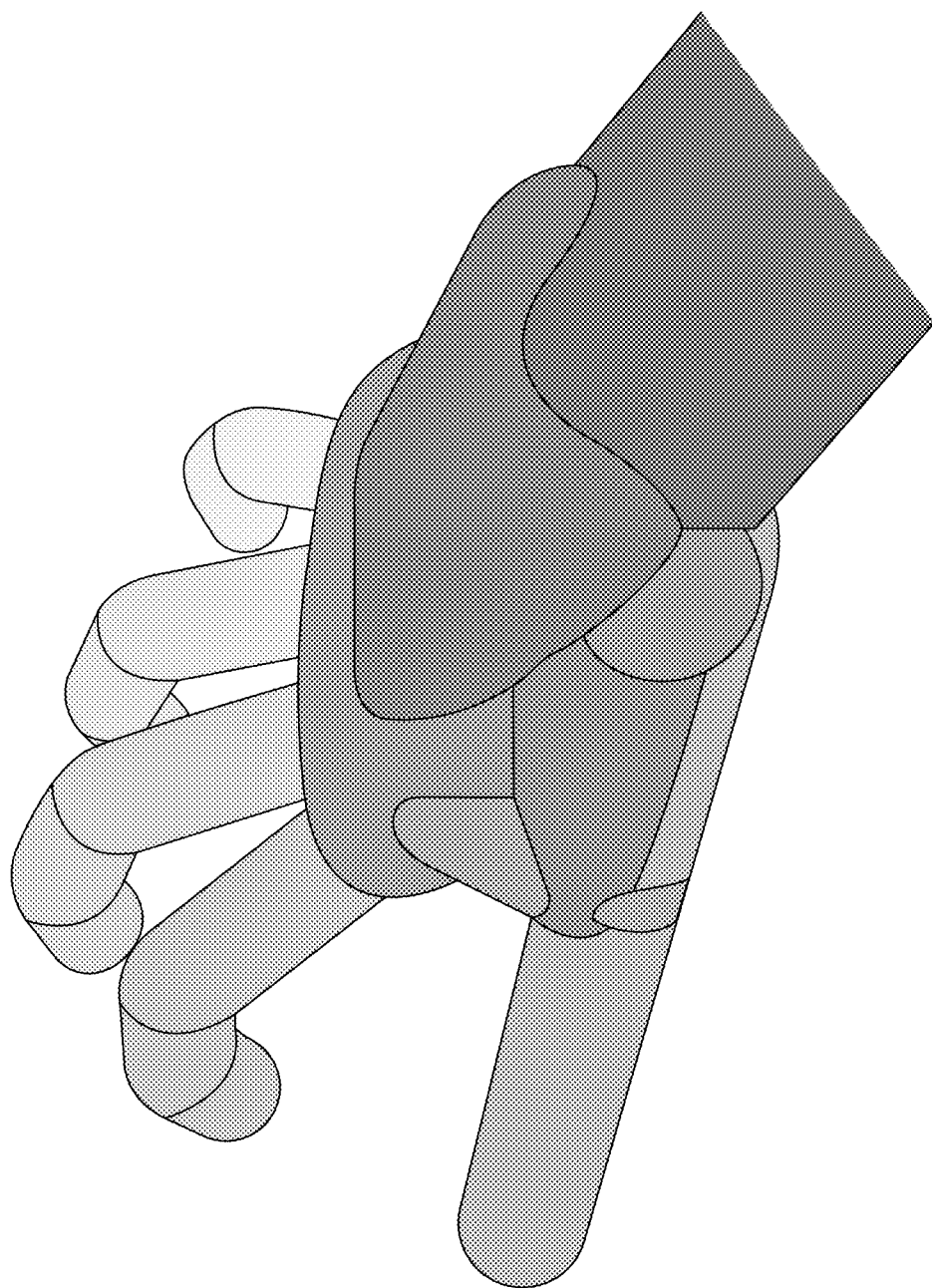
FIGS. 3B and 3C illustrate different views of a 3D capsule hand according to one implementation of the technology disclosed.
Figure 3C:
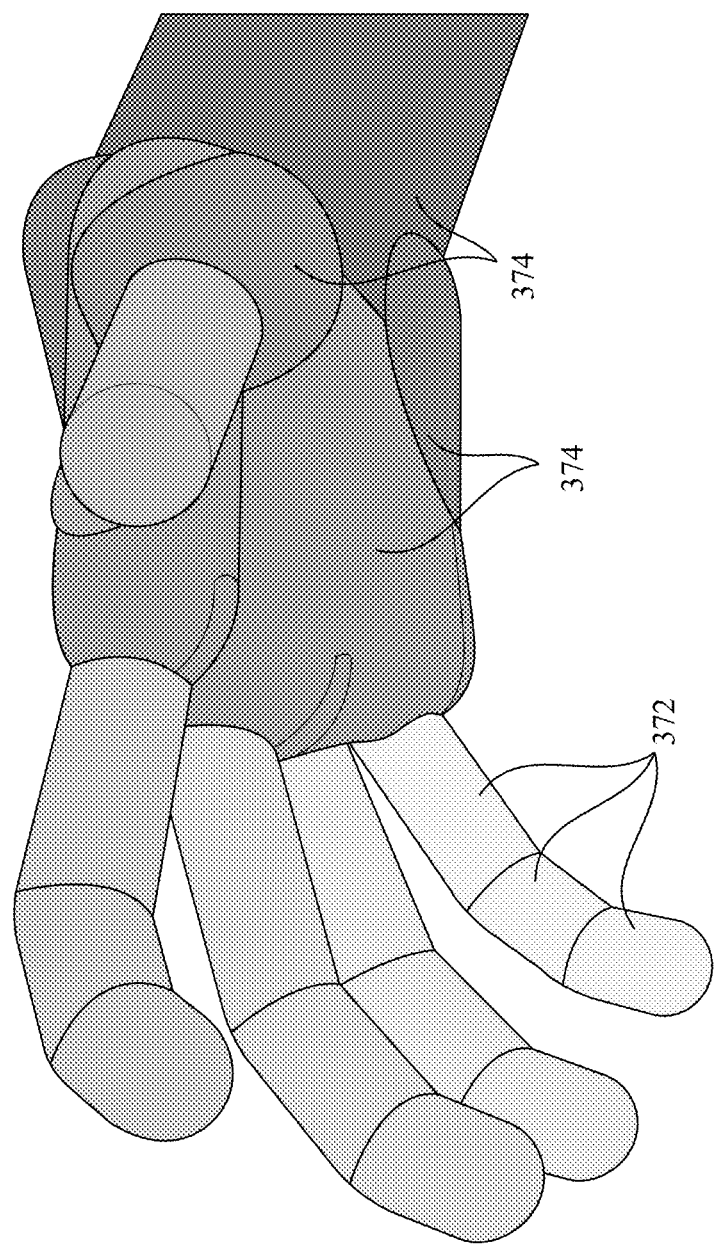
Figure 3D:
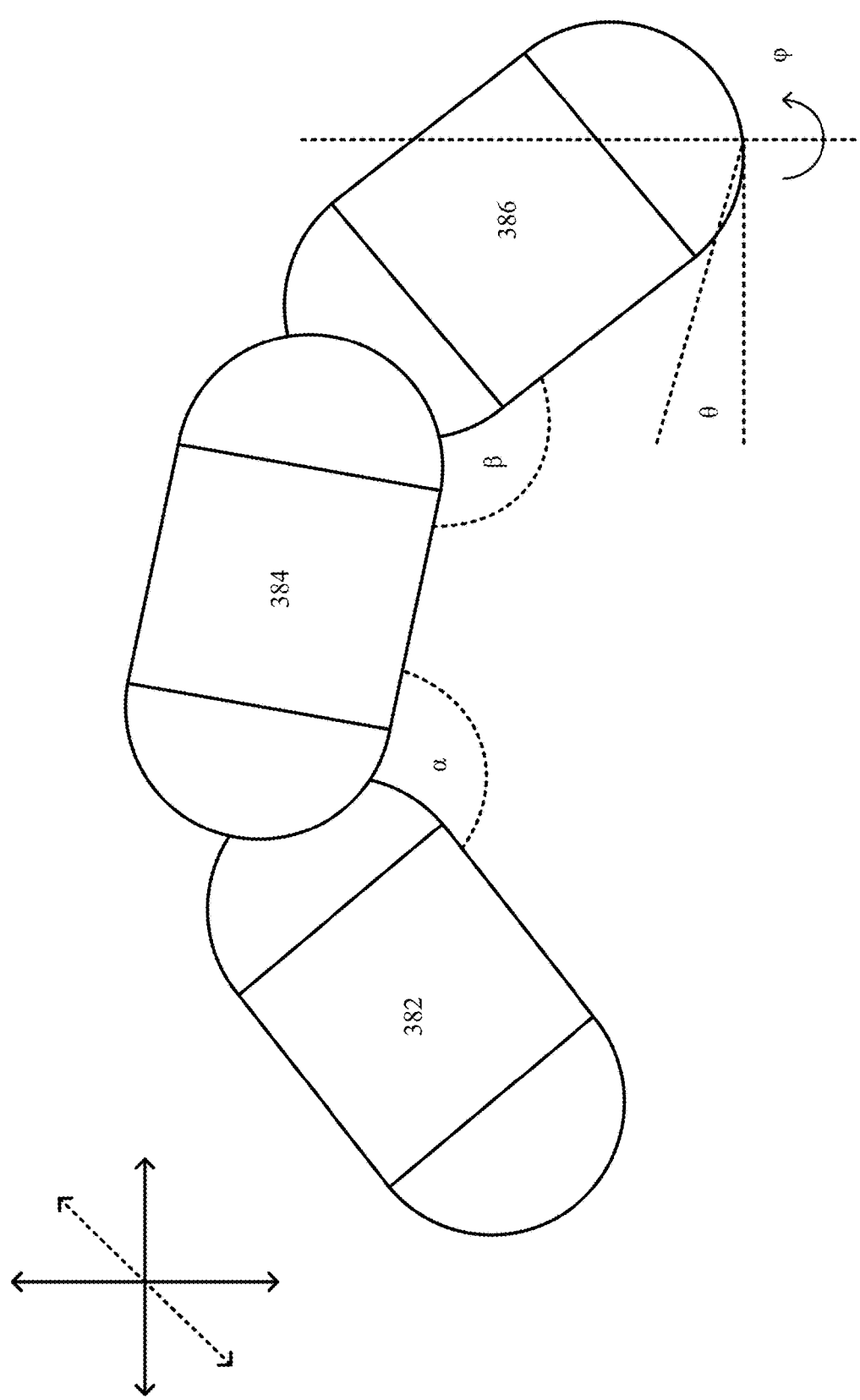
FIG. 3D depicts one implementation of generating a 3D finger capsuloid of a hand with different joint angles.
Figure 3E:
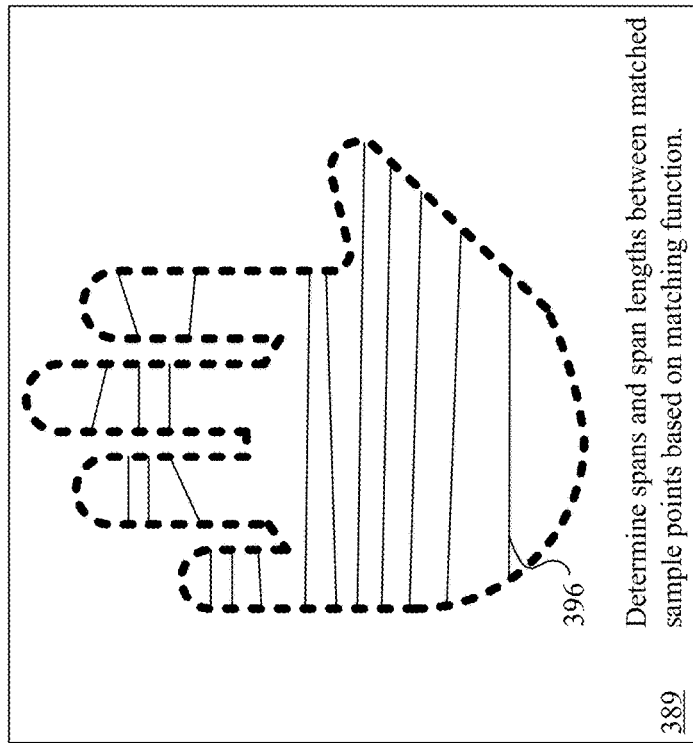
FIG. 3E is one implementation of determining spans and span lengths of a control object.
Figure 3E:
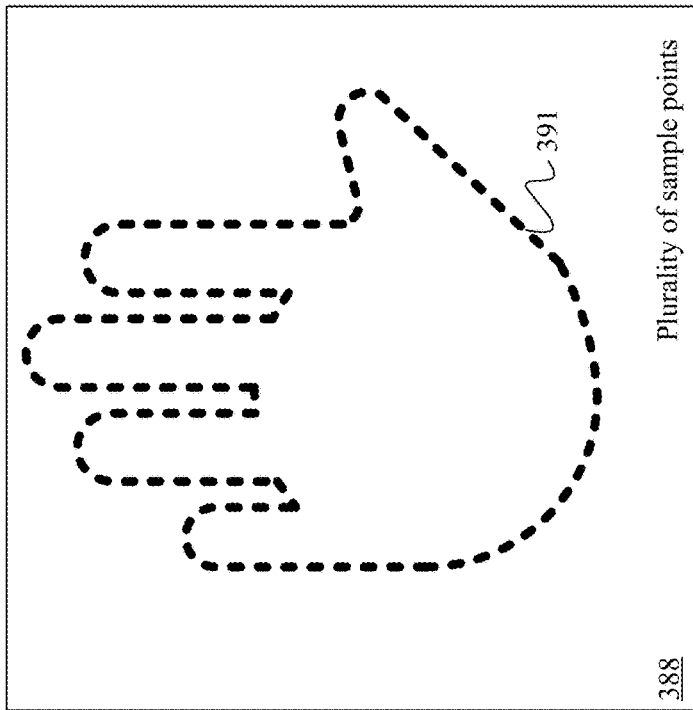
Figure 3F:
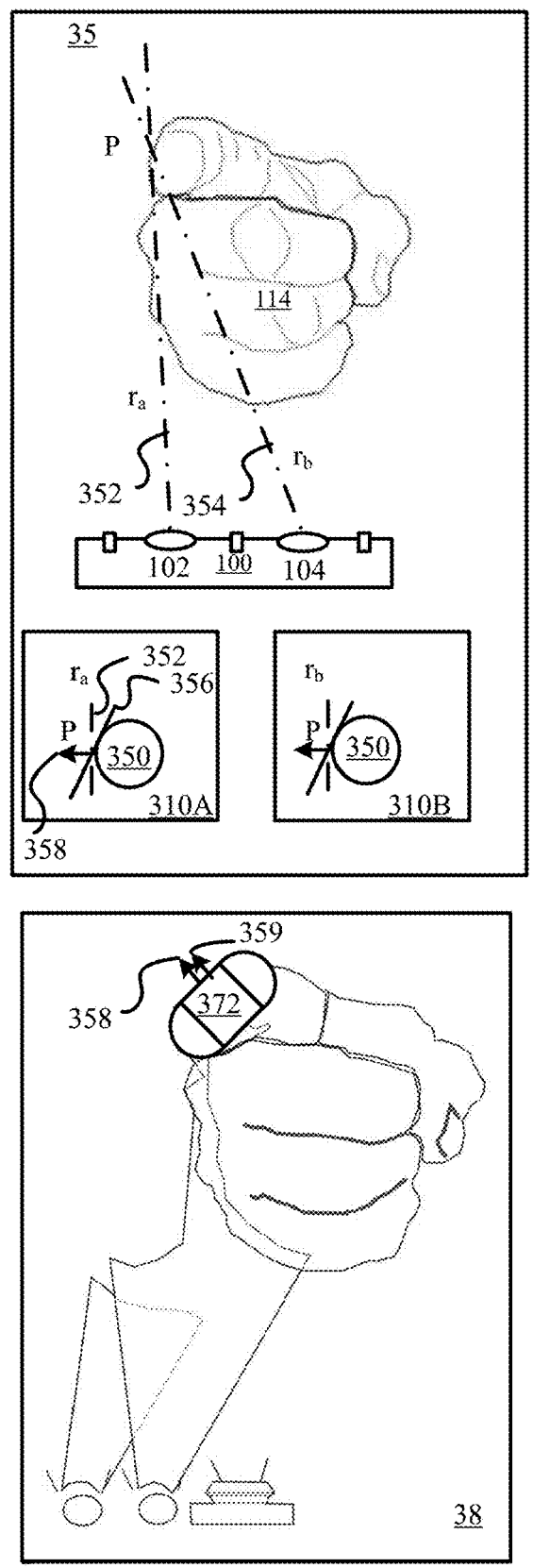
FIG. 3F illustrates one implementation of finding points in an image of an object being modeled.

FIG. 3A shows one implementation of a 3D solid hand model 300A with capsule representation of predictive information of the hand 114 of FIG. 3F. Some examples of predictive information of the hand include finger segment length, distance between finger tips, joint angles between fingers, and finger segment orientation. As illustrated by FIG. 3A, the prediction information 320 can be constructed from one or more model subcomponents referred to as capsules 330, 332, and 334, which are selected and/or configured to represent at least a portion of a surface of the hand 114 and virtual surface portion 322. In some implementations, the model subcomponents can be selected from a set of radial solids, which can reflect at least a portion of the hand 114 in terms of one or more of structure, motion characteristics, conformational characteristics, other types of characteristics of hand 114, and/or combinations thereof. In one implementation, radial solids are objects made up of a 1D or 2D primitive (e.g., line, curve, plane) and a surface having a constant radial distance to the 1D or 2D primitive. A closest point to the radial solid can be computed relatively quickly. As used herein, capsules are also referred to as "capsuloids", three or greater capsules are referred to as a "capsoodle."

In an implementation, observation information including observation of the control object can be compared against the model at one or more of periodically, randomly or substantially continuously (i.e., in real time). A "control object" as used herein with reference to an implementation is generally any three-dimensionally movable object or appendage with an associated position and/or orientation (e.g., the orientation of its longest axis) suitable for pointing at a certain location and/or in a certain direction. Control objects include, e.g., hands, fingers, feet, or other anatomical parts, as well as inanimate objects such as pens, styluses, handheld controls, portions thereof, and/or combinations thereof. Where a specific type of control object, such as the user's finger, is used hereinafter for ease of illustration, it is to be understood that, unless otherwise indicated or clear from context, any other type of control object can be used as well.

Observational information can include without limitation observed values of attributes of the control object corresponding to the attributes of one or more model subcomponents in the predictive information for the control object. In an implementation, comparison of the model with the observation information provides an error indication. In an implementation, an error indication can be computed by determining a closest distance determined between a first point A belonging to a set of points defining the virtual surface 322 and a second point B belonging to a model subcomponent 330 determined to be corresponding to the first point (e.g., nearest to the first point for example). In an implementation, the error indication can be applied to the predictive information to correct the model to more closely conform to the observation information. In an implementation, error indication can be applied to the predictive information repeatedly until the error indication falls below a threshold, a measure of conformance with the observation information rises above a threshold, or a fixed or variable number of times, or a fixed or variable number of times per time period, or combinations thereof.

In one implementation and with reference to FIGS. 3B and 3C, a collection of radial solids and/or capsuloids can be considered a "capsule hand." In particular, FIGS. 3B and 3C illustrate different views 300B and 300C of a 3D capsule hand. A number of capsuloids 372, e.g. five (5), are used to represent fingers on a hand while a number of radial solids 374 are used to represent the shapes of the palm and wrist. With reference to FIG. 3D, a finger capsuloid 300D with radial solids 382, 384, and 386 can be represented by its two (2) joint angles ($\alpha$, $\beta$), pitch ($\theta$), and yaw ($\varphi$). In an implementation, the angle $\beta$ can be represented as a function of joint angle $\alpha$, pitch $\theta$, and yaw $\varphi$. Allowing angle $\beta$ to be represented this way can allow for faster representation of the finger capsuloid with fewer variables; see, e.g., U.S. Ser. Nos. 61/871,790, filed 28 Aug. 2013 and 61/873,758, filed 4 Sep. 2013. For example, one capsule hand can include five (5) capsules for each finger, a radial polygon defining a base of the hand, and a plurality of definitional capsules that define fleshy portions of the hand. In some implementations, the capsule hand 300B is created using stereo matching, depth maps, or by finding contours and/or feature points reduced to certain finite number of degrees of freedom as shown in FIG. 3F, so as to enable simplification of problems of inverse kinematics (IK), sampling sizes, pose determination, etc.

FIG. 3E depicts determination of spans and span lengths 300E in the observation information about the hand 114 in which one or more point pairings are selected from a surface portion as represented in the observation information. As illustrated by block 388 of FIG. 3E, an observed surface portion 391 (i.e., of observation information) can include a plurality of sample points from which one or more point pairings can be selected. In a block 390 of FIG. 3E, a point pairing between point A and point B of observed surface portion 391 are selected by application of a matching function. One method for determining a point pairing using a matching function is illustrated by FIG. 3E, in which a first unmatched (arbitrary) point A on a contour (of block 390 of FIG. 3E) representing a surface portion of interest in the observation information is selected as a starting point 392. A normal $A_1$ 393 (of block 390 of FIG. 3E) is determined for the point A. A wide variety of techniques for determining a normal can be used in implementations, but in one example implementation, a set of points proximate to the first unmatched point, at least two of which are not co-linear, is determined. Then, a normal for the first unmatched point can be determined using the other points in the set by determining a normal perpendicular to the plane. For example, given points $P_1$, $P_2$, $P_3$, the normal n is given by the cross product:

$$n=(p_2-p_1)\times(p_3-p_1),$$

Another technique that can be used: (i) start with the set of points; (ii) form a first vector from $P_2-P_1$, (iii) apply rotation matrix to rotate the first vector 90 degrees away from the center of mass of the set of points. (The center of mass of the set of points can be determined by an average of the points). A yet further technique that can be used includes: (i) determine a first vector tangent to a point on a contour in a first image; (ii) determine from the point on the contour a second vector from that point to a virtual camera object in space; (iii) determine a cross product of the first vector and the second vector. The cross product is a normal vector to the contour.

Again with reference to FIG. 3E, the closest second unmatched point B 394 (of block 390 of FIG. 3E) reachable by a convex curve (line 396) having the most opposite normal $B_1$ 395 is found. Accordingly, points A and B form a point pairing. In FIG. 3E, a span length is determined for at least one of the one or more point pairings selected. Now with reference to block 389 of FIG. 3E, one or more spans and span lengths are determined for the one or more point pairings. In a representative implementation, a span can be found by determining a shortest convex curve for the point pairings A and B. It is determined whether the convex curve passes through any other points of the model. If so, then another convex curve is determined for paired points A and B. Otherwise, the span comprises the shortest continuous segment found through paired points A and B that only intersects the model surface at paired points A and B. In an implementation, the span can comprise a convex geodesic segment that only intersects the model at two points. A span can be determined from any two points using the equation of a line fitted to the paired points A and B for example.

FIG. 3F illustrates an implementation 300F of finding points in an image of an object being modeled. Now with reference to block 35 of FIG. 3F, cameras 102, 104 are operated to collect a sequence of images (e.g., 310A, 310B) of the object 114. The images are time correlated such that an image from camera 102 can be paired with an image from camera 104 that was captured at the same time (or within a few milliseconds). These images are then analyzed by object detection module 228 that detects the presence of one or more objects 350 in the image, and object analysis module 238 analyzes detected objects to determine their positions and shape in 3D space. If the received images 310A, 310B include a fixed number of rows of pixels (e.g., 1080 rows), each row can be analyzed, or a subset of the rows can be used for faster processing. Where a subset of the rows is used, image data from adjacent rows can be averaged together, e.g., in groups of two or three.

Again with reference to block 35 in FIG. 3F, one or more rays 352 can be drawn from the camera(s) proximate to an object 114 for some points P, depending upon the number of vantage points that are available. One or more rays 352 can be determined for some point P on a surface of the object 350 in image 310A. A tangent 356 to the object surface at the point P can be determined from point P and neighboring points. A normal vector 358 to the object surface 350 at the point P is determined from the ray and the tangent by cross product or other analogous technique. In block 38, a model portion (e.g., capsule 372) can be aligned to object surface 350 at the point P based upon the normal vector 358 and a normal vector 359 of the model portion 372. Optionally, as shown in block 35, a second ray 354 is determined to the point P from a second image 310B captured by a second camera. In some instances, fewer or additional rays or constraints from neighboring capsule placements can create additional complexity or provide further information. Additional information from placing neighboring capsules can be used as constraints to assist in determining a solution for placing the capsule. For example, using one or more parameters from a capsule fit to a portion of the object adjacent to the capsule being placed, e.g., angles of orientation, the system can determine a placement, orientation and shape/size information for the capsule. Object portions with too little information to analyze can be discarded or combined with adjacent object portions.

Figure 4A:
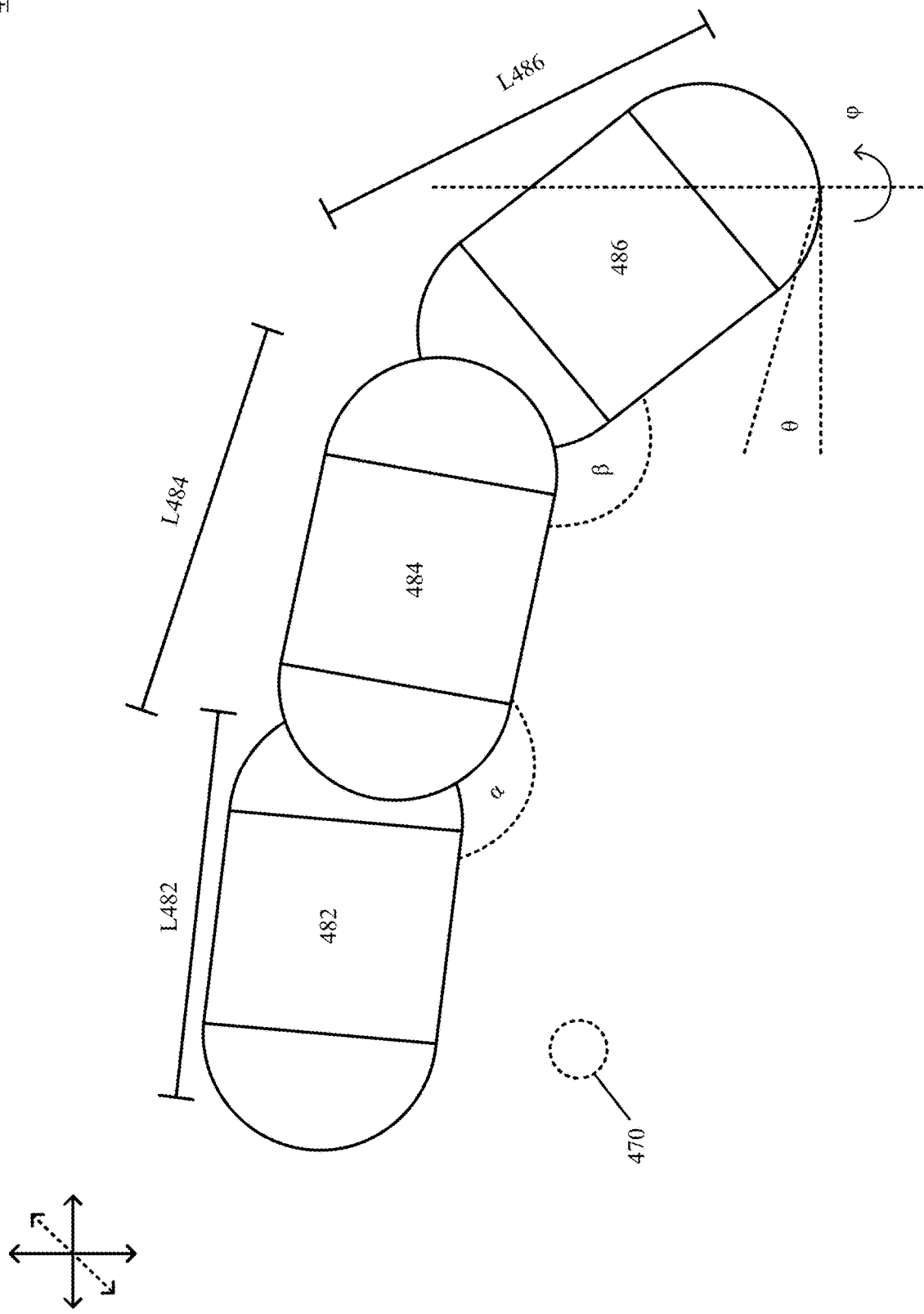
FIGS. 4A-4B are one implementation of determination and reconstruction of fingertip position of a hand.
Figure 4B:
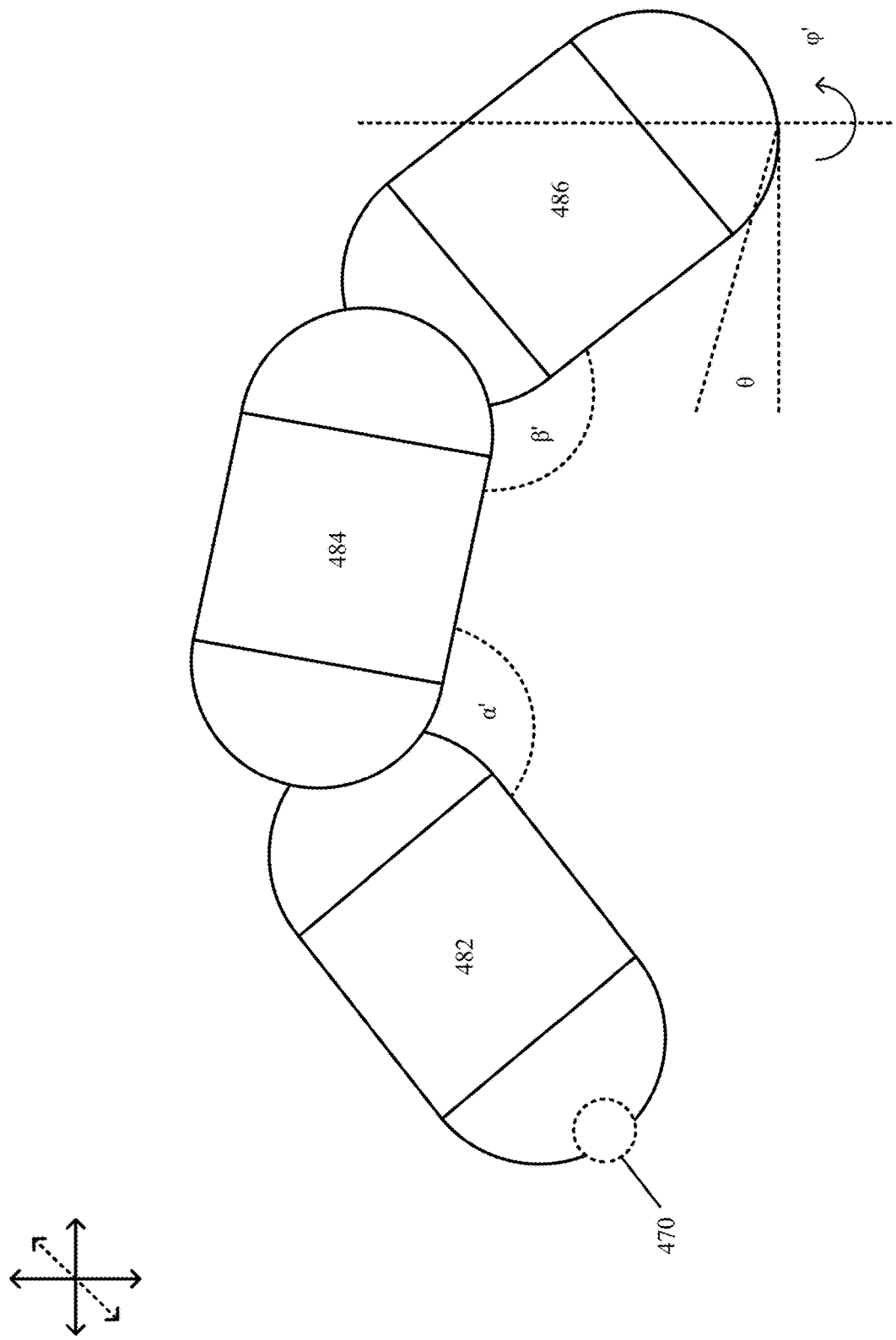

In one implementation, as illustrated by FIGS. 4A-4B, a fingertip position 400A, 400B can be determined from an image and can be reconstructed in 3D space. In FIG. 4A, a point 470 is an observed fingertip. Model 482, 484, and 486 are aligned such that the tip of 482 is coincident with the location in space of point 470 determined from the observation information. In one technique, angle $\alpha$ and angle $\beta$ are allowed to be set equal, which enables a closed form solution for $\theta$ and $\varphi$ as well as angle $\alpha$ and angle $\beta$.

$$s^2=2ac(-2a^2-2c^2+b^2-2a-2b-2c+4ac)+-2b^2(a^2+c^2)$$

$$\alpha=\beta=\tan 2^{-1}s-(a+c)b$$

$$\varphi=x_1/\text{norm}(x)$$

$$\theta=x_2/\text{norm}(x)$$

Wherein norm(x) can be described as the norm of a 3D point x (470 in FIG. 4B) with a, b and c being capsule lengths L482, L484, L486 in FIG. 4A.

Figure 5:
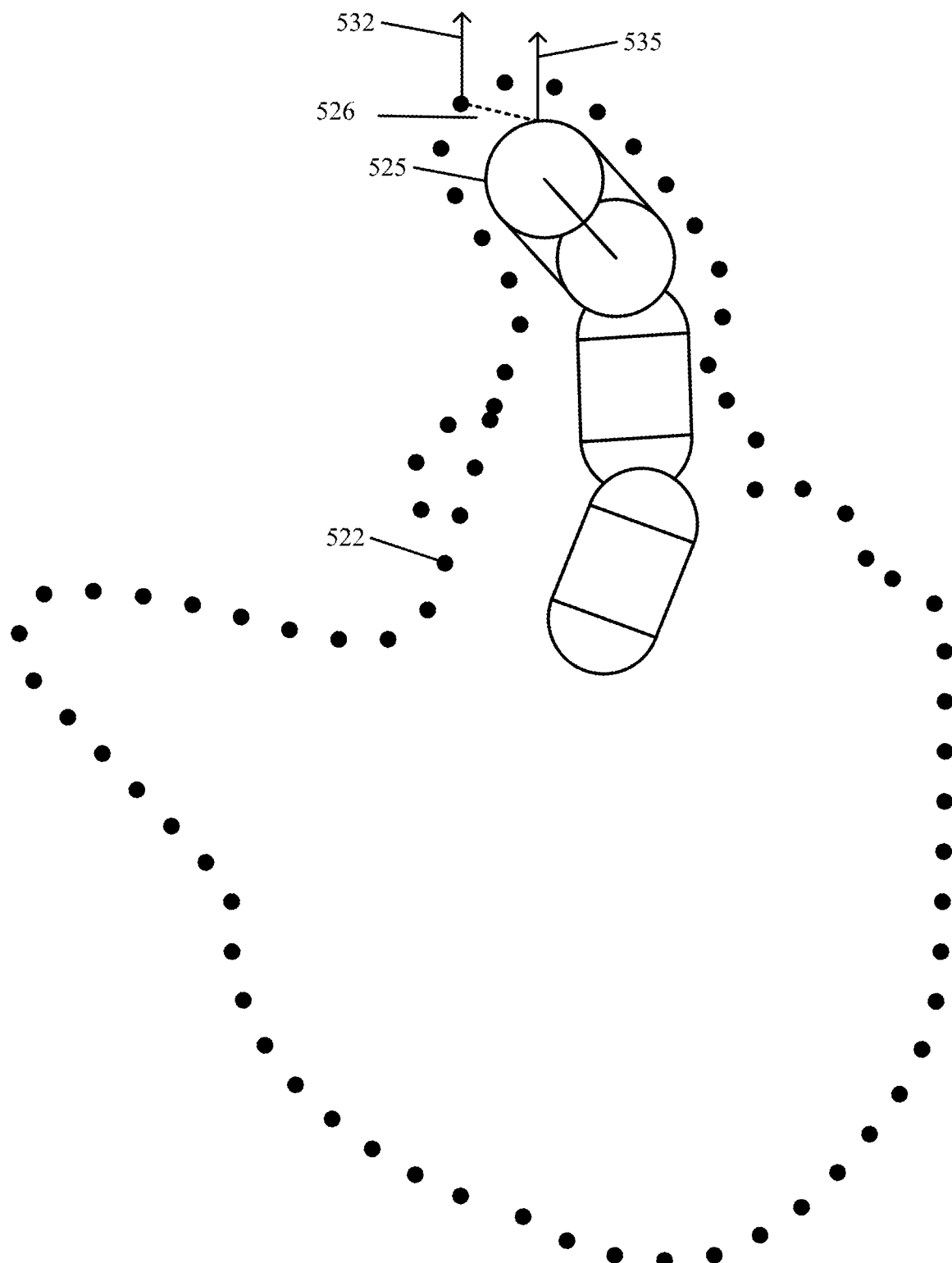
FIG. 5 shows one implementation of improving capsule representation of predictive information.

FIG. 5 illustrates one implementation of improving 500 capsule representation of predictive information. In one implementation, observation information 522 including observation of the control object (such as hand 114) can be compared against the 3D solid hand model at least one of periodically, randomly or substantially continuously (i.e., in real-time). Observational information 522 can include without limitation observed values of attributes of the control object corresponding to the attributes of one or more model subcomponents in the predictive information for the control object. In another implementation, comparison of the model 525 with the observation information 522 provides an error indication 526. In an implementation, an error indication 526 can be computed by first associating a set A of 3D points with a corresponding normal direction 532 to a set B of 3D points with a corresponding normal direction 535 on the subcomponents surface. The association can be done in a manner that assures that each paired point in set A and B has the same associated normal. An error can then be computed by summing the distances between each point in set A and B. This error is here on referred to the association error; see, e.g., U.S. Ser. No. 61/873,758, filed Sep. 4, 2013.

Predictive information of the 3D hand model can be aligned to the observation information using any of a variety of techniques. Aligning techniques bring model portions (e.g., capsules, capsuloids, capsoodles) into alignment with the information from the image source (e.g., edge samples, edge rays, interior points, 3D depth maps, and so forth). In one implementation, the model is rigidly aligned to the observation information using iterative closest point (ICP) technique. The model can be non-rigidly aligned to the observation information by sampling techniques.

One ICP implementation includes finding an optimal rotation R and translation T from one set of points A to another set of points B. First each point from A is matched to a point in set B. A mean square error is computed by adding the error of each match:

$$MSE=\text{sqrt}(\Sigma(R^*x_i+T-y_i)^{t*}(R^*x_i+T-y_i))$$

An optimal R and T can be computed and applied to the set of points A or B, in some implementations.

In order to enable the ICP to match points to points on the model, a capsule matching technique can be employed. One implementation of the capsule matcher includes a class that "grabs" the set of data and computes the closest point on each tracked hand (using information like the normal). Then the minimum of those closest points is associated to the corresponding hand and saved in a structure called "Hand Data." Other points that don't meet a minimal distance threshold can be marked as unmatched.

In an implementation, motion(s) of the control object can be rigid transformation, in which case, points on the virtual surface(s) remain at the same distance(s) from one another through the motion. Motion(s) can be non-rigid transformations, in which points on the virtual surface(s) can vary in distance(s) from one another during the motion. In an implementation, observation information can be used to adjust (and/or recomputed) predictive information thereby enabling "tracking" the control object. In implementations, control object can be tracked by determining whether a rigid transformation or a non-rigid transformation occurs. In an implementation, when a rigid transformation occurs, a transformation matrix is applied to each point of the model uniformly. Otherwise, when a non-rigid transformation occurs, an error indication can be determined, and an error minimization technique such as described herein above can be applied.

In some implementations, rigid transformations and/or non-rigid transformations can be composed. One example composition implementation includes applying a rigid transformation to predictive information. Then an error indication can be determined, and an error minimization technique such as described herein above can be applied. In an implementation, determining a transformation can include determining a rotation matrix that provides a reduced RMSD (root mean squared deviation) between two paired sets of points. One implementation can include using Kabsch Algorithm to produce a rotation matrix. The Kabsch algorithm can be used to find an optimal rotation R and translation T that minimizes the error:

$$RMS=\text{sqrt}(/(R^*x_i+T-y_i)t^*(R^*x_i+T-y_i))w_i$$

The transformation (both R and T) are applied rigidly to the model, according to one implementation. The capsule matching and rigid alignment can be repeated until convergence. In one implementation, the Kabsch can be extended to ray or co-variances by the following minimizing:

$$\Sigma(R^*x_i+T-y_i)^{t*}M_i^*(R^*x_i+T-y_i)$$

In the equation above, $M_i$ is a positive definite symmetric matrix. In other implementations and by way of example, one or more force lines can be determined from one or more portions of a virtual surface.

One implementation applies non-rigidly alignment to the observed by sampling the parameters of each finger. A finger is represented by a 3D vector where the entry of each vector is Pitch, Yaw and Bend of the finger. The Pitch and Yaw can be defined trivially. The bend is the angle between the first and second Capsule and the second and third Capsule which are set to be equal. The mean of the samples weighted by the RMS is taken to be the new finger parameter. After Rigid Alignment all data that has not been assigned to a hand, can be used to initialize a new object (hand or tool).

In an implementation, predictive information can include collision information concerning two or more capsoloids. By means of illustration, several possible fits of predicted information to observation information can be removed from consideration based upon a determination that these potential solutions would result in collisions of capsoloids.

In an implementation, a relationship between neighboring capsoloids, each having one or more attributes (e.g., determined minima and/or maxima of intersection angles between capsoloids) can be determined. In an implementation, determining a relationship between a first capsoloid having a first set of attributes and a second capsoloid having a second set of attributes includes detecting and resolving conflicts between first attribute and second attributes. For example, a conflict can include a capsoloid having one type of angle value with a neighbor having a second type of angle value incompatible with the first type of angle value. Attempts to attach a capsoloid with a neighboring capsoloid having attributes such that the combination will exceed what is allowed in the observation information—or to pair incompatible angles, lengths, shapes, or other such attributes—can be removed from the predicted information without further consideration.

In an implementation, predictive information can be artificially constrained to capsoloids positioned in a subset of the observation information—thereby enabling creation of a "lean model". For example, as illustrated in FIG. 3A, capsoloid 332 could be used to denote the portion of the surface 322 without addition of capsoloids 330 and 334. In a yet further implementation, connections can be made using artificial constructs to link together capsoloids of a lean model. In another implementation, the predictive information can be constrained to a subset of topological information about the observation information representing the control object to form a lean model.

In an implementation, a lean model can be associated with a full predictive model. The lean model (or topological information, or properties described above) can be extracted from the predictive model to form a constraint. Then, the constraint can be imposed on the predictive information thereby enabling the predictive information to be constrained in one or more of behavior, shape, total (system) energy, structure, orientation, compression, shear, torsion, other properties, and/or combinations thereof.

In an implementation, the observation information can include components reflecting portions of the control object which are occluded from view of the device ("occlusions" or "occluded components"). In one implementation, the predictive information can be "fit" to the observation information as described herein above with the additional constraint(s) that some total property of the predictive information (e.g., potential energy) be minimized or maximized (or driven to lower or higher value(s) through iteration or solution). Properties can be derived from nature, properties of the control object being viewed, others, and/or combinations thereof. In another implementation, a deformation of the predictive information can be allowed subject to an overall permitted value of compression, deformation, flexibility, others, and/or combinations thereof.

In one implementation, raw image information and fast lookup table can be used to find a look up region that gives constant time of computation of the closest point on the contour given a position. Fingertip positions are used to compute point(s) on the contour which can be then determined whether the finger is extended or non-extended, according to some implementations. A signed distance function can be used to determine whether points lie outside or inside a hand region, in another implementation. An implementation includes checking to see if points are inside or outside the hand region.

In another implementation, a variety of information types can be abstracted from the 3D solid model of a hand. For example, velocities of a portion of a hand (e.g., velocity of one or more fingers, and a relative motion of a portion of the hand), state (e.g., position, an orientation, and a location of a portion of the hand), pose (e.g., whether one or more fingers are extended or non-extended, one or more angles of bend for one or more fingers, a direction to which one or more fingers point, a configuration indicating a pinch, a grab, an outside pinch, and a pointing finger), and whether a tool or object is present in the hand can be abstracted in various implementations.

In one implementation, the predictive information including the 3D solid model is filtered by applying various constraints based on known (or inferred) physical properties of the system. For example, some solutions would place the object outside the field of view of the cameras, and such solutions can readily be rejected. As another example, in some implementations, the type of object being modeled is known (e.g., it can be known that the object is or is expected to be a human hand). Techniques for determining object type are described below; for now, it is noted that where the object type is known, properties of that object can be used to rule out instances of the 3D solid model where the geometry is inconsistent with objects of that type. For example, human hands have a certain range of sizes and expected eccentricities, and such ranges can be used to filter the solutions in a particular slice. These constraints can be represented in any suitable format, e.g., the 3D solid model, an ordered list of parameters based on such a model, etc. As another example, if it is assumed that the object being modeled is a particular type of object (e.g., a hand), a parameter value can be assumed based on typical dimensions for objects of that type (e.g., an average cross-sectional dimension of a palm or finger). An arbitrary assumption can also be used, and any assumption can be improved or refined through iterative analysis.

In some implementations, known topological information of a control object can also be used to filter (or further filter) the 3D solid model. For example, if the object is known to be a hand, constraints on the spatial relationship between various parts of the hand (e.g., fingers have a limited range of motion relative to each other and/or to the palm of the hand) as represented in a physical model or explicit set of constraint parameters can be used to constrain one iteration of the 3D solid model based on results from other iterations.

In some implementations, multiple 3D solid models can be constructed over time for a control object. It is likely that the "correct" solution (i.e., the 3D solid model that best corresponds to the actual position and/pose of the object) will interpolate well with other iterations, while any "spurious" solutions (i.e., models that do not correspond to the actual position and/or pose of the object) will not. Incorrect or least correct solutions can be discarded in other implementations.

Figure 7:
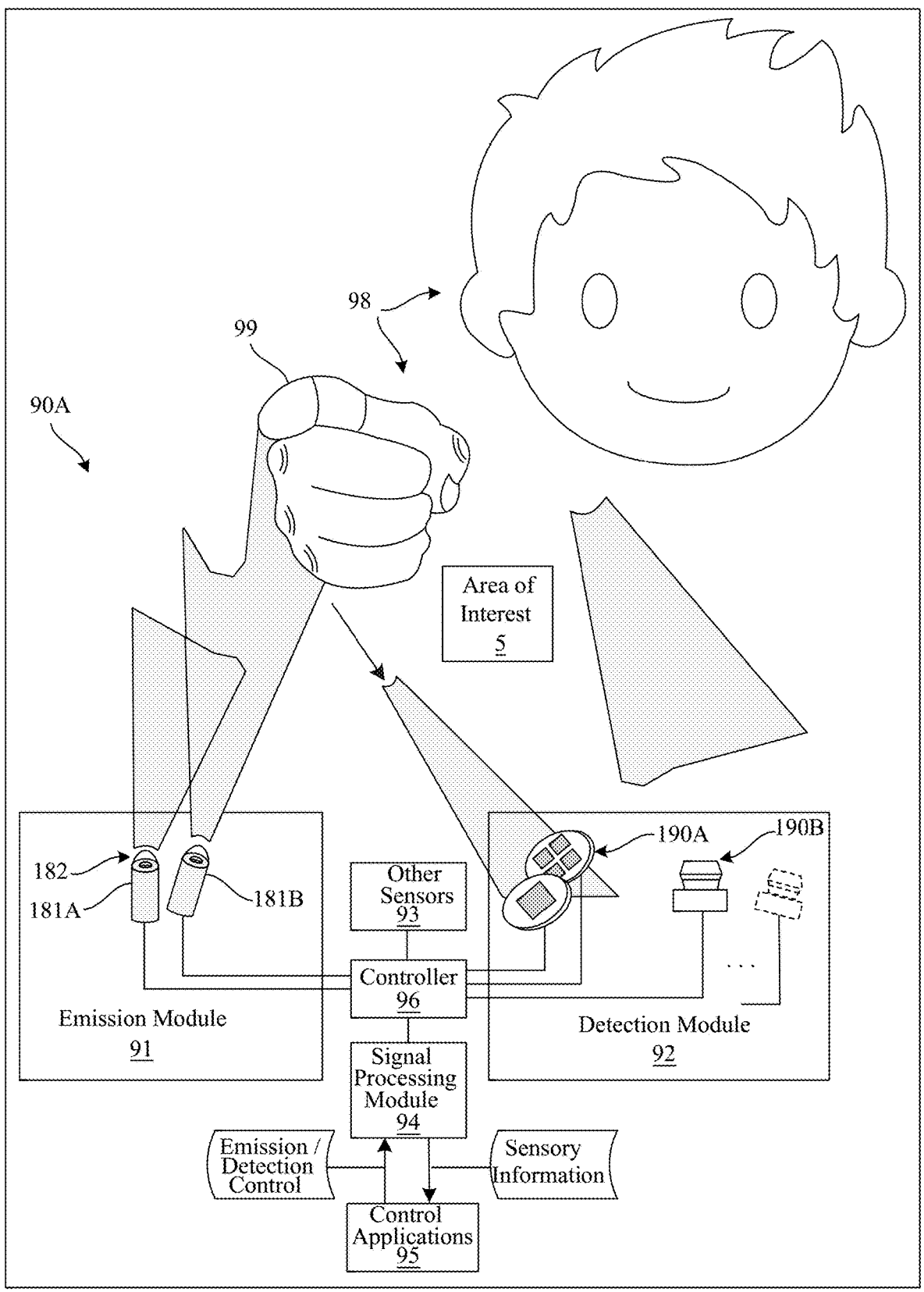
FIG. 7, FIG. 7-1, FIG. 7-2, FIG. 8, FIG. 8-1, FIG. 8-2, FIG. 8-3, and FIG. 8-4 illustrate an exemplary machine sensory and control system in embodiments. In particular.

FIGS. 7-8 illustrate an exemplary machine sensory and control system (MSCS) in embodiments.

In one embodiment, a motion sensing and controller system provides for detecting that some variation(s) in one or more portions of interest of a user has occurred, for determining that an interaction with one or more machines corresponds to the variation(s), for determining if the interaction should occur, and, if so, for affecting the interaction. The Machine Sensory and Control System (MSCS) typically includes a portion detection system, a variation determination system, an interaction system and an application control system.

As FIG. 7 shows, one detection system 90A embodiment includes an emission module 91, a detection module 92, a controller 96, a processing module 94 and a machine control module 95. In one embodiment, the emission module 91 includes one or more emitter(s) 180A, 180B (e.g., LEDs or other devices emitting light in the IR, visible, or other spectrum regions, or combinations thereof; radio and/or other electromagnetic signal emitting devices) that are controllable via emitter parameters (e.g., frequency, activation state, firing sequences and/or patterns, etc.) by the controller 96. However, other existing/emerging emission mechanisms and/or some combination thereof can also be utilized in accordance with the requirements of a particular implementation. The emitters 180A, 180B can be individual elements coupled with materials or devices 182 (and/or materials) (e.g., lenses 182A, multi-lenses 182B (of FIG. 8-1), image directing film (IDF) 182C (of FIG. 7-1), liquid lenses, combinations thereof, and/or others) with varying or variable optical properties to direct the emission, one or more arrays 180C of emissive elements (combined on a die or otherwise), with or without the addition of devices 182C for directing the emission, or combinations thereof, and positioned within an emission region 181 (of FIG. 7-1) according to one or more emitter parameters (i.e., either statically (e.g., fixed, parallel, orthogonal or forming other angles with a work surface, one another or a display or other presentation mechanism) or dynamically (e.g., pivot, rotate and/or translate) mounted, embedded (e.g., within a machine or machinery under control) or otherwise coupleable using an interface (e.g., wired or wireless)). In some embodiments, structured lighting techniques can provide improved surface feature capture capability by casting illumination according to a reference pattern onto the object 98. Image capture techniques described in further detail herein can be applied to capture and analyze differences in the reference pattern and the pattern as reflected by the object 98. In yet further embodiments, detection system 90A may omit emission module 91 altogether (e.g., in favor of ambient lighting).

In one embodiment, the detection module 92 includes one or more capture device(s) 190A, 190B (e.g., light (or other electromagnetic radiation sensitive devices) that are controllable via the controller 96. The capture device(s) 190A, 190B can comprise individual or multiple arrays of image capture elements 190A (e.g., pixel arrays, CMOS or CCD photo sensor arrays, or other imaging arrays) or individual or arrays of photosensitive elements 190B (e.g., photodiodes, photo sensors, single detector arrays, multi-detector arrays, or other configurations of photo sensitive elements) or combinations thereof. Arrays of image capture device(s) 190C (of FIG. 7-2) can be interleaved by row (or column or a pattern or otherwise addressable singly or in groups). However, other existing/emerging detection mechanisms and/or some combination thereof can also be utilized in accordance with the requirements of a particular implementation. Capture device(s) 190A, 190B each can include a particular vantage point 190-1 from which objects 98 within area of interest 5 are sensed and can be positioned within a detection region 191 (of FIG. 7-2) according to one or more detector parameters (i.e., either statically (e.g., fixed, parallel, orthogonal or forming other angles with a work surface, one another or a display or other presentation mechanism) or dynamically (e.g. pivot, rotate and/or translate), mounted, embedded (e.g., within a machine or machinery under control) or otherwise coupleable using an interface (e.g., wired or wireless)). Capture devices 190A, 190B can be coupled with devices 192A, 192B and 192C (and/or materials) (of FIG. 7-2) (e.g., lenses 192A (of FIG. 7-2), multi-lenses 192B (of FIG. 7-2), image directing film (IDF) 192C (of FIG. 7-2), liquid lenses, combinations thereof, and/or others) with varying or variable optical properties for directing the reflectance to the capture device for controlling or adjusting resolution, sensitivity and/or contrast. Capture devices 190A, 190B can be designed or adapted to operate in the IR, visible, or other spectrum regions, or combinations thereof; or alternatively operable in conjunction with radio and/or other electromagnetic signal emitting devices in various applications. In an embodiment, capture devices 190A, 190B can capture one or more images for sensing objects 98 and capturing information about the object (e.g., position, motion, etc.). In embodiments comprising more than one capture device, particular vantage points of capture devices 190A, 190B can be directed to area of interest 5 so that fields of view 190-2 of the capture devices at least partially overlap. Overlap in the fields of view 190-2 provides capability to employ stereoscopic vision techniques (see, e.g., FIG. 7-2), including those known in the art to obtain information from a plurality of images captured substantially contemporaneously.

While illustrated with reference to a particular embodiment in which control of emission module 91 and detection module 92 are co-located within a common controller 96, it should be understood that these functions will be separate in some embodiments, and/or incorporated into one or a plurality of elements comprising emission module 91 and/or detection module 92 in some embodiments. Controller 96 comprises control logic (hardware, software or combinations thereof) to conduct selective activation/de-activation of emitter(s) 180A, 180B (and/or control of active directing devices) in on-off, or other activation states or combinations thereof to produce emissions of varying intensities in accordance with a scan pattern which can be directed to scan an area of interest 5. Controller 96 can comprise control logic (hardware, software or combinations thereof) to conduct selection, activation and control of capture device(s) 190A, 190B (and/or control of active directing devices) to capture images or otherwise sense differences in reflectance or other illumination. Signal processing module 94 determines whether captured images and/or sensed differences in reflectance and/or other sensor-perceptible phenomena indicate a possible presence of one or more objects of interest 98, including control objects 99, the presence and/or variations thereof can be used to control machines and/or other applications 95.

In various embodiments, the variation of one or more portions of interest of a user can correspond to a variation of one or more attributes (position, motion, appearance, surface patterns) of a user hand 99, finger(s), points of interest on the hand 99, facial portion 98 other control objects (e.g., styli, tools) and so on (or some combination thereof) that is detectable by, or directed at, but otherwise occurs independently of the operation of the machine sensory and control system. Thus, for example, the system is configurable to 'observe' ordinary user locomotion (e.g., motion, translation, expression, flexing, deformation, and so on), locomotion directed at controlling one or more machines (e.g., gesturing, intentionally system-directed facial contortion, etc.), attributes thereof (e.g., rigidity, deformation, fingerprints, veins, pulse rates and/or other biometric parameters). In one embodiment, the system provides for detecting that some variation(s) in one or more portions of interest (e.g., fingers, fingertips, or other control surface portions) of a user has occurred, for determining that an interaction with one or more machines corresponds to the variation(s), for determining if the interaction should occur, and, if so, for at least one of initiating, conducting, continuing, discontinuing and/or modifying the interaction and/or a corresponding interaction.

For example and with reference to FIG. 8, a variation determination system 90B embodiment comprises a model management module 197 that provides functionality to build, modify, customize one or more models to recognize variations in objects, positions, motions and attribute state and/or change in attribute state (of one or more attributes) from sensory information obtained from detection system 90A. A motion capture and sensory analyzer 197E finds motions (i.e., translational, rotational), conformations, and presence of objects within sensory information provided by detection system 90A. The findings of motion capture and sensory analyzer 197E serve as input of sensed (e.g., observed) information from the environment with which model refiner 197F can update predictive information (e.g., models, model portions, model attributes, etc.).

A model management module 197 embodiment comprises a model refiner 197F to update one or more models 197B (or portions thereof) from sensory information (e.g., images, scans, other sensory-perceptible phenomenon) and environmental information (i.e., context, noise, etc.); enabling a model analyzer 197I to recognize object, position, motion and attribute information that might be useful in controlling a machine. Model refiner 197F employs an object library 197A to manage objects including one or more models 197B (i.e., of user portions (e.g., hand, face), other control objects (e.g., styli, tools)) or the like (see e.g., model 197B-1, 197B-2 of FIGS. 8-1, 8-2)), model components (i.e., shapes, 2D model portions that sum to 3D, outlines 194 and/or outline portions 194A, 194B (i.e., closed curves), attributes 197-5 (e.g., attach points, neighbors, sizes (e.g., length, width, depth), rigidity/flexibility, torsional rotation, degrees of freedom of motion and others) and so forth) (see e.g., 197B-1-197B-2 of FIGS. 8-1-8-2), useful to define and update models 197B, and model attributes 197-5. While illustrated with reference to a particular embodiment in which models, model components and attributes are co-located within a common object library 197A, it should be understood that these objects will be maintained separately in some embodiments.

Figures 1, 7:
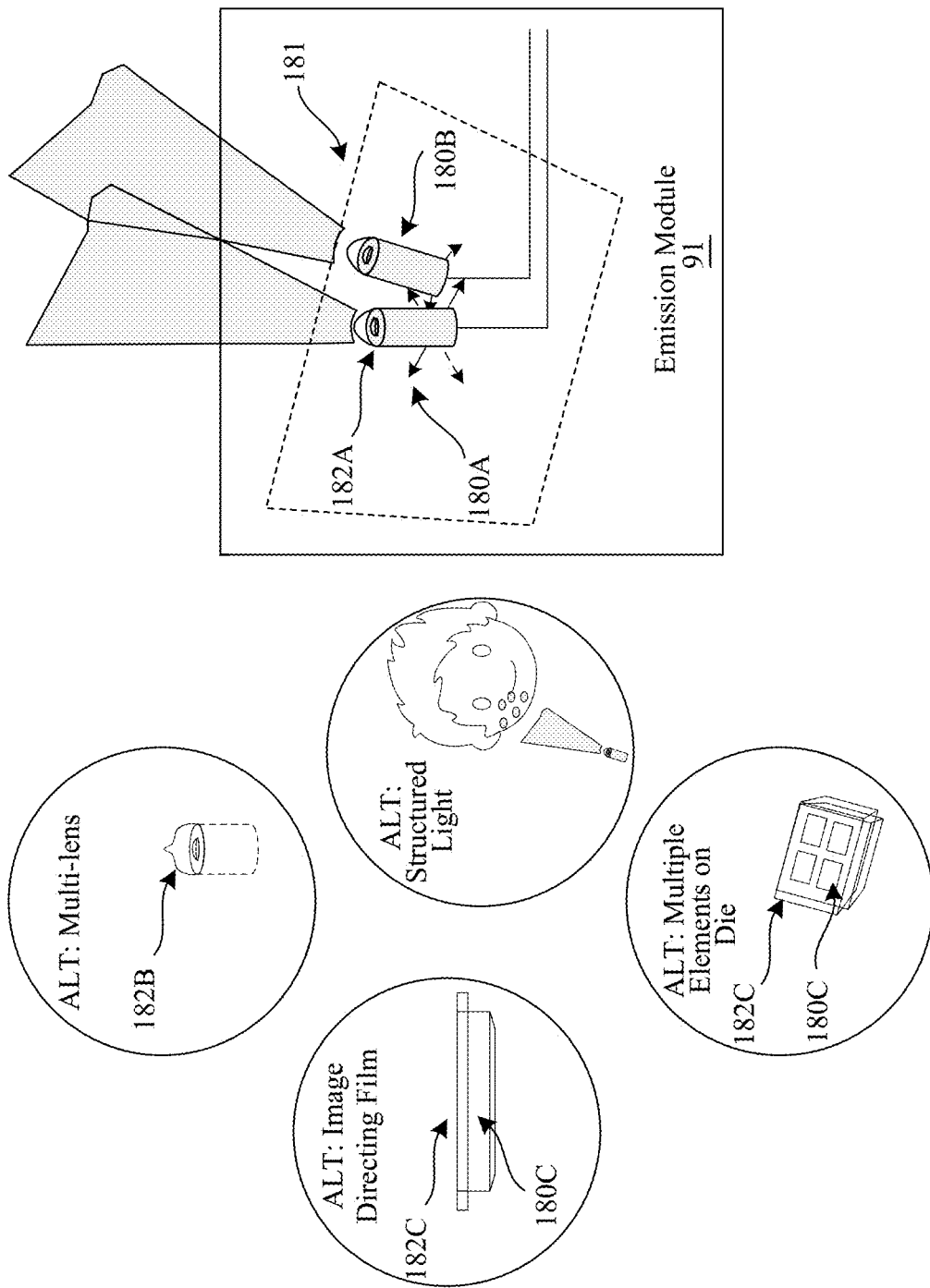

FIG. 8-1 illustrates prediction information including a model 197B-1 of a control object (e.g., FIG. 7: 99) constructed from one or more model subcomponents 197-2, 197-3 selected and/or configured to represent at least a portion of a surface of control object 99, a virtual surface portion 194 and one or more attributes 197-5. Other components can be included in prediction information 197B-1 not shown in FIG. 8-1 for clarity sake. In an embodiment, the model subcomponents 197-2, 197-3 can be selected from a set of radial solids, which can reflect at least a portion of a control object 99 in terms of one or more of structure, motion characteristics, conformational characteristics, other types of characteristics of control object 99, and/or combinations thereof. In one embodiment, radial solids include a contour and a surface defined by a set of points having a fixed distance from the closest corresponding point on the contour. Another radial solid embodiment includes a set of points normal to points on a contour and a fixed distance therefrom. In an embodiment, computational technique(s) for defining the radial solid include finding a closest point on the contour and the arbitrary point, then projecting outward the length of the radius of the solid. In an embodiment, such projection can be a vector normal to the contour at the closest point. An example radial solid (e.g., 197-3) includes a "capsuloid", i.e., a capsule shaped solid including a cylindrical body and semi-spherical ends. Another type of radial solid (e.g., 197-2) includes a sphere. Other types of radial solids can be identified based on the foregoing teachings.

One or more attributes 197-5 can define characteristics of a model subcomponent 197-3. Attributes can include e.g., attach points, neighbors, sizes (e.g., length, width, depth), rigidity, flexibility, torsion, zero or more degrees of freedom of motion with respect to one or more defined points, which can include endpoints for example, and other attributes defining a salient characteristic or property of a portion of control object 99 being modeled by predictive information 197B-1. In an embodiment, predictive information about the control object can include a model of the control object together with attributes defining the model and values of those attributes.

In an embodiment, observation information including observation of the control object can be compared against the model at one or more of periodically, randomly or substantially continuously (i.e., in real time). Observational information can include without limitation observed values of attributes of the control object corresponding to the attributes of one or more model subcomponents in the predictive information for the control object. In an embodiment, comparison of the model with the observation information provides an error indication. In an embodiment, an error indication can be computed by determining a closest distance determined between a first point A belonging to a set of points defining the virtual surface 194 and a second point B belonging to a model subcomponent 197-2 determined to be corresponding to the first point (e.g., nearest to the first point for example). In an embodiment, the error indication can be applied to the predictive information to correct the model to more closely conform to the observation information. In an embodiment, error indication can be applied to the predictive information repeatedly until the error indication falls below a threshold, a measure of conformance with the observation information rises above a threshold, or a fixed or variable number of times, or a fixed or variable number of times per time period, or combinations thereof.

Figures 2, 7:
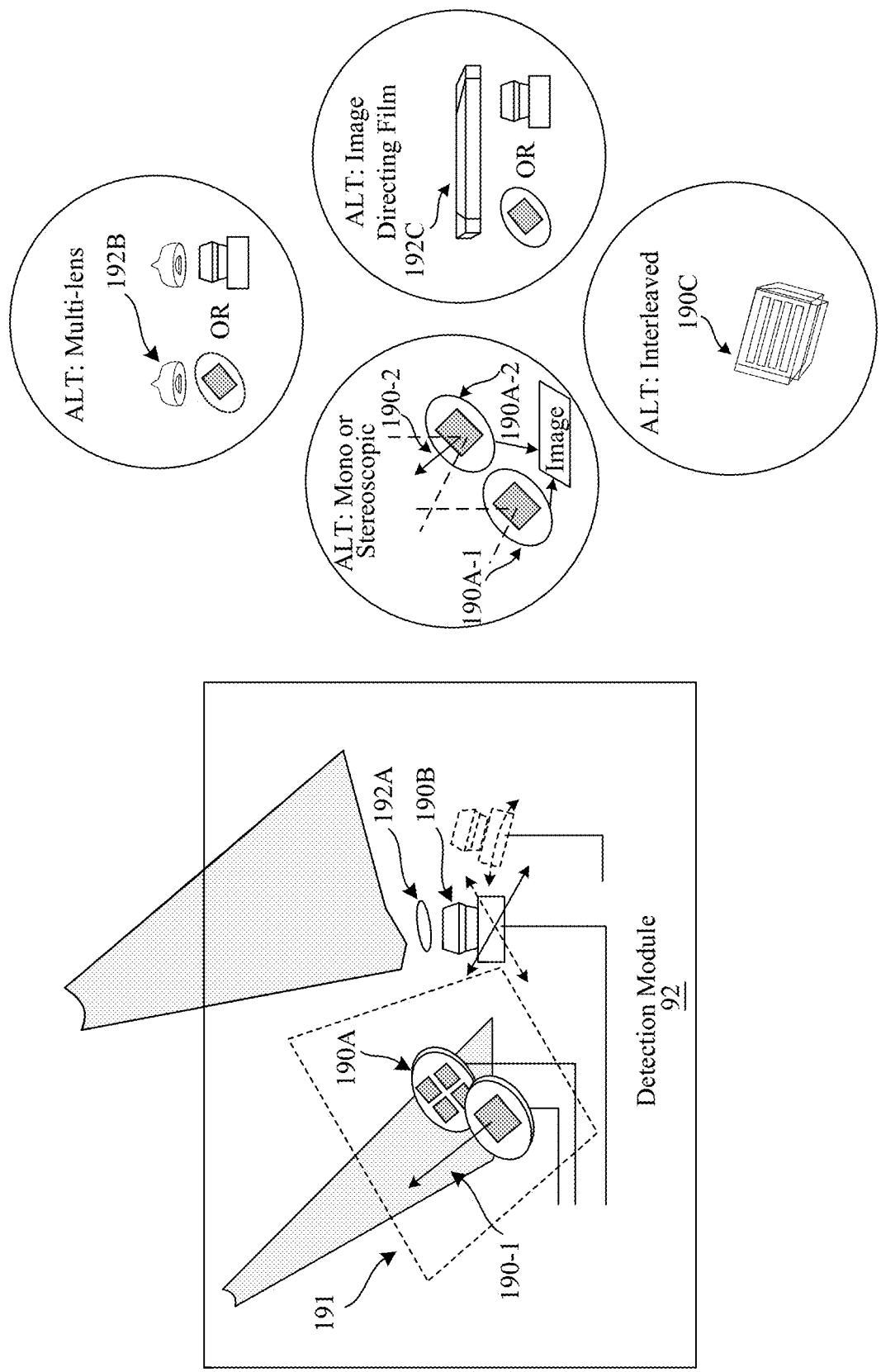

In an embodiment and with reference to FIGS. 7, 7-1, 7-2, and 8-2, updating predictive information to observed information comprises selecting one or more sets of points (e.g., FIG. 8-2:193A, 193B) in space surrounding or bounding the control object within a field of view of one or more image capture device(s). As shown by FIG. 8-2, points 193A and 193B can be determined using one or more sets of lines 195A, 195B, 195C, and 195D originating at vantage point(s) (e.g., FIG. 7-2: 190-1, 190-2) associated with the image capture device(s) (e.g., FIG. 7-2: 190A-1, 190A-2) and determining therefrom one or more intersection point(s) defining a bounding region (i.e., region formed by lines FIG. 8-2: 195A, 195B, 195C, and 195D) surrounding a cross-section of the control object. The bounding region can be used to define a virtual surface (FIG. 8-2: 194) to which model subcomponents 197-1, 197-2, 197-3, and 197-4 can be compared. The virtual surface 194 can include a visible portion 194A and a non-visible "inferred" portion 194B. Virtual surfaces 194 can include straight portions and/or curved surface portions of one or more virtual solids (i.e., model portions) determined by model refiner 197F The centerline for the cross-section of the control object can be found by identifying diagonal line segments 912, 914 that connect the opposite corners of region bounded by lines 195A, 195B, 195C, and 195D, identifying the midpoints 916, 918 of these line segments, and identifying the line segment 920 joining the midpoints as the centerline.

In an embodiment, when the control object morphs, conforms, and/or translates, motion information reflecting such motion(s) is included into the observed information. Points in space can be recomputed based on the new observation information. The model subcomponents can be scaled, sized, selected, rotated, translated, moved, or otherwise re-ordered to enable portions of the model corresponding to the virtual surface(s) to conform within the set of points in space.

In an embodiment, motion(s) of the control object can be rigid transformation, in which case, points on the virtual surface(s) remain at the same distance(s) from one another through the motion. Motion(s) can be non-rigid transformations, in which points on the virtual surface(s) can vary in distance(s) from one another during the motion. In an embodiment, observation information can be used to adjust (and/or recomputed) predictive information thereby enabling "tracking" the control object. In embodiments, control object can be tracked by determining whether a rigid transformation or a non-rigid transformation occurs. In an embodiment, when a rigid transformation occurs, a transformation matrix is applied to each point of the model uniformly. Otherwise, when a non-rigid transformation occurs, an error indication can be determined, and an error minimization technique such as described herein above can be applied.

In an embodiment, rigid transformations and/or non-rigid transformations can be composed. One example composition embodiment includes applying a rigid transformation to predictive information. Then an error indication can be determined, and an error minimization technique such as described herein above can be applied. In an embodiment, determining a transformation can include calculating a rotation matrix that provides a reduced RMSD (root mean squared deviation) between two paired sets of points. One embodiment can include using Kabsch Algorithm to produce a rotation matrix.

In an embodiment and by way of example, one or more force lines can be determined from one or more portions of a virtual surface.

Collisions

In an embodiment, predictive information can include collision information concerning two or more capsoloids. By means of illustration, several possible fits of predicted information to observed information can be removed from consideration based upon a determination that these potential solutions would result in collisions of capsoloids.

In an embodiment, a relationship between neighboring capsoloids, each having one or more attributes (e.g., determined minima and/or maxima of intersection angles between capsoloids) can be determined. In an embodiment, determining a relationship between a first capsoloid having a first set of attributes and a second capsoloid having a second set of attributes includes detecting and resolving conflicts between first attribute and second attributes. For example, a conflict can include a capsoloid having one type of angle value with a neighbor having a second type of angle value incompatible with the first type of angle value. Attempts to attach a capsoloid with a neighboring capsoloid having attributes such that the combination will exceed what is allowed in the observed—or to pair incompatible angles, lengths, shapes, or other such attributes—can be removed from the predicted information without further consideration.

Lean Model

In an embodiment, predictive information can be artificially constrained to capsoloids positioned in a subset of the observed information-thereby enabling creation of a "lean model". For example, as illustrated in FIG. 8-1, capsoloid 197-3 could be used to denote the portion of the observed without addition of capsoloids 197-2. In a yet further embodiment, connections can be made using artificial constructs to link together capsoloids of a lean model. In another embodiment, the predictive information can be constrained to a subset of topological information about the observed information representing the control object to form a lean model.

In an embodiment, a lean model can be associated with a full predictive model. The lean model (or topological information, or properties described above) can be extracted from the predictive model to form a constraint. Then, the constraint can be imposed on the predictive information thereby enabling the predictive information to be constrained in one or more of behavior, shape, total (system) energy, structure, orientation, compression, shear, torsion, other properties, and/or combinations thereof.

Occlusion and Clustering

Figure 6A:
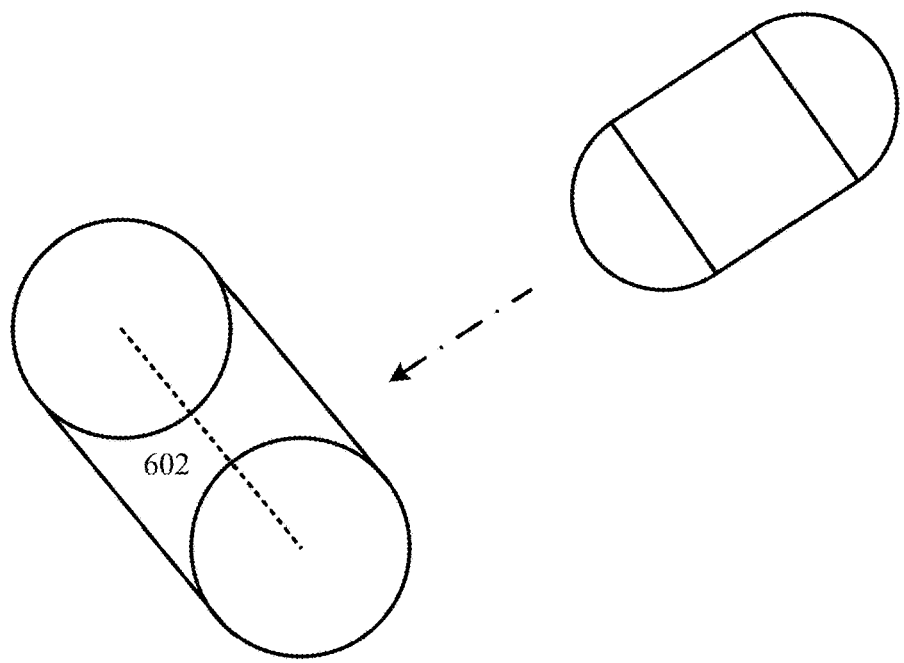
FIGS. 6A and 6B are simplified illustrations of fitting one or more 3D solid subcomponents to the observation information according to an implementation.
Figure 6B:
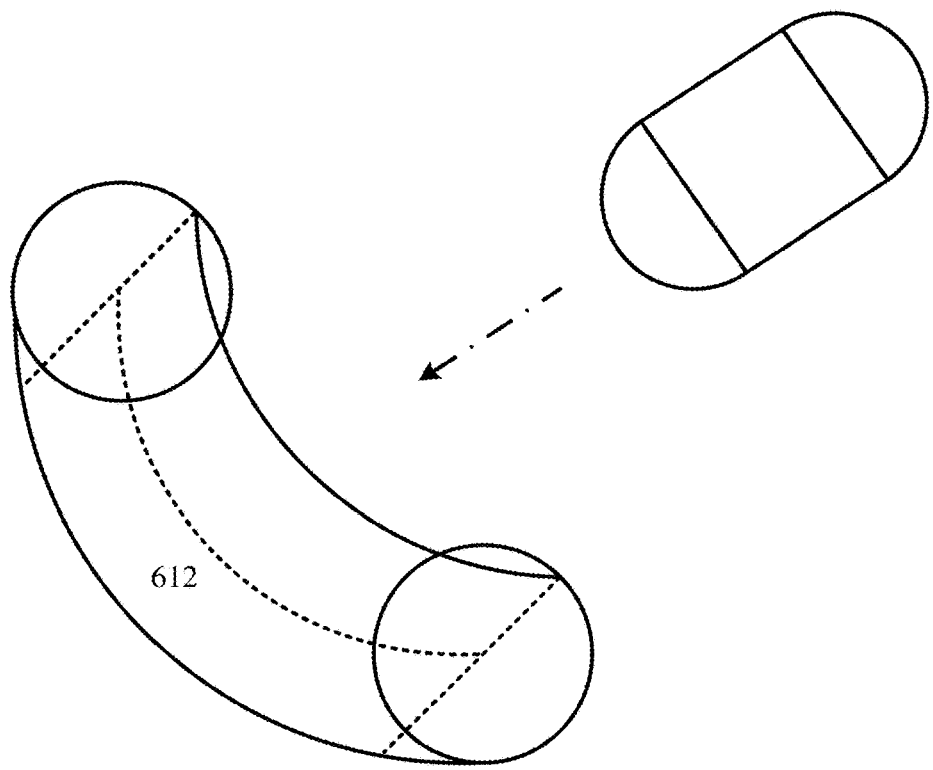

In an embodiment, the observed can include components reflecting portions of the control object which are occluded from view of the device ("occlusions" or "occluded components"). In one embodiment, the predictive information can be "fit" to the observed as described herein above with the additional constraint(s) that some total property of the predictive information (e.g., potential energy) be minimized or maximized (or driven to lower or higher value(s) through iteration or solution). Properties can be derived from nature, properties of the control object being viewed, others, and/or combinations thereof. In another embodiment, as shown by FIGS. 6A and 6B, a deformation of the predictive information subcomponent 602 in response to occluding component 600A of FIG. 6A yields deformed subcomponent 612 and occluding component 600B of FIG. 6B can be allowed subject to an overall permitted value of compression, deformation, flexibility, others, and/or combinations thereof.

Friction

In an embodiment, a "friction constraint" is applied on the model 197B-1. For example, if fingers of a hand being modeled are close together (in position or orientation), corresponding portions of the model will have more "friction". The more friction a model subcomponent has in the model, the less the subcomponent moves in response to new observed information. Accordingly the model is enabled to mimic the way portions of the hand that are physically close together move together, and move less overall.

Figure 1F:
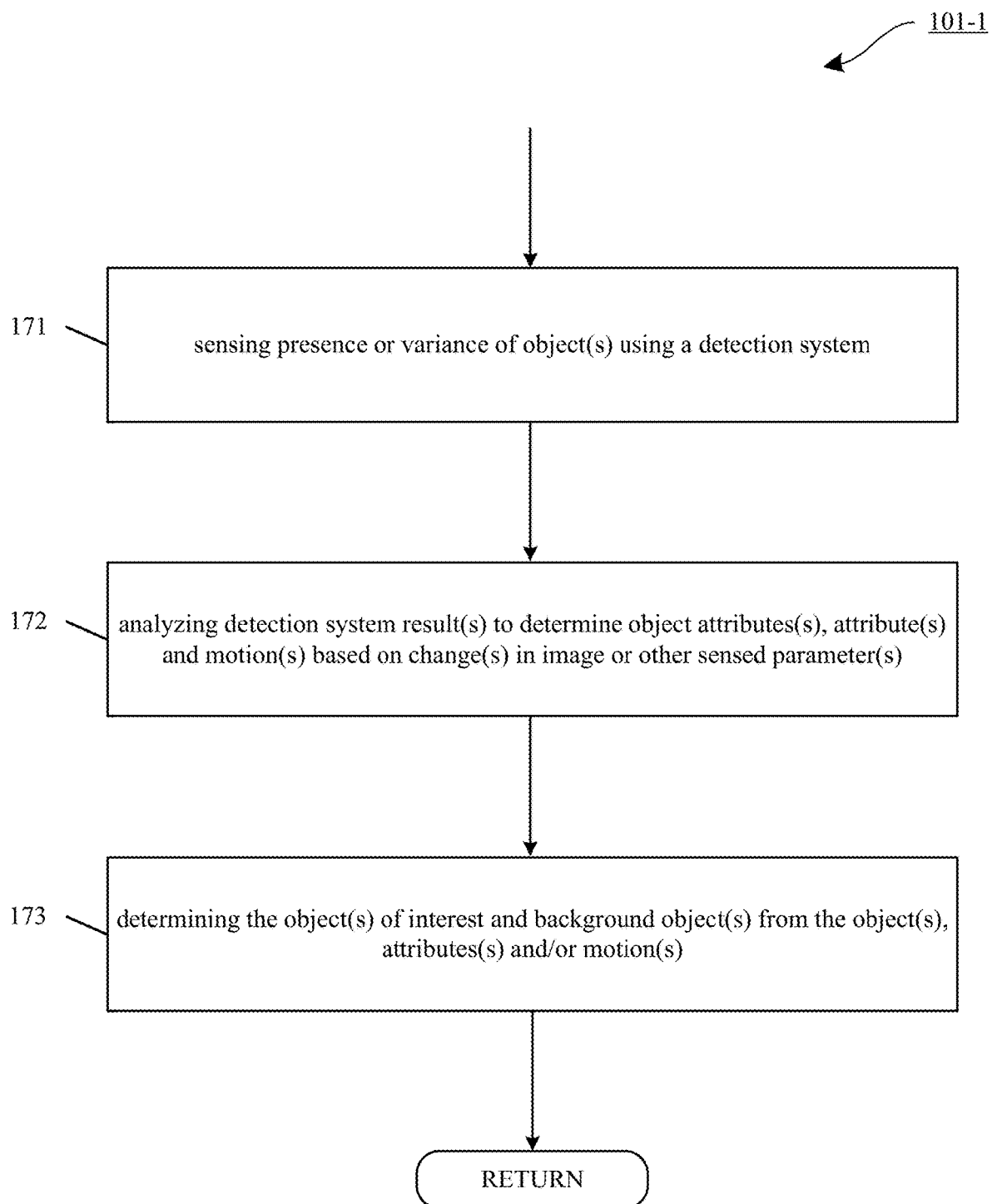

In an embodiment and by way of example, FIG. 1F illustrates a flowchart 101-1 of one method for detecting objects. Of course, objects can be detected in a variety of ways, and the method of flowchart 101-1 is illustrative rather than limiting. In a block 171, presence or variance of object(s) can be sensed using a detection system 90A (see e.g., FIGS. 7-9 below). In a block 172, detection system results are analyzed to detect objects, object attributes, motions, etc. based on changes in image or other sensed parameters (e.g., brightness, etc.). A variety of analysis methodologies suitable for providing object attribute and/or feature detection based upon sensed parameters can be employed in embodiments. Some example analysis embodiments are discussed below with reference to FIGS. 1G-1H. At block 173, object(s) of interest and background object(s) can be determined using a feature detection algorithms, motion capture algorithms or other methodologies, or combinations thereof. One example of an appropriate feature detection algorithm can be any of the tangent based algorithms described in co pending U.S. Ser. No. 13/414,485, filed Mar. 7, 2012, and Ser. No. 13/742,953, filed Jan. 16, 2013; however, other algorithms (e.g., edge detection, axial detection, surface detection techniques, etc.) can also be used in some embodiments.

Figure 1G:
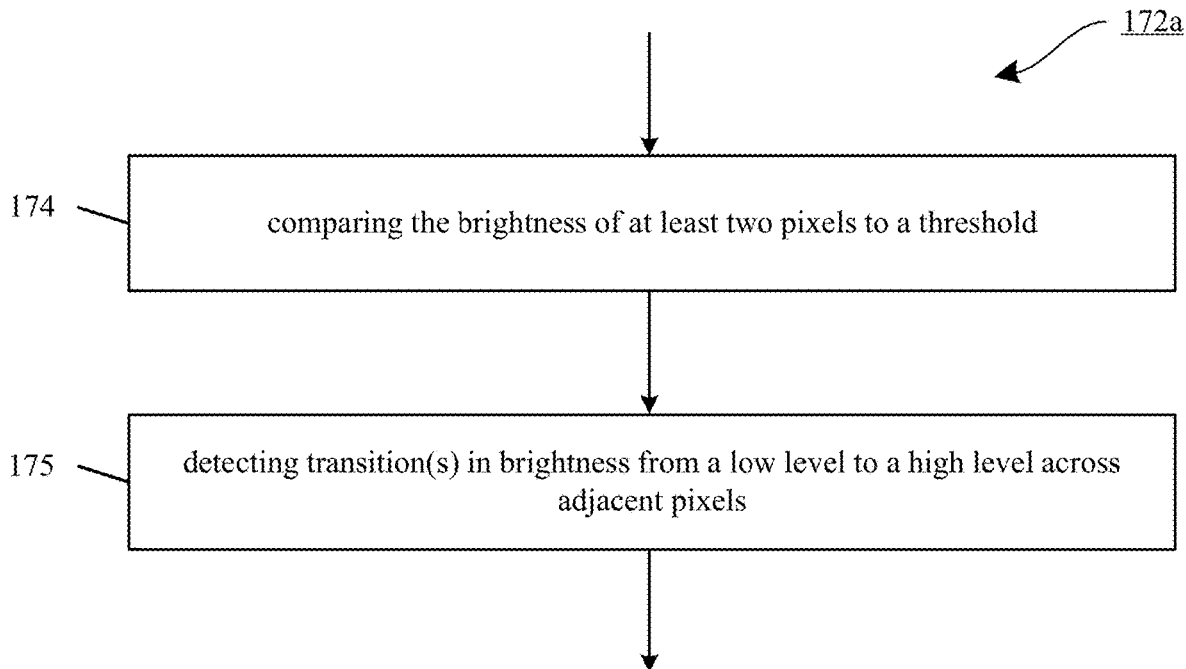
Figure 1H:
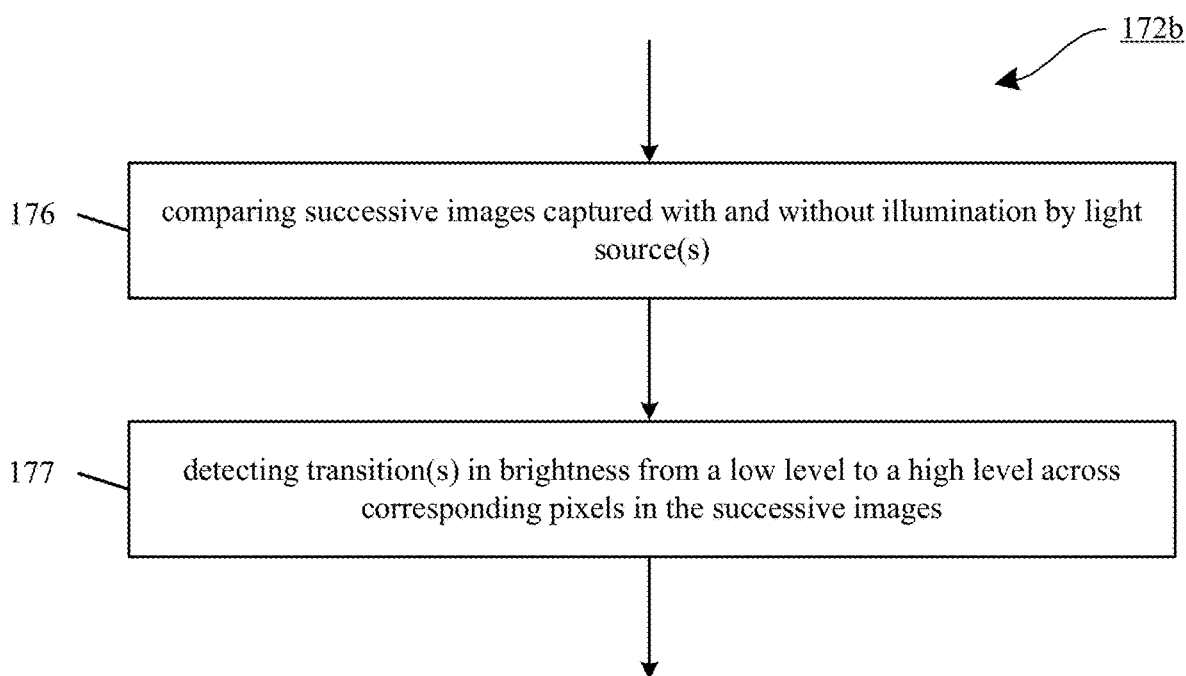

Image analysis can be achieved by various algorithms and/or mechanisms. For example, FIG. 1G illustrates a flowchart 172a of one method for detecting edges or other features of object(s). This analysis embodiment can include a block 174, in which the brightness of two or more pixels is compared to a threshold. In a block 175, transition(s) in brightness from a low level to a high level across adjacent pixels are detected. In another example, FIG. 1H illustrates a flowchart 172b of an alternative method for detecting edges or other features of object(s), including a block 176 of comparing successive images captured with and without illumination by light source(s). In a block 177, transition(s) in brightness from a low level to a high level across corresponding pixels in the successive images are detected.

Figure 1I:
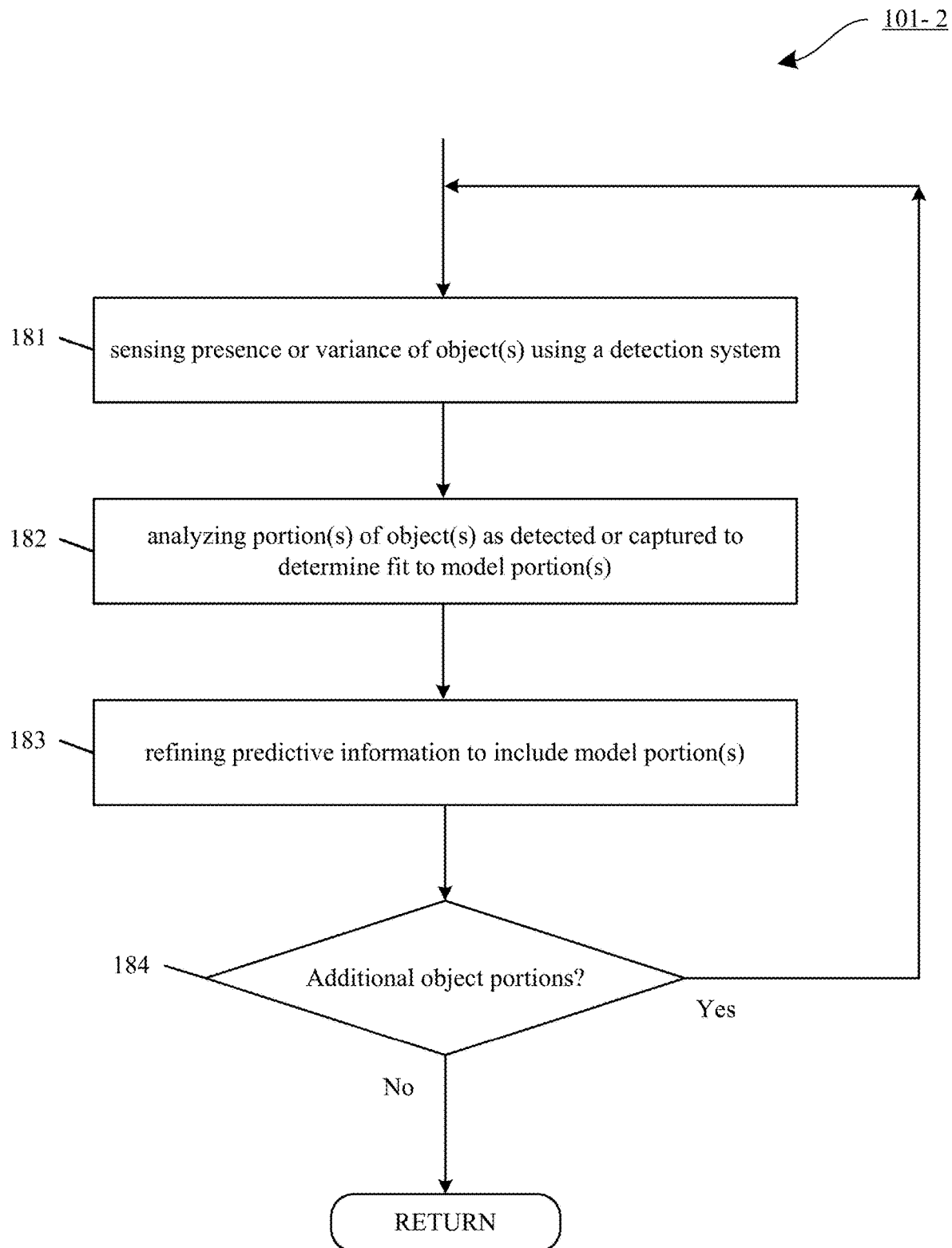

As shown by FIG. 1I, a method 101-2 of determining predictive information includes a block 181 in which presence or variance of object(s) is sensed using a detection system, such as detection system 90A for example. Sensing can include capturing image(s), detecting presence with scanning, obtaining other sensory information (e.g., olfactory, pressure, audio or combinations thereof) and/or combinations thereof. In a block 182, portion(s) of object(s) as detected or captured are analyzed to determine fit to model portion(s) (see e.g., FIGS. 7-9). In a block 183, predictive information is refined to include the model portion(s) determined in block 182. In a block 184, existence of other sensed object portion(s) is determined. If other object portion(s) have been sensed, then the method continues processing the other object portion(s). Otherwise, the method completes.

For example and according to one embodiment illustrated by FIG. 8-2, model refiner 197F determines to model subcomponent 197-1 of an object portion (happens to be a finger) using a virtual solid, an ellipse in this illustration, or any of a variety of 3D shapes (e.g., ellipsoid, sphere, or custom shape) and/or 2D slice(s) that are added together to form a 3D volume. Accordingly, beginning with generalized equations for an ellipse (1) with (x, y) being the coordinates of a point on the ellipse, $(x_C, y_C)$ the center, a and b the axes, and $\theta$ the rotation angle. The coefficients $C_1$, $C_2$ and $C_3$ are defined in terms of these parameters, as shown:

$$C_1 x^2 + C_2 xy + C_3 y^2 \cdot (2C_1 x_c + C_2 y_c)x \cdot (2C_3 y_c + C_2 x_c)y + \quad (1)$$
$$(C_1 x_c^2 + C_2 x_c y_c + C_3 y_c^2 - 1) = 0$$

$$C_1 = \frac{\cos^2\theta}{a^2} + \frac{\sin^2\theta}{b^2}$$

$$C_2 = -2\cos\theta\sin\theta\left(\frac{1}{a^2} - \frac{1}{b^2}\right)$$

$$C_3 = \frac{\sin^2\theta}{a^2} + \frac{\cos^2\theta}{b^2}$$

The ellipse equation (1) is solved for $\theta$, subject to the constraints that: (1) $(x_C, y_C)$ must lie on the centerline determined from the four tangents 195A, 195B, 195C, and 195D (i.e., centerline 189A of FIGS. 8-2); and (2) a is fixed at the assumed value $a_0$. The ellipse equation can either be solved for $\theta$ analytically or solved using an iterative numerical solver (e.g., a Newtonian solver as is known in the art). An analytic solution can be obtained by writing an equation for the distances to the four tangent lines given a $y_C$ position, then solving for the value of $y_C$ that corresponds to the desired radius parameter $a=a_0$. Accordingly, equations (2) for four tangent lines in the x-y plane (of the slice), in which coefficients $A_i$, $B_i$ and $D_i$ (for i=1 to 4) are determined from the tangent lines 195A, 195B, 195C, and 195D identified in an image slice as described above.

$$A_1 x + B_1 y + D_1 = 0$$
$$A_2 x + B_2 y + D_2 = 0$$
$$A_3 x + B_3 y + D_3 = 0$$
$$A_4 x + B_4 y + D_4 = 0 \quad (2)$$

Four column vectors $r_{12}$, $r_{23}$, $r_{14}$ and $r_{24}$ are obtained from the coefficients $A_i$, $B_i$ and $D_i$ of equations (2) according to equations (3), in which the "\" operator denotes matrix left division, which is defined for a square matrix M and a column vector v such that M\v=r, where r is the column vector that satisfies Mr=v:

$$r_{13} = \begin{bmatrix} A_1 & B_1 \\ A_3 & B_3 \end{bmatrix} \backslash \begin{bmatrix} -D_1 \\ -D_3 \end{bmatrix} \quad (3)$$

$$r_{23} = \begin{bmatrix} A_2 & B_2 \\ A_3 & B_3 \end{bmatrix} \backslash \begin{bmatrix} -D_{21} \\ -D_3 \end{bmatrix}$$

$$r_{14} = \begin{bmatrix} A_1 & B_1 \\ A_4 & B_4 \end{bmatrix} \backslash \begin{bmatrix} -D_1 \\ -D_4 \end{bmatrix}$$

$$r_{24} = \begin{bmatrix} A_2 & B_2 \\ A_4 & B_4 \end{bmatrix} \backslash \begin{bmatrix} -D_2 \\ -D_4 \end{bmatrix}$$

Four component vectors G and H are defined in equations (4) from the vectors of tangent coefficients A, B and D and scalar quantities p and q, which are defined using the column vectors $r_{12}$, $r_{23}$, $r_{14}$ and $r_{24}$ from equations (3).

$$c1 = (r_{13} + r_{24})/2$$

$$c2 = (r_{14} + r_{23})/2$$

$$\delta 1 = c2_1 - c1_1$$

$$\delta 2 = c2_2 - c1_2$$

$$p = \delta 1/\delta 2$$

$$q = c1_1 - c1_2 * p$$

$$G = Ap + B$$

$$H = Aq + D \quad (4)$$

Six scalar quantities $v_{A2}$, $v_{AB}$, $v_{B2}$, $w_{A2}$, $w_{AB}$, and $w_{B2}$ are defined by equation (5) in terms of the components of vectors G and H of equation (4).

$$v = \begin{bmatrix} G_2^2 & G_3^2 & G_4^2 \\ (G_2 H_2)^2 & (G_3 H_3)^2 & (G_4 H_4)^2 \\ H_2^2 & H_3^2 & H_4^2 \end{bmatrix} \cdot \begin{bmatrix} 0 \\ 0 \\ 1 \end{bmatrix} \quad (5)$$

$$w = \begin{bmatrix} G_2^2 & G_3^2 & G_4^2 \\ (G_2 H_2)^2 & (G_3 H_3)^2 & (G_4 H_4)^2 \\ H_2^2 & H_3^2 & H_4^2 \end{bmatrix} \cdot \begin{bmatrix} 0 \\ 1 \\ 0 \end{bmatrix}$$

$$v_{A2} = (v_1 A_1)^2 + (v_2 A_2)^2 + (v_3 A_3)^2$$

$$v_{AB} = (v_1 A_1 B_1)^2 + (v_2 A_2 B_2)^2 + (v_3 A_3 B_3)^2$$

$$v_{B2} = (v_1 B_1)^2 + (v_2 B_2)^2 + (v_3 B_3)^2$$

$$w_{A2} = (w_1 A_1)^2 + (w_2 A_2)^2 + (w_3 A_3)^2$$

$$w_{AB} = (w_1 A_1 B_1)^2 + (w_2 A_2 B_2)^2 + (w_3 A_3 B_3)^2$$

$$w_{B2} = (w_1 B_1)^2 + (w_2 B_2)^2 + (w_3 B_3)^2$$

Using the parmeters defined in equations (1)-(5), solving for θ is accomplished by solving the eighth-degree polynomial equation (6) for t, where the coefficients $Q_i$ (for i=0 to 8) are defined as shown in equations (7)-(15).

$$0 = Q_8 t^8 + Q_7 t^7 + Q_6 t^6 + Q_5 t^5 + Q_4 t^4 Q_3 t^3 + Q_2 t^2 + Q_1 t^2 + Q_0 \quad (6)$$

The parameters $A_1$, $B_1$, $G_1$, $H_1$, $v_{A2}$, $v_{AB}$, $v_{B2}$, $w_{A2}$, $w_{AB}$, and $w_{B2}$ used in equations (7)-(15) are defined as shown in equations (1)-(4). The parameter n is the assumed semi-major axis (in other words, $a_0$). Once the real roots t are known, the possible values of θ are defined as θ=a tan(t).

$$Q_8 = 4A_1^2 n^2 v_{B2}^2 + 4v_{B2} B_1^2 (1 - ^2 v_{A2}) - (G_1(1-n^2 v_{A2})w_{B2} + n^2 v_{B2} w_{Q2} + 2H_1 v_{B2})^2 \quad (7)$$

$$Q_7 = -(2(2n^2 v_{AB} w_{A2p} + 4H_1 v_{AB} + 2G_1 n^2 v_{AB} w_{B2} + 2G_1(1-n^2 v_{A2})w_{AB}))(G_1(1-n^2 v_{A2})w_{B2} + n^2 v_{B2} w_{A2} + 2H_1 v_{B2}) - 8A_1 B_1 n^2 v_{B2}^2 + 16A_1^2 n^2 v_{AB} v_{B2} + (4(2A_1 B_1 (1-n^2 v_{A2}) + 2B_1^2 n^2 v_{AB}))v_{B2} + 8B_1^2(1-n^2 v_{A2})v_{AB} \quad (8)$$

$$Q_6 = -(2(2H_1 v_{B2} + 2H_1 v_{A2} + n^2 v_{A2} w_{A2} + n + v_{B2}(-2w_{AB} + w_{B2}) + G_1(n^2 v_{B2}+1)w_{B2} + 4G_1 n^2 v_{AB} w_{AB} + G_1(1-n^2 v_{A2})v_{A2})x(G_1(1-n^2 v_{A2})w_{B2} + n^2 v_{B2} w_{A2} + 2H_1 v_{B2}) - (2n^2 v_{AB} w_{A2} + 4H_1 v_{AB} + 2G_1 n^2 v_{AB} w_{B2} + 2B_1(1-n^2 v_{A2})w_{AB})^2 + 4B_1^2 n^2 v_{B2}^2 - 32A_1 B_1 n^2 v_{AB} w_{B2} + 4A_1^2 n^1(2v_{A2} v_{B2} + 4v_{AB}^2) + 4A_1^2 n^2 v_{B2}^2 + 4(A_1^2(1-n^2 v_{A2}) + 4A_1 B_1 n^2 v_{AB} + B_1^2(-n^2 v_{B2}+1) + B_1^2(1-n^2 v_{A2})))v_{B2} + (8(2A_1 B_1(1-n^2 v_{A2}) + 2B_1^2 n^2 v_{AB}))v_{AB} + 4B_1^2(1-n^2 v_{A2})v_{A2} \quad (9)$$

$$Q_5 = -(2(4H_1 v_{AB} + 2G_1(-n^2 v_{B2}+1)w_{AB} + 2G_1 n^2 v_{AB} v_{A2} + 2n^2 v_A(-2w_{AB}+w_{B2})))(G_1(1-n^2 v_{A2})w_{B2} + n^2 v_{B2} w_{A2} + 2H_1 v_{B2}) - (2(2H_1 v_{B2} + 2H_1 v_{A2} + n^2 v_{A2} w_{A2} + n^2 v_{B2}(-2w_{AB}+w_{B2}) + G_1(-n^2 v_{B2}+1)w_{B2} + 4G_1 n^2 v_{AB} w_{AB} + G_1(1-n_2 v_{A2}))x(2n^2 v_{AB} w_{A2} + 4H_1 v_{AB} + 2G_1 n^2 v_{AB} w_{B2} + 2G_1(1-n^2 v_{A2})w_{AB}) + 16B_1^2 n^2 v_{AB} v_{B2} - 8A_1 B_1 n^2(2v_{A2} v_{B2} + 4v_{AB}^2) + 16A_1^2 n^2 v_{A2} v_{AB} - 8A_1 B_1 n^2 v_{B2}^2 + 16A_1^2 n^2 v_{AB} v_{B2} + (4(2A_1^2 n^2 v_{AB} + 2A_1 B_1(-n^2 v_{B2} + 1) + 2A_1 B_1(1-n^2 v_{A2}) + 2B_1^2 n^2 v_{AB})v_{B2} + (8(A_1^2(1-n^2 v_{A2}) + 4A_1 B_1 n^2 v_{AB} + B_1^2(-n^2 v_{B2}+1) + B_1^2(1-n^2 v_{A2})))v_{AB} + (4(2A_1 B_1(1-n^2 v_{A2}) + 2B_1^2 n^2 v_{AB})v_{A2} \quad (10)$$

$$Q_4 = (4(A_1^2(-n_2 v_{B2}) + A_1^2(1-n^2 v_{A2}) + 4A_1 B_1 n^2 v_{AB} + B_1^2(-n^2 v_{B2}+1)))v_{B2} + (8(2A_1^2 n^2 v_{AB} + 2A_1 B_1(-n^2 v_{B2}+1) + 2A_1 B_1(1-n^2 v_{A2}) + 2B_1^2 n^2 v_{AB})v_{AB} + (4(A_1^2(1-n^2 v_{A2}) + 4A_1 B_1 n^2 v_{AB} + B_1^2(-n^2 v_{B2}+1) + B_1^2(1-n^2 v_{A2})))v_{A2} + 4B_1^2 n^2 (2v_{A2} v_{B2} + 4v_{AB}^2) - 32A_1 B_1 n^2 v_{A2} v_{AB} + 4A_1^2 n^2 v_{A2} + 4B_1^2 n^2 v_{B2}^2 - 32A_1 B_1 n^2 v_{AB} v_{B2} + 4A_1^2 n^2 (2v_{A2} v_{B2} + 4v_{AB}^2) - (2(G_1(-n^2 v_{B2}+1)v_{A2} + n^2 v_{A2}(-2w_{AB} + w_{B2}) + 2H_1 v_{A2}))(G_1(1-n^2 v_{A2})w_{B2} + n^2 v_{B2} w_{A2} + 2H_1 v_{B2}) - (2(4H_1 v_{AB} + 2G_1(-n^2 v_{B2}+1)w_{AB} + 2G_1 n^2 v_{AB} v_{A2} + 2n^2 v_{AB}(-2w_{AB} + w_{B2})))x(2n^2 v_{AB} w_{A2} + 4H_1 v_{AB} + 2G_1 n^2 v_{AB} w_{B2} + 2G_1(1-n^2 v_{A2})w_{AB}) - (2H_1 v_{B2} + 2H_1 v_{A2} + n^2 v_{A2} w_{A2} + n_2 v_{B2}(-2w_{AB} + w_{B2}) + G_1(-n^2 v_{B2}+1)w_{B2} + 4G_1 n^2 v_{AB} w_{AB} + G_1(1-n^2 v_{A2}) v_{A2})^2 \quad (11)$$

$$Q_3 = -(2(G_1(-n^2 v_{B2}+1)v_{A2} + n^2 v_{A2}(-2w_{AB}+w_{B2}) + 2H_1 v_{A2}))(2n^2 v_{AB} w_{A2} + 4 H_1 v_{AB} + 2G_1 n^2 v_{AB} w_{B2} + 2G_1(1-n^2 v_{A2})w_{AB}) - (2(4H_1 v_{AB} + 2G_1(-n^2 v_{B2}+1)w_{AB} + 2G_1 n^2 v_{AB} v_{A2} + 2n^2 v_{AB}(-2w_{AB}+w_{B2})))x(2H_1 v_{B2} + 2H_1 v_{A2} + n^2 v_{A2} - w_{A2} + n^2 v_{B2}(-2w_{AB} + w_{B2}) + G_1(-n^2 v_{B2}+1)w_{B2} + 4G_1 n^2 v_{AB} w_{AB} + G_1(1-n^2 v_{A2})v_{A2}) + 16B_1^2 n^2 v_{A2} v_{AB} - 8A_1 B_1 n^2 v_{A2}^2 + 16B_1^2 n^2 v_{AB} v_{B2} - 8A_1 B_1 n^2 (2v_{A2} v_{B2} + 4v_{AB}^2) + 16A_1^2 n^2 v_{A2} v_{AB} + (4(2A_1^2 n^2 v_{AB} + 2A_1 B_1(-n^2 v_{B2}+1)))v_{B2} + (8(A_1^2(-n^2 v_{B2}+1) + A_1^2(1-n^2 v_{A2}) + 4A_1 B_1 n^2 v_{AB} + B_1^2(-n^2 v_{B2}+1)))v_{AB} + (4(2A_1^2 n^2 v_{AB} + 2A_1 B_1(-n^2 v_{B2}+1) + 2A_1 B_1(1-n^2 v_{A2}) + 2B_1^2 n^2 v_{AB}))v_{A2} \quad (12)$$

$$Q_2 = 4A_1^2(-n^2 v_{B2}+1)v_{B2} + (8(2A_1^2 n^2 v_{AB} + 2A_1 B_1(-n^2 v_{B2}+1)))v_{AB} + (4(A_1^2(-n^2 v_{B2}+1) + A_1^2(1-n^2 v_{A2}))v_{A2} + 4B_1^2 n^2 v_{A2}^2 + 4A_1 B_1 n_2 v_{AB} + B_1^2(-n^2 v_{B2}+1)))v_{A2} + 4B_1^2 n^2 v_{A2}^2 + 4B_1^2 n^2 (2v_{A2} v_{B2} + 4v_{AB}^2) - 32A_1 B_1 n^2 v_{A2} v_{AB} + 4A_1^2 v_{A2}^2 - (2(G_1(-n^2 v_{B2}+1)v_{A2} + n^2 v_{A2}(-2w_{AB} + w_{B2}) + 2H_1 v_{A2}))x(2H_1 v_{B2} + 2H_1 v_{A2} + n^2 v_{A2} w_{A2} + n^2 v_{B2}(-2w_{AB}+w_{B2}) + G_1(-n^2 v_{B2}+1)w_{B2} +$$

$$4G_1 n^2 v_{AB} w_{AB} + G_1(1-n^2 v_{A2}) v_{A2}) - (4H_1 v_{AB} + 2G_1(-n^2 v_{B2}+1)w_{AB} + 2G_1 n^2 v_{AB} v_{A2} + 2n^2 v_{AB}(-2w_{AB}+w_{B2}))^2 \quad (13)$$

$$Q_1 = 8A_1^2(-n^2 v_{B2}+1)v_{AB} + (4(2A_1^2 n^2 v_{AB} + 2A_1 B_1(-n^2 v_{B2}+1)))v_{A2} + 16B_1^2 n^2 v_{A2} v_{AB} - 8A_1 B_1 n^2 v_{A2}^2 - (2(G_1(-n^2 v_{B2}+1)v_{A2} + n^2 v_{A2}(-2w_{AB}+w_{B2}) + 2H_1 v_{A2}))(4H_1 v_{AB} + 2G_1(-n^2 v_{B2}+1)w_{AB} + 2G_1 n^2 v_{AB} v_{A2} + 2n^2 v_{AB}(-2w_{AB}+w_{B2})) \quad (14)$$

$$Q_0 = 4A_1^2(-n_2 v_{B2}+1)v_{A2} - (G_1(-n^2 v_{B2}+1)v_{A2} + n^2 v_{A2}(-2w_{AB}+w_{B2}) + 2H_1 v_{A2})^2 + 4B_1^2 n^2 v_{A2}^2 \quad (15)$$

In this exemplary embodiment, equations (6)-(15) have at most three real roots; thus, for any four tangent lines, there are at most three possible ellipses that are tangent to all four lines and that satisfy the a=$a_0$ constraint. (In some instances, there may be fewer than three real roots.) For each real root θ, the corresponding values of ($x_C$, $y_C$) and b can be readily determined. Depending on the particular inputs, zero or more solutions will be obtained; for example, in some instances, three solutions can be obtained for a typical configuration of tangents. Each solution is completely characterized by the parameters {θ, a=$a_0$, b, ($x_C$, $y_C$)}. Alternatively, or additionally, a model builder 197C and model updater 197D provide functionality to define, build and/or customize model(s) 197B using one or more components in object library 197A. Once built, model refiner 197F updates and refines the model, bringing the predictive information of the model in line with observed information from the detection system 90A.

The model subcomponents 197-1, 197-2, 197-3, and 197-4 can be scaled, sized, selected, rotated, translated, moved, or otherwise re-ordered to enable portions of the model corresponding to the virtual surface(s) to conform within the points 193 in space. Model refiner 197F employs a variation detector 197G to substantially continuously determine differences between sensed information and predictive information and provide to model refiner 197F a variance useful to adjust the model 197B accordingly. Variation detector 197G and model refiner 197F are further enabled to correlate among model portions to preserve continuity with characteristic information of a corresponding object being modeled, continuity in motion, and/or continuity in deformation, conformation and/or torsional rotations.

An environmental filter 197H reduces extraneous noise in sensed information received from the detection system 90A using environmental information to eliminate extraneous elements from the sensory information. Environmental filter 197H employs contrast enhancement, subtraction of a difference image from an image, software filtering, and background subtraction (using background information provided by objects of interest determiner 198H (see below) to enable model refiner 197F to build, refine, manage and maintain model(s) 197B of objects of interest from which control inputs can be determined.

A model analyzer 197I determines that a reconstructed shape of a sensed object portion matches an object model in an object library; and interprets the reconstructed shape (and/or variations thereon) as user input. Model analyzer 197I provides output in the form of object, position, motion and attribute information to an interaction system 90C.

Again with reference to FIG. 8, an interaction system 90C includes an interaction interpretation module 198 that provides functionality to recognize command and other information from object, position, motion and attribute information obtained from variation system 90B. An interaction interpretation module 198 embodiment comprises a recognition engine 198F to recognize command information such as command inputs (i.e., gestures and/or other command inputs (e.g., speech, etc.)), related information (i.e., biometrics), environmental information (i.e., context, noise, etc.) and other information discernable from the object, position, motion and attribute information that might be useful in controlling a machine. Recognition engine 198F employs gesture properties 198A (e.g., path, velocity, acceleration, etc.), control objects determined from the object, position, motion and attribute information by an objects of interest determiner 198H and optionally one or more virtual constructs 198B (see e.g., FIGS. 8-3, 8-4: 198B-1, 198B-2) to recognize variations in control object presence or motion indicating command information, related information, environmental information and other information discernable from the object, position, motion and attribute information that might be useful in controlling a machine. With reference to FIG. 8-3, 8-4, virtual construct 198B-1, 198B-2 implement an engagement target with which a control object 99 interacts—enabling MSCS 189 to discern variations in control object (i.e., motions into, out of or relative to virtual construct 198B) as indicating control or other useful information. A gesture trainer 198C and gesture properties extractor 198D provide functionality to define, build and/or customize gesture properties 198A.

A context determiner 198G and object of interest determiner 198H provide functionality to determine from the object, position, motion and attribute information objects of interest (e.g., control objects, or other objects to be modeled and analyzed), objects not of interest (e.g., background) based upon a detected context. For example, when the context is determined to be an identification context, a human face will be determined to be an object of interest to the system and will be determined to be a control object. On the other hand, when the context is determined to be a fingertip control context, the finger tips will be determined to be object(s) of interest and will be determined to be a control objects whereas the user's face will be determined not to be an object of interest (i.e., background). Further, when the context is determined to be a styli (or other tool) held in the fingers of the user, the tool tip will be determined to be object of interest and a control object whereas the user's fingertips might be determined not to be objects of interest (i.e., background). Background objects can be included in the environmental information provided to environmental filter 197H of model management module 197.

A virtual environment manager 198E provides creation, selection, modification and de-selection of one or more virtual constructs 198B (see FIGS. 8-3, 8-4). In some embodiments, virtual constructs (e.g., a virtual object defined in space; such that variations in real objects relative to the virtual construct, when detected, can be interpreted for control or other purposes (see FIGS. 8-3, 8-4)) are used to determine variations (i.e., virtual "contact" with the virtual construct, breaking of virtual contact, motion relative to a construct portion, etc.) to be interpreted as engagements, dis-engagements, motions relative to the construct(s), and so forth, enabling the system to interpret pinches, pokes and grabs, and so forth. Interaction interpretation module 198 provides as output the command information, related information and other information discernable from the object, position, motion and attribute information that might be useful in controlling a machine from recognition engine 198F to an application control system 90D.

Further with reference to FIG. 8, an application control system 90D includes a control module 199 that provides functionality to determine and authorize commands based upon the command and other information obtained from interaction system 90C.

A control module 199 embodiment comprises a command engine 199F to determine whether to issue command(s) and what command(s) to issue based upon the command information, related information and other information discernable from the object, position, motion and attribute information, as received from an interaction interpretation module 198. Command engine 199F employs command/control repository 199A (e.g., application commands, OS commands, commands to MSCS, misc. commands) and related information indicating context received from the interaction interpretation module 198 to determine one or more commands corresponding to the gestures, context, etc. indicated by the command information. For example, engagement gestures can be mapped to one or more controls, or a control-less screen location, of a presentation device associated with a machine under control. Controls can include imbedded controls (e.g., sliders, buttons, and other control objects in an application), or environmental level controls (e.g., windowing controls, scrolls within a window, and other controls affecting the control environment). In embodiments, controls may be displayed using 2D presentations (e.g., a cursor, cross-hairs, icon, graphical representation of the control object, or other displayable object) on display screens and/or presented in 3D forms using holography, projectors or other mechanisms for creating 3D presentations, or audible (e.g., mapped to sounds, or other mechanisms for conveying audible information) and/or touchable via haptic techniques.

Further, an authorization engine 199G employs biometric profiles 199B (e.g., users, identification information, privileges, etc.) and biometric information received from the interaction interpretation module 198 to determine whether commands and/or controls determined by the command engine 199F are authorized. A command builder 199C and biometric profile builder 199D provide functionality to define, build and/or customize command/control repository 199A and biometric profiles 199B.

Selected authorized commands are provided to machine(s) under control (i.e., "client") via interface layer 196. Commands/controls to the virtual environment (i.e., interaction control) are provided to virtual environment manager 198E. Commands/controls to the emission/detection systems (i.e., sensory control) are provided to emission module 91 and/or detection module 92 as appropriate.

In various embodiments and with reference to FIGS. 8-3, 8-4, a Machine Sensory Controller System 189 can be embodied as a standalone unit(s) 189-1 coupleable via an interface (e.g., wired or wireless)), embedded (e.g., within a machine 188-1, 188-2 or machinery under control) (e.g., FIG. 8-3: 189-2, 189-3, FIG. 8-4: 189B) or combinations thereof.

Figure 9:
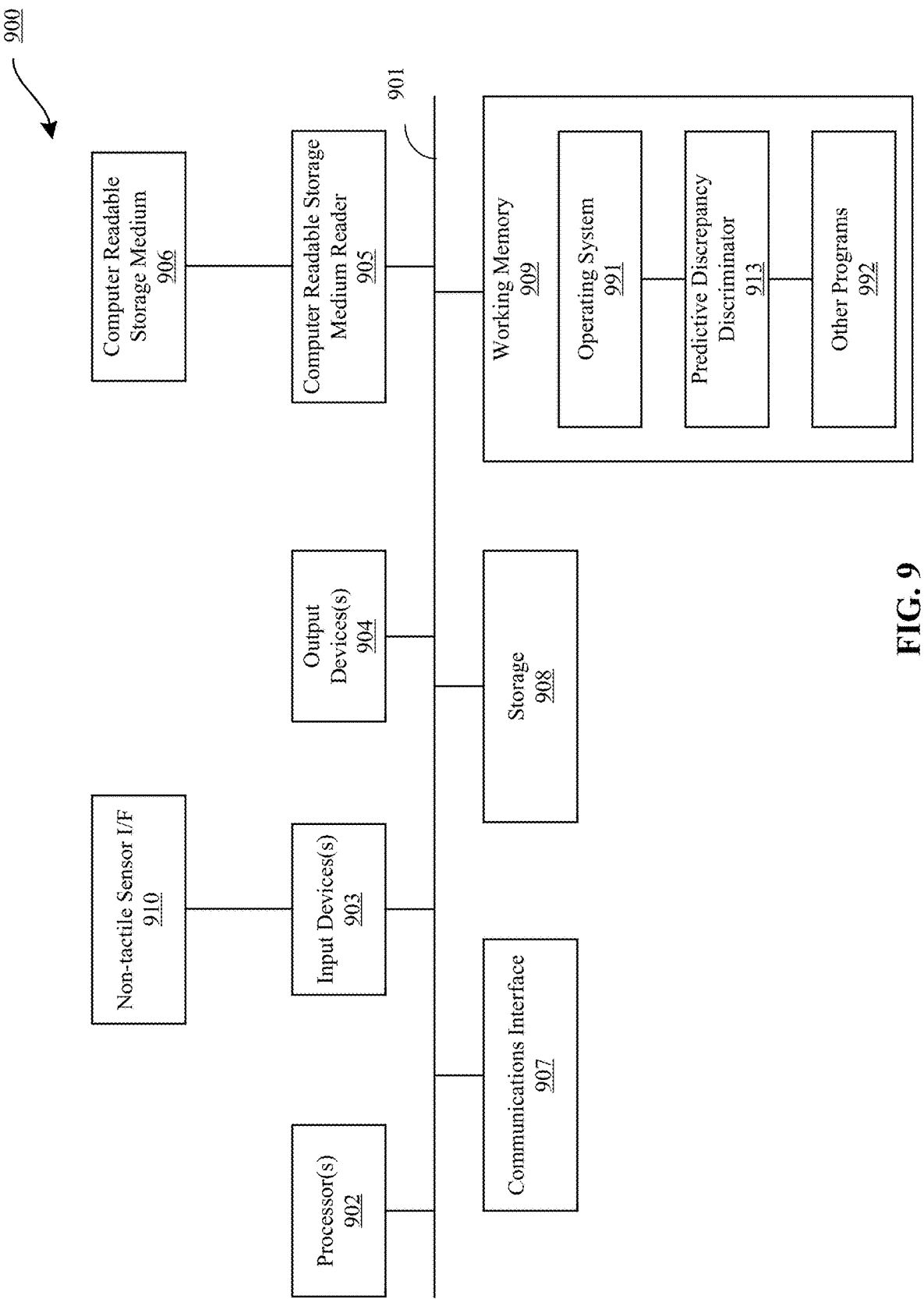
FIG. 9 illustrates an example computing system that can comprise one or more of the elements shown in FIGS. 6A and 6B.

FIG. 9 illustrates an example computing system that can comprise one or more of the elements shown in FIGS. 6A and 6B. In particular, FIG. 9 illustrates an exemplary computing system 900, such as a PC (or other suitable "processing" system), that can comprise one or more of the MSCS elements shown in FIGS. 7-8 according to an embodiment. While other application-specific device/process alternatives might be utilized, such as those already noted, it will be presumed for clarity sake that systems 90A-90D elements (FIGS. 7-8) are implemented by one or more processing systems consistent therewith, unless otherwise indicated.

As shown, computer system 900 comprises elements coupled via communication channels (e.g. bus 901) including one or more general or special purpose processors 902, such as a Pentium® or Power PC®, digital signal processor ("DSP"), or other processing. System 900 elements also include one or more input devices 903 (such as a mouse, keyboard, joystick, microphone, remote control unit, Non-tactile sensors 910, biometric or other sensors 93 of FIG. 7, and so on), and one or more output devices 904, such as a suitable display, joystick feedback components, speakers, biometric or other actuators, and so on, in accordance with a particular application.

System 900 elements also include a computer readable storage media reader 905 coupled to a computer readable storage medium 906, such as a storage/memory device or hard or removable storage/memory media; examples are further indicated separately as storage device 908 and non-transitory memory 909, which can include hard disk variants, floppy/compact disk variants, digital versatile disk ("DVD") variants, smart cards, read only memory, random access memory, cache memory or others, in accordance with a particular application (e.g. see data store(s) 197A, 198A, 199A and 199B of FIG. 8). One or more suitable communication devices 907 can also be included, such as a modem, DSL, infrared, etc. for providing inter-device communication directly or via suitable private or public networks, such as the Internet. Working memory 909 is further indicated as including an operating system ("OS") 991, predictive discrepancy determiner 913 and other programs 992, such as application programs, mobile code, data, or other information for implementing systems 90A-90D elements, which might be stored or loaded therein during use.

System 900 element implementations can include hardware, software, firmware or a suitable combination. When implemented in software (e.g. as an application program, object, downloadable, servlet, and so on, in whole or part), a system 900 element can be communicated transitionally or more persistently from local or remote storage to memory for execution, or another suitable mechanism can be utilized, and elements can be implemented in compiled, simulated, interpretive or other suitable forms. Input, intermediate or resulting data or functional elements can further reside more transitionally or more persistently in a storage media or memory, (e.g. storage device 908 or memory 909) in accordance with a particular application.

Certain potential interaction determination, virtual object selection, authorization issuances and other aspects enabled by input/output processors and other element embodiments disclosed herein can also be provided in a manner that enables a high degree of broad or even global applicability; these can also be suitably implemented at a lower hardware/software layer. Note, however, that aspects of such elements can also be more closely linked to a particular application type or machine, or might benefit from the use of mobile code, among other considerations; a more distributed or loosely coupled correspondence of such elements with OS processes might thus be more desirable in such cases.

Figure 10:
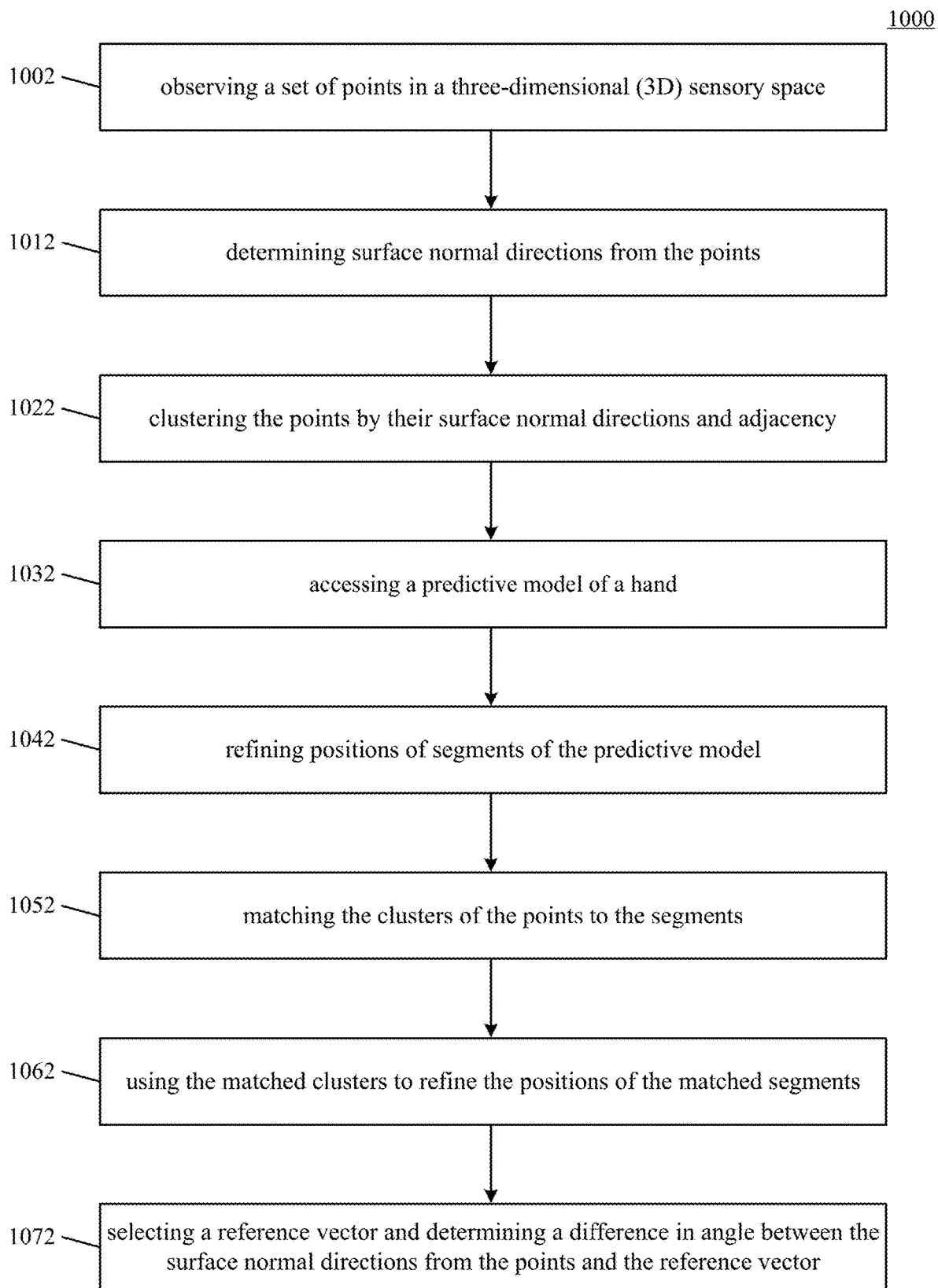
FIG. 10 shows a flowchart of simplifying updating of a predictive model using clustering observed points.

FIG. 10 shows a flowchart 1000 of simplifying updating of a predictive model using clustering observed points. Flowchart shown in FIG. 10 can be implemented at least partially with by one or more processors configured to receive or retrieve information, process the information, store results, and transmit the results. Other implementations may perform the actions in different orders and/or with different, varying, alternative, modified, fewer or additional actions than those illustrated in FIG. 10. Multiple actions can be combined in some implementations. For convenience, this flowchart is described with reference to the system that carries out a method. The system is not necessarily part of the method.

At action 1002, a set of points in a three-dimensional (3D) sensory space are observed.

At action 1012, surface normal directions from the points are determined.

At action 1022, the points are clustered based on their surface normal directions and adjacency.

At action 1032, a positions of segments of the predictive model are refined. In some embodiments, refining positions of segments of the predictive model further includes calculating an error indication by determining whether the points and points on the segments of the predictive model are within a threshold closest distance.

In other embodiments, refining positions of segments of the predictive model further includes calculating an error indication by pairing the points in the set with points on axes of the segments of the predictive model, wherein the points in the set lie on vectors that are normal to the axes and determining a reduced root mean squared deviation (RMSD) of distances between paired point sets.

In yet other embodiments, refining positions of segments of the predictive model further includes calculating an error indication by pairing the points in the set with points on the segments of the predictive model, wherein normal vectors to the points in the set are parallel to each other and determining a reduced root mean squared deviation (RMSD) of distances between bases of the normal vectors.

In some other embodiment, refining positions of segments of the predictive model further includes determining physical proximity between points in the set based on the matched clusters, based on the determined physical proximity, identifying co-located segments of the predictive model that change positions together, and refining positions of segments of the predictive model responsive to the co-located segments. In one embodiment, the co-located segments represent adjoining figures of the hand. In another embodiment, the co-located segments represent subcomponents of a same finger.

At action 1042, a predictive model of a hand is accessed.

At action 1052, the clusters of the points to the segments are matched.

At action 1062, the matched clusters are used to refine the positions of the matched segments.

At action 1072, a reference vector is selected and a difference in angle between the surface normal directions from the points and the reference vector is determined. Further, a magnitude of the difference is used to cluster the points. In one embodiment, the reference vector is orthogonal to a field of view of camera used to capture the points on an image. In another embodiment, the reference vector is along a longitudinal axis of the hand. In yet another embodiment, the reference vector is along a longitudinal axis of a portion of the hand.

This method and other implementations of the technology disclosed can include one or more of the following features and/or features described in connection with additional methods disclosed. In the interest of conciseness, the combinations of features disclosed in this application are not individually enumerated and are not repeated with each base set of features. The reader will understand how features identified in this section can readily be combined with sets of base features identified as implementations in sections of this application.

Other implementations can include a non-transitory computer readable storage medium storing instructions executable by a processor to perform any of the methods described above. Yet another implementation can include a system including memory and one or more processors operable to execute instructions, stored in the memory, to perform any of the methods described above.

FIG. 11 is a representative method 1100 of distinguishing between alternative motions between two observed locations of a control object in a three-dimensional (3D) sensory space. Flowchart shown in FIG. 11 can be implemented at least partially with by one or more processors configured to receive or retrieve information, process the information, store results, and transmit the results. Other implementations may perform the actions in different orders and/or with different, varying, alternative, modified, fewer or additional actions than those illustrated in FIG. 11. Multiple actions can be combined in some implementations. For convenience, this flowchart is described with reference to the system that carries out a method. The system is not necessarily part of the method. At action 1102, first and second positions of a segment of a predictive model of a control object are accessed such that motion between the first position and the second position was at least partially occluded from observation in a three-dimensional (3D) sensory space. In one embodiment, the control object is a hand. In another embodiment, the control object is a tool.

At action 1112, two or more alternative interpretations of movement from the first position to the second position are received.

At action 1122, entropy or extent of motion involved in the alternative interpretations is estimated.

At action 1132, an alternative interpretation with lower entropy or extent of motion than other interpretations is selected.

At action 1142, the selected interpretation is applied to predicting further positioning of the segment and of other segments of the predictive model from additional observations in the 3D sensory space.

This method and other implementations of the technology disclosed can include one or more of the following features and/or features described in connection with additional methods disclosed. In the interest of conciseness, the combinations of features disclosed in this application are not individually enumerated and are not repeated with each base set of features. The reader will understand how features identified in this section can readily be combined with sets of base features identified as implementations in sections of this application.

Other implementations can include a non-transitory computer readable storage medium storing instructions executable by a processor to perform any of the methods described above. Yet another implementation can include a system including memory and one or more processors operable to execute instructions, stored in the memory, to perform any of the methods described above.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described by way of example and in terms of the specific embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A computer implemented method of updating a predictive model, the method including:
   accessing a predictive model of a hand;
   obtaining using points in a set of points and the predictive model, a refined predictive model having refined positions of segments determined for the set of points; and
   using the predictive model as refined to interpret a control object's position and/or motion.

2. The method of claim 1, wherein obtaining using the points and the predictive model, a refined predictive model further includes:
   selecting a reference vector and determining a difference in angle between surface normal directions determined from the points and the reference vector; and
   using a magnitude of the difference to cluster the points.

3. The method of claim 2, wherein the reference vector is orthogonal to a field of view of camera used to capture the points on an image.

4. The method of claim 2, wherein the reference vector is along a longitudinal axis of the hand.

5. The method of claim 2, wherein the reference vector is along a longitudinal axis of a portion of the hand.

6. The method of claim 1, wherein obtaining using the points and the predictive model, a refined predictive model further includes calculating an error indication by:
   determining whether the points and points on the segments of the predictive model are within a threshold closest distance.

7. The method of claim 6, further including calculating an error indication by:
   pairing the points in the set of points with points on axes of the segments of the predictive model, wherein the points in the set of points lie on vectors that are normal to the axes; and
   determining a reduced root mean squared deviation (RMSD) of distances between paired point sets.

8. The method of claim 6, further including calculating an error indication by:
   pairing the points in the set of points with points on the segments of the predictive model, wherein normal vectors to the points in the set of points are parallel to each other; and
   determining a reduced root mean squared deviation (RMSD) of distances between bases of the normal vectors.

9. The method of claim 1, wherein obtaining using the points and the predictive model, a refined predictive model further includes:
   determining physical proximity between points in the set of points;
   based on the determined physical proximity, identifying co-located segments of the predictive model that change positions together; and
   refining positions of segments of the predictive model responsive to the co-located segments.

10. The method of claim 9, wherein the co-located segments represent adjoining figures of the hand.

11. The method of claim 9, wherein the co-located segments represent subcomponents of a same finger.

12. A computer implemented method of distinguishing between alternative motions between two observed locations of a control object in a three-dimensional (3D) sensory space, the method including:

accessing a first position and a second position of a segment of a control object;

receiving two or more alternative interpretations of movement from the first position to the second position;

obtaining a selection of an alternative interpretation with a lower extent of motion than other interpretations; and using the alternative interpretation selected to interpret a control object's position and/or motion.

13. The method of claim 12, wherein the control object is a hand.

14. The method of claim 12, wherein the control object is a tool.

15. A system enabling updating a predictive model comprising:

at least one camera oriented towards a field of view;

a database comprising a plurality of electronically stored records, wherein individual records of the plurality of electronically stored records relates to a predictive model of a hand; and an image analyzer coupled to the camera and the database and configured with logic to:

access a particular predictive model of the hand;

obtain using points in a set of points and the predictive model, a refined predictive model having refined positions of segments determined for the set of points; and using the predictive model as refined to interpret a control object's position and/or motion.

16. The system of claim 15, wherein the logic to obtain using the points and the predictive model, a refined predictive model further includes logic to:

select a reference vector and determine a difference in angle between surface normal directions determined from the points and the reference vector; and use a magnitude of the difference to cluster the points.

17. The system of claim 16, wherein the reference vector is orthogonal to the field of view.

18. The system of claim 16, wherein the reference vector is along a longitudinal axis of the hand.

19. The system of claim 16, wherein the reference vector is along a longitudinal axis of a portion of the hand.

20. A non-transitory computer readable medium storing processor executable instructions to distinguish between alternative motions between two observed locations of a control object in a three-dimensional (3D) sensory space, which instructions when executed by a processor implement actions including:

accessing a first position and a second position of a segment of a control object;

receiving two or more alternative interpretations of movement from the first position to the second position;

obtaining a selection of an alternative interpretation with a lower extent of motion than other interpretations; and using the alternative interpretation selected to interpret a control object's position and/or motion.

* * * * *